(12) United States Patent
Dvorak et al.

(10) Patent No.: US 6,636,816 B1
(45) Date of Patent: Oct. 21, 2003

(54) VECTOR SIGNAL ANALYSIS METHOD AND APPARATUS THEREFOR

(76) Inventors: Steven L. Dvorak, 9330 E. Vallarta Dr., Tucson, AZ (US) 85749; Ben K. Sternberg, 971 W. Giaconda Way, Tucson, AZ (US) 85704

( * ) Notice: Subject to any disclaimer, the term of this patent is extended or adjusted under 35 U.S.C. 154(b) by 123 days.

(21) Appl. No.: 09/975,140

(22) Filed: Oct. 9, 2001

Related U.S. Application Data

(63) Continuation-in-part of application No. 09/400,220, filed on Sep. 21, 1999.
(60) Provisional application No. 60/240,811, filed on Oct. 16, 2000.

(51) Int. Cl.$^7$ .............................................. G06F 19/00
(52) U.S. Cl. ........................... 702/66; 702/58; 702/85; 702/124; 331/18; 331/23; 331/25; 331/34; 324/76.41; 324/76.44; 324/85; 367/43; 367/45; 367/49; 367/80; 367/100
(58) Field of Search .............................. 702/57, 58, 66, 702/69–76, 79, 85, 89, 106, 112, 124–126, 189, 191, FOR 103, 104, 107, 110, 135, 155, 156, 164, 166, 171; 331/18–20, 23, 25, 30, 34, 40–43, 88, 175; 324/76.39, 76.41, 85–86; 367/43, 45, 47–49, 80, 100, 101; 370/276, 289, 290, 464, 480, 493

(56) References Cited

U.S. PATENT DOCUMENTS

| | | | |
|---|---|---|---|
| 3,660,620 A | 5/1972 | Schimpf et al. ................ 379/6 |
| 3,818,331 A | 6/1974 | Sclosser ...................... 324/57 |
| 3,818,332 A | 6/1974 | Schlosser ..................... 324/57 |
| 3,920,935 A | 11/1975 | Vierling et al. | |
| 3,978,403 A | * | 8/1976 | Mansfield et al. ............. 324/77 |
| 4,394,659 A | | 7/1983 | Gellekink ..................... 343/16 |
| 4,438,511 A | * | 3/1984 | Baran .......................... 370/19 |
| 4,675,880 A | | 6/1987 | Davarian ...................... 375/39 |
| 5,402,073 A | | 3/1995 | Ross .......................... 324/539 |
| 5,548,222 A | | 8/1996 | Jensen et al. ................ 324/628 |
| 5,574,406 A | * | 11/1996 | Sauer et al. .................. 331/11 |
| 5,576,659 A | | 11/1996 | Kenington et al. ........... 330/52 |
| 5,742,207 A | * | 4/1998 | Rambo et al. ................. 331/11 |
| 5,974,100 A | | 10/1999 | Carsello et al. ............. 375/346 |
| 6,456,950 B1 | * | 9/2002 | El-Ghoroury et al. ......... 702/75 |
| 6,479,978 B1 | * | 11/2002 | Aliahmad et al. ........ 324/76.77 |
| 6,510,175 B1 | * | 1/2003 | Hunsinger et al. .......... 375/216 |

OTHER PUBLICATIONS

Wahab et al, Noise Suppression based on the interior acoustic field of the Vehicular Chamber, ICARCV, 1998, pp. 1–5.*
Author: David Ballo Title: Applying Error Correction to Network Analyzer Measurements Date: Mar. 1998 pp.: 11.
Title: S–Parameter Design pp.: 31 By: Hewlett Packard.
Title: Automating the HP 8410B Microwave Network Analyzer By: Hewlett Packard pp.: 25.

* cited by examiner

Primary Examiner—Marc S. Hoff
Assistant Examiner—Elias Desta
(74) Attorney, Agent, or Firm—Lowell W. Gresham; Jordan M. Meschkow; Meschkow & Gresham, P.L.C.

(57) ABSTRACT

An error-suppression signal measurement system and method therefor is provided. The system transmits a test signal from a first probe, through a device under test, and into a second probe. The probes extract normalization signals from reference signals therein, exchange specific ones of the normalization signals, and combine the normalization signals with data signals derived from the test signal to form receiver signals. The probes propagate the receiver signals to a receiver, where the signals are gain-ranged, digitized, normalized, and compensated for phase-noise.

3 Claims, 16 Drawing Sheets

Figure 1. ARTTEST Vector Signal Analyzer

Figure 2. ARTTEST Measurement Probe for Incident, Reflection, or Transmission Signals

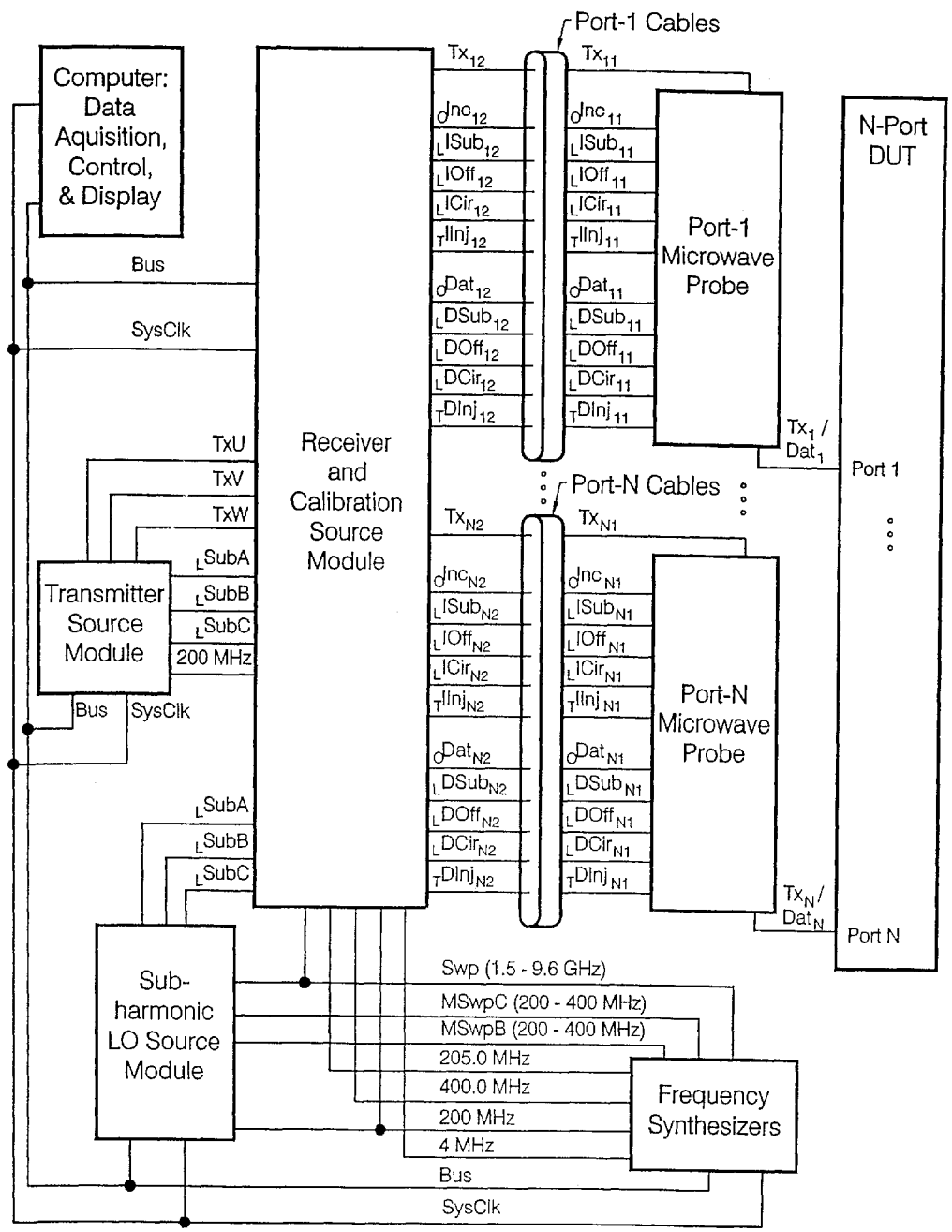
Figure 5. System-level block diagram for the ARTTEST Vector Signal Analyzer.

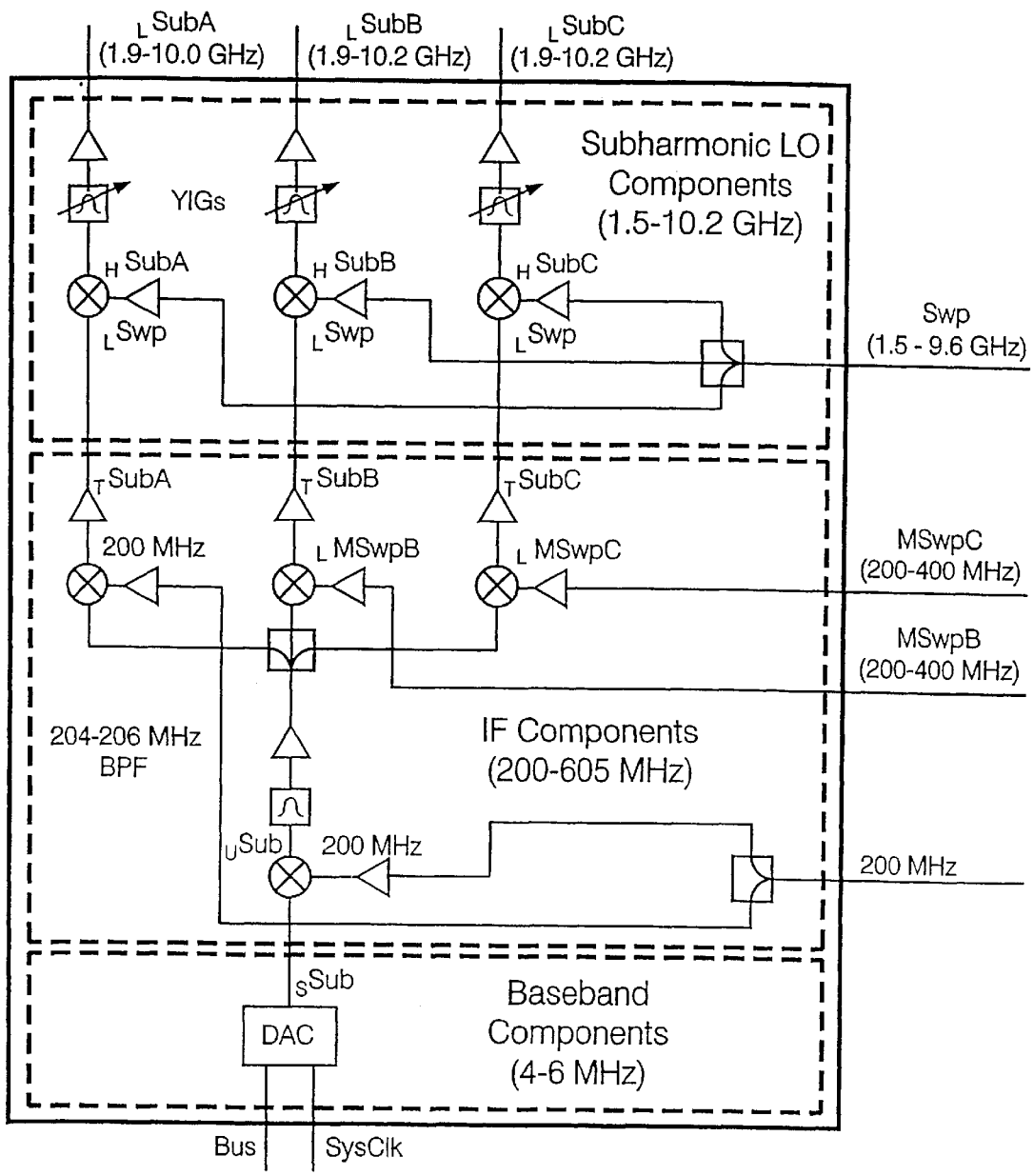
Figure 6. Block diagram for the subharmonic LO source module.

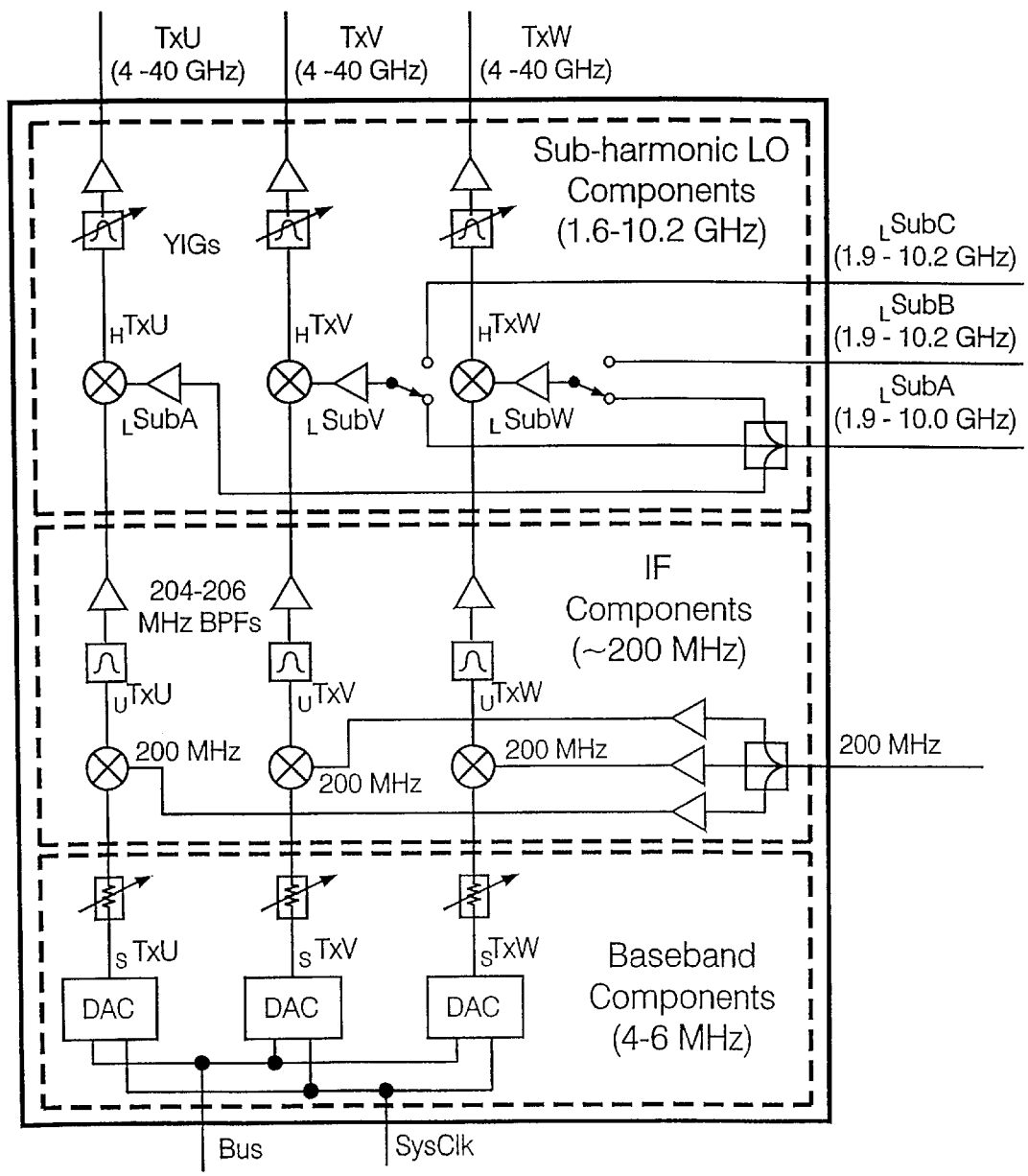
Figure 7. Block diagram for the transmitter source module.

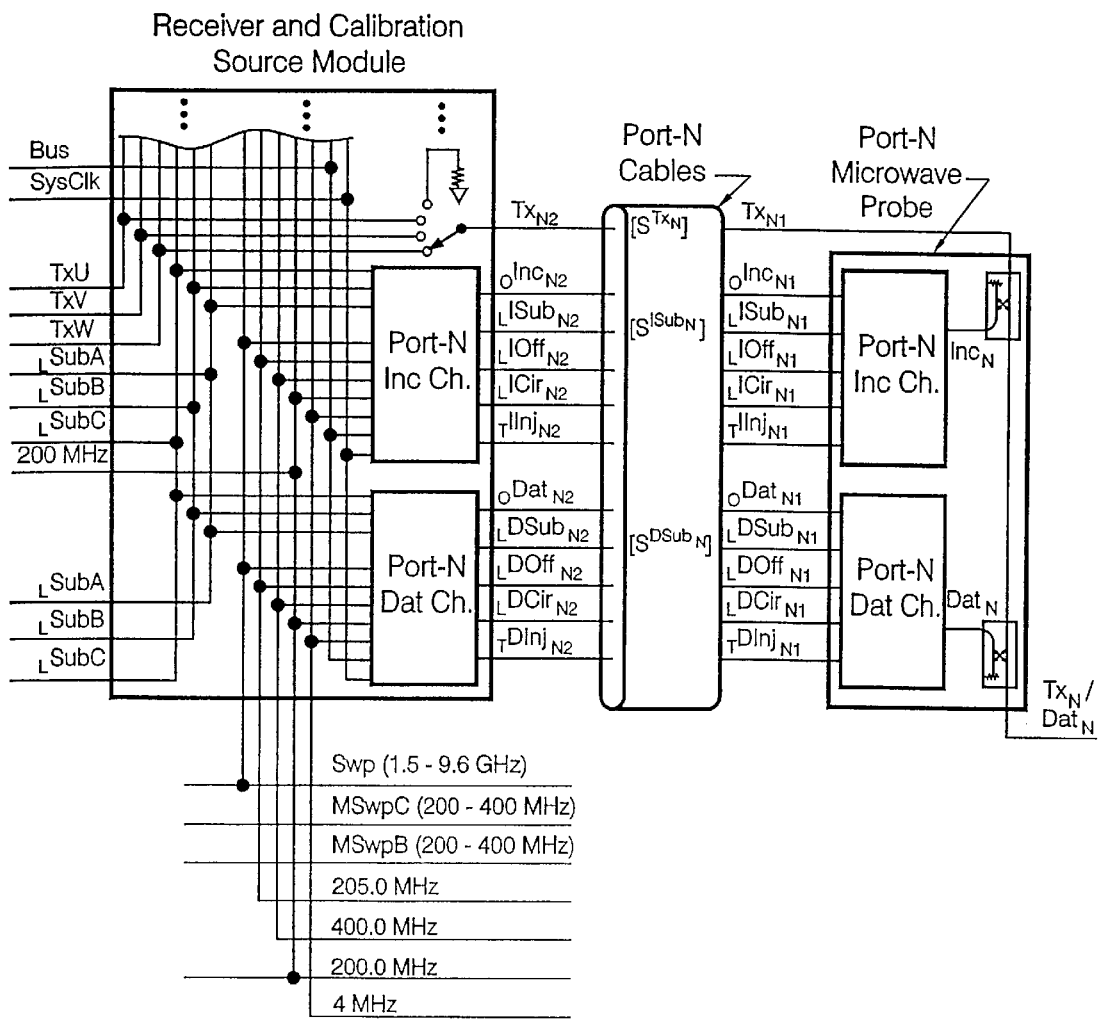
Figure 8. Block diagram for the receiver and calibration source module.

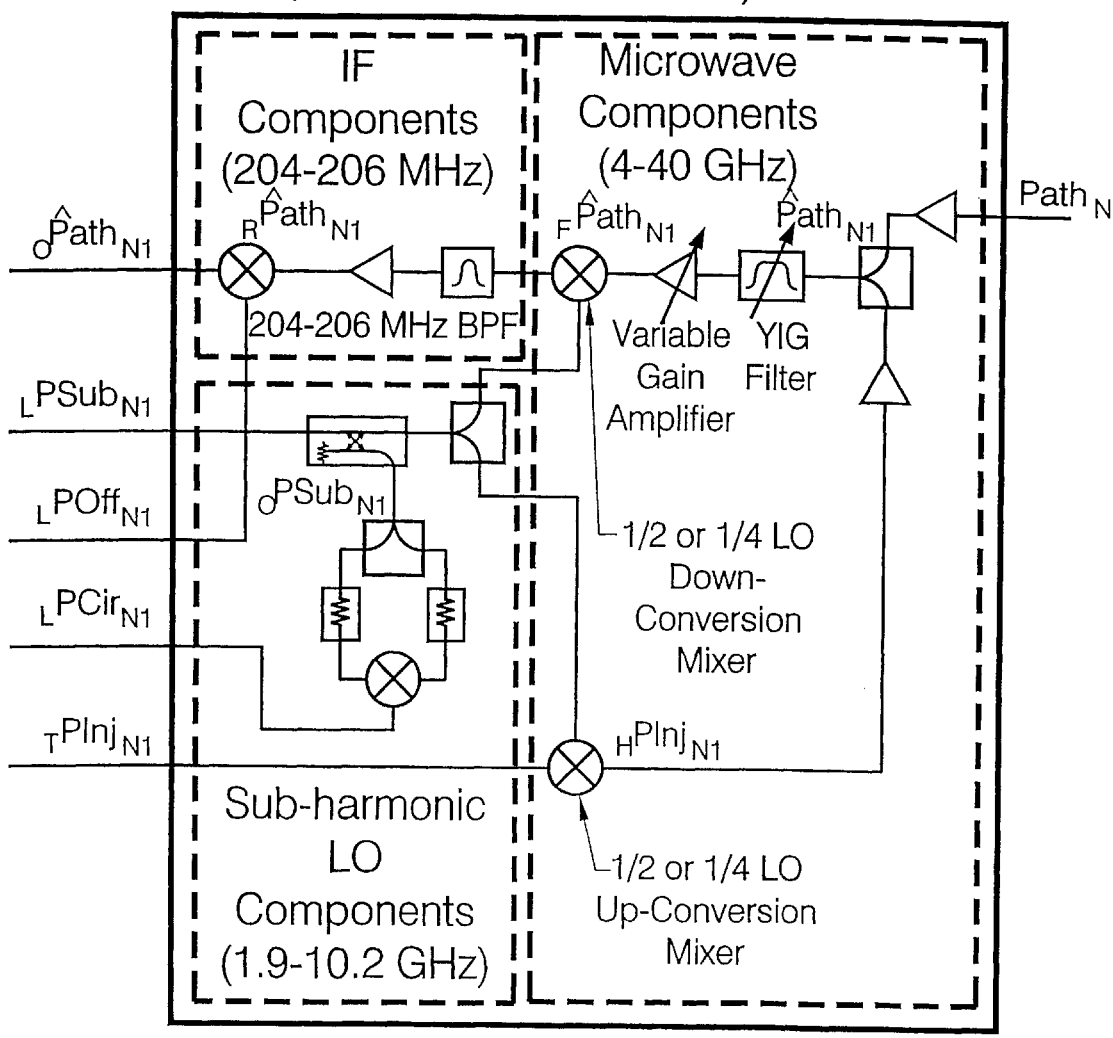
Figure 9. Block diagram for the port-*N* channel probe.

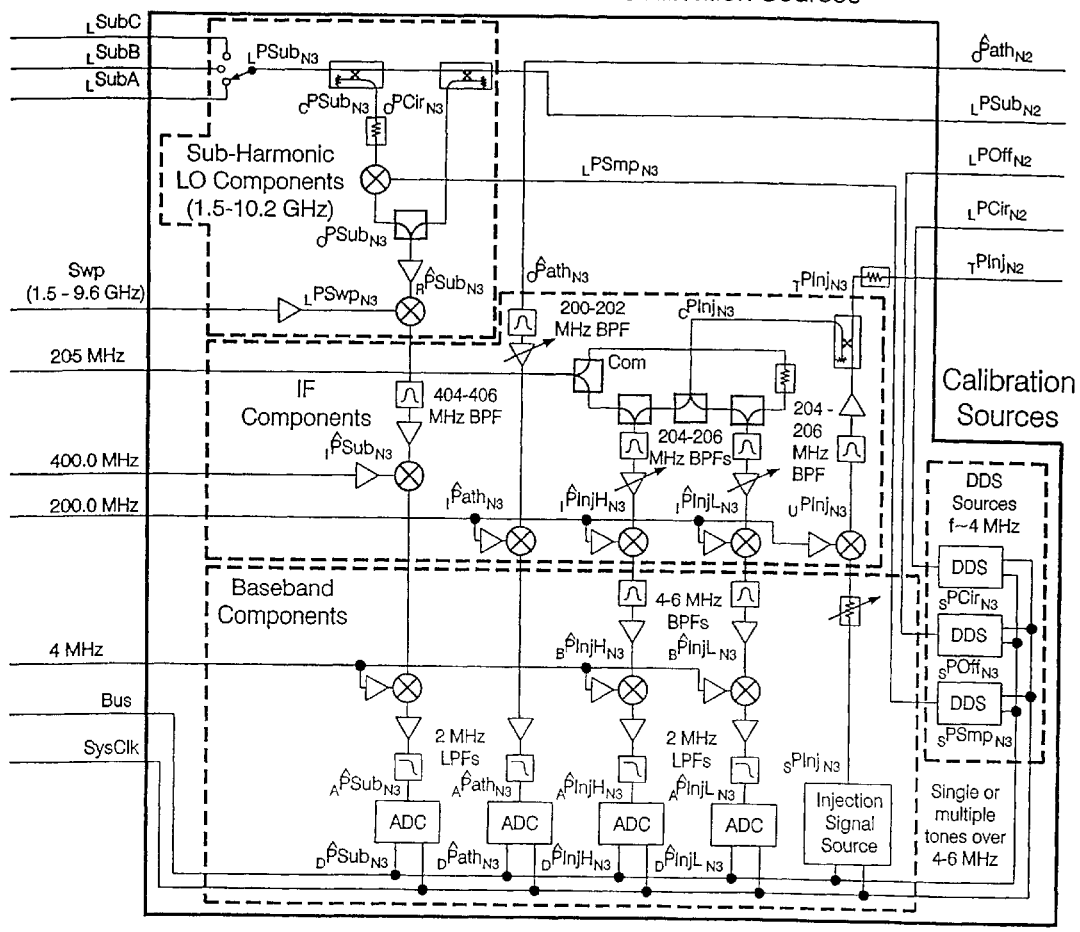
Figure 10. Block diagram for the port-*N* receivers and calibration sources.

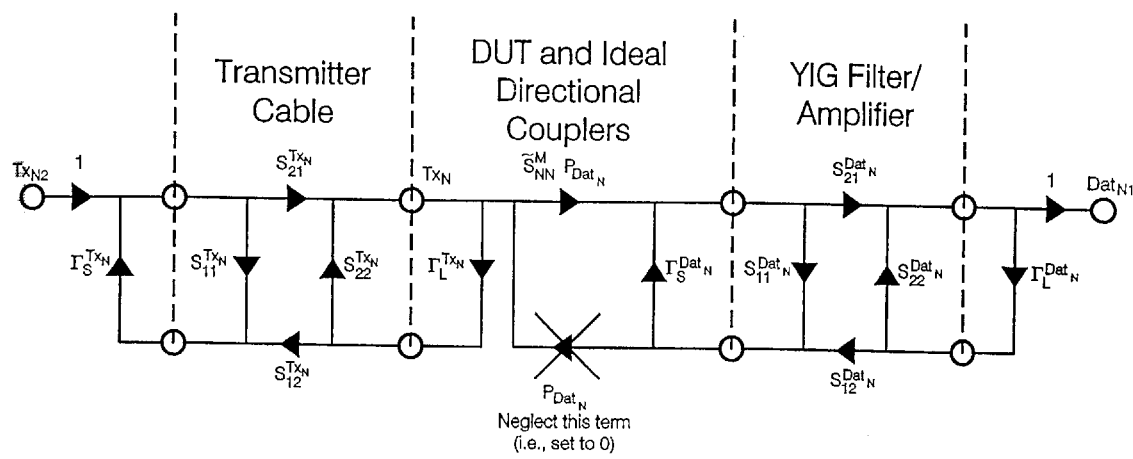
Figure 11. Signal flow graph for the port-*N* transmitter cable and receiver circuitry.

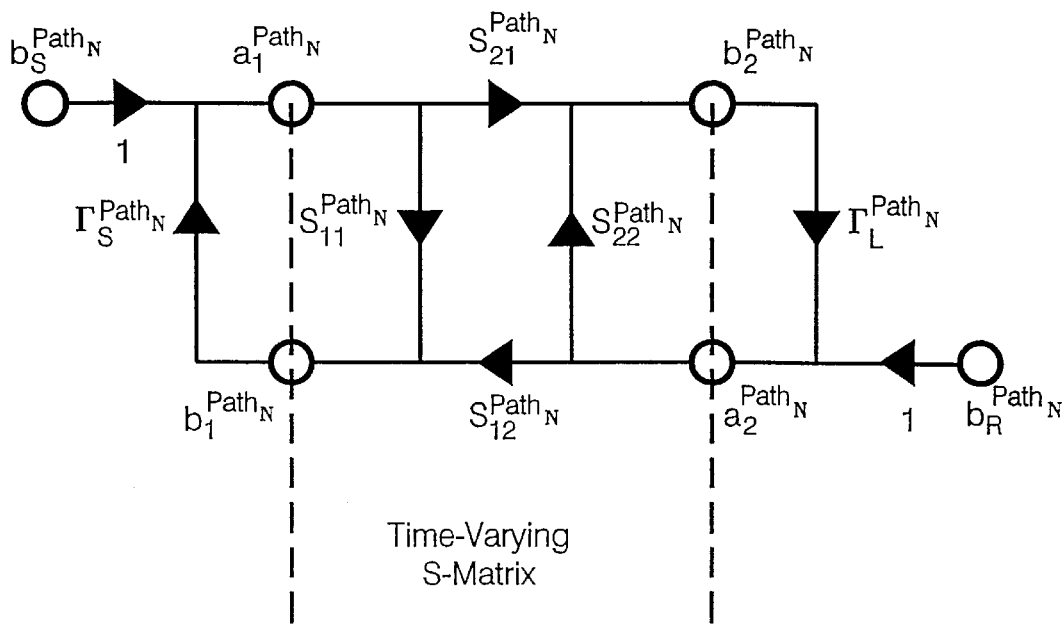
Figure 12. Signal flow diagram used to model effects of the time-varying scattering matrix used to model the transmitter or receiver circuitry.

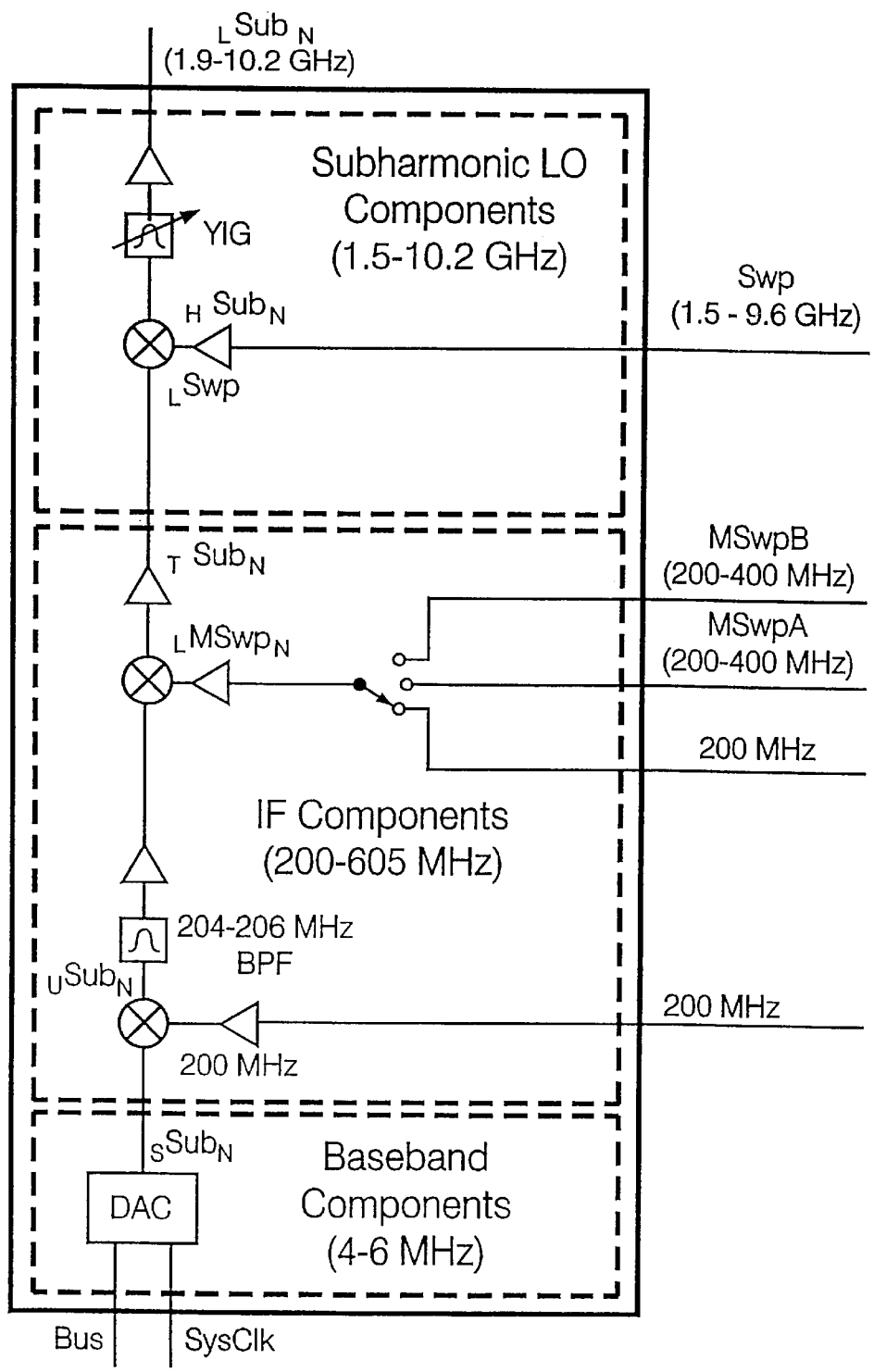
Figure 13. Channel-N subharmonic, offset-frequency, LO source module.

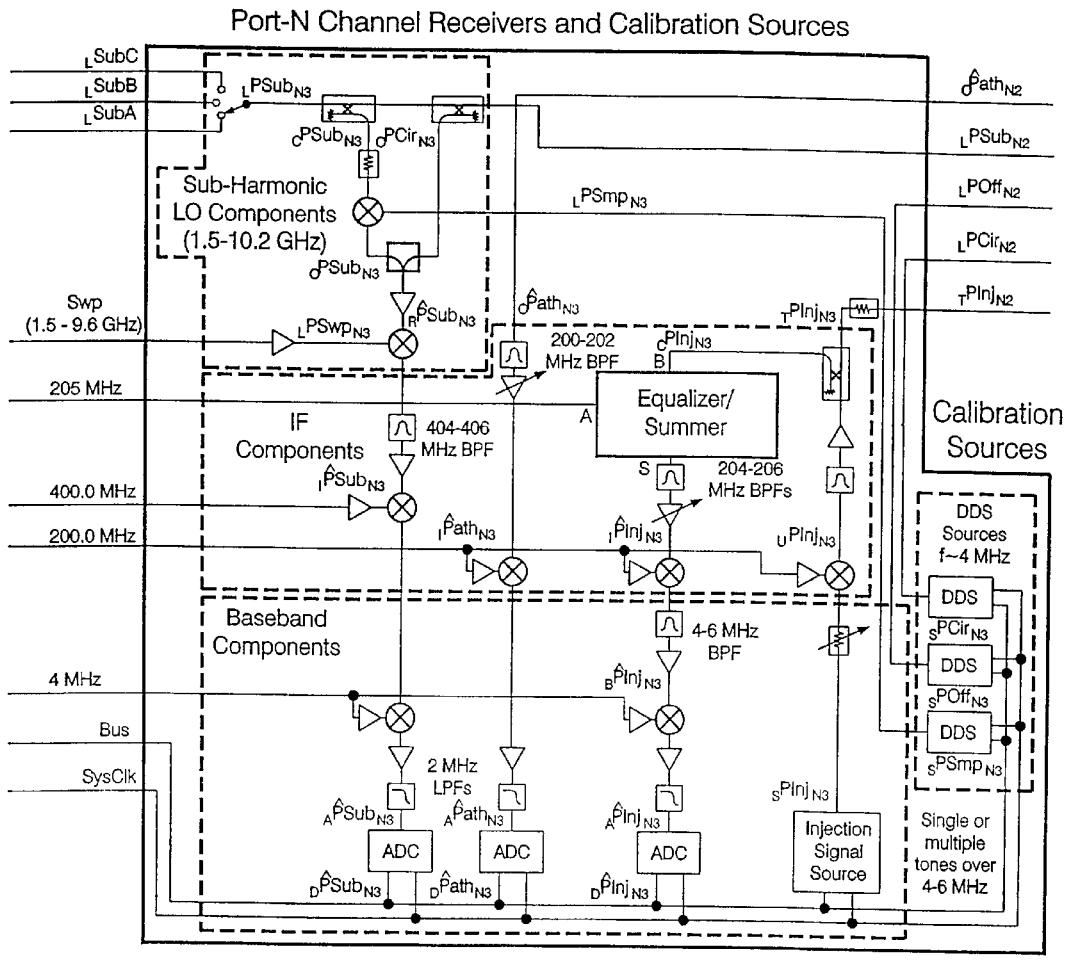
Figure 14. Port-N channel receivers and calibration sources, with an equalizer/summer.

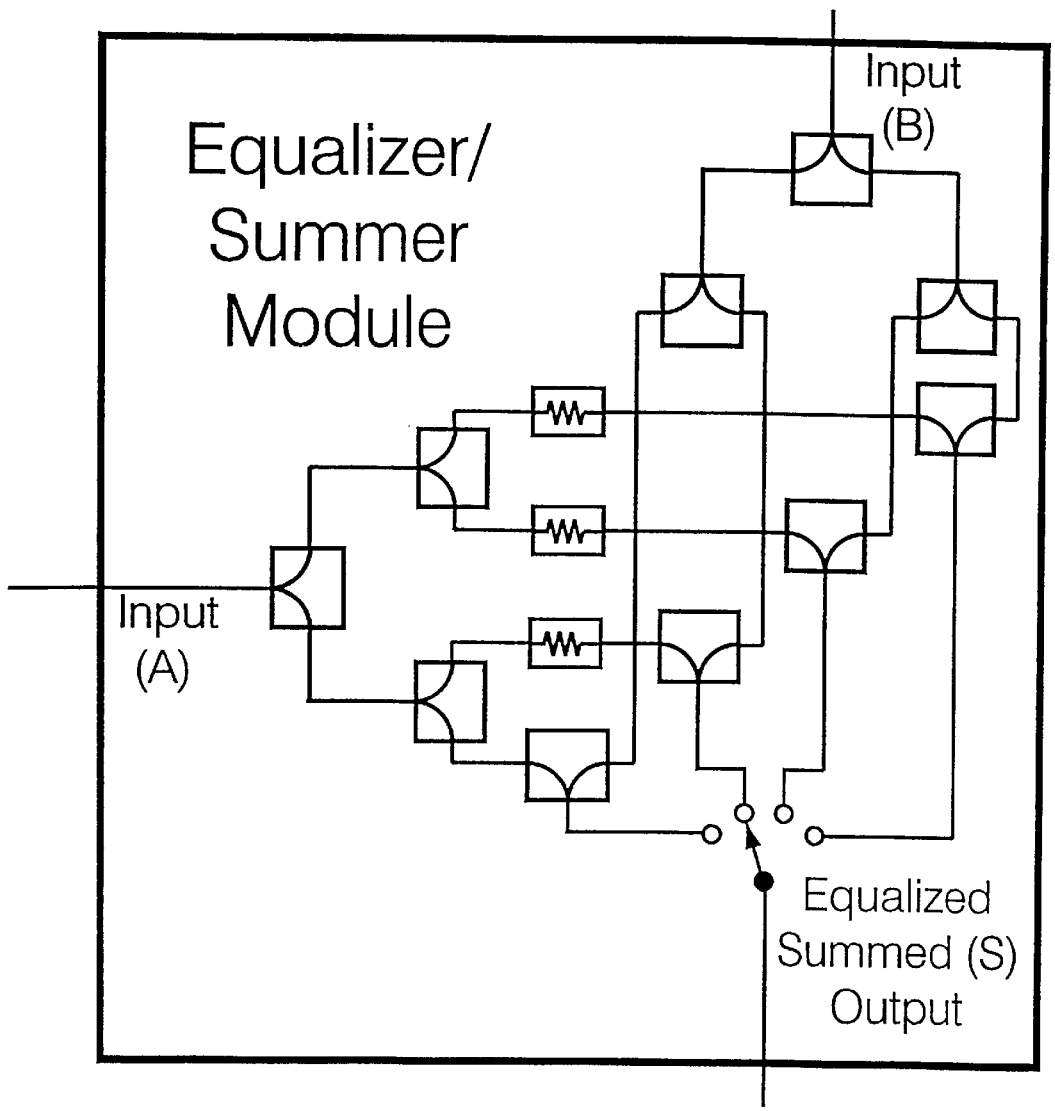
Figure 15. Details of the Equalizer/summer module.

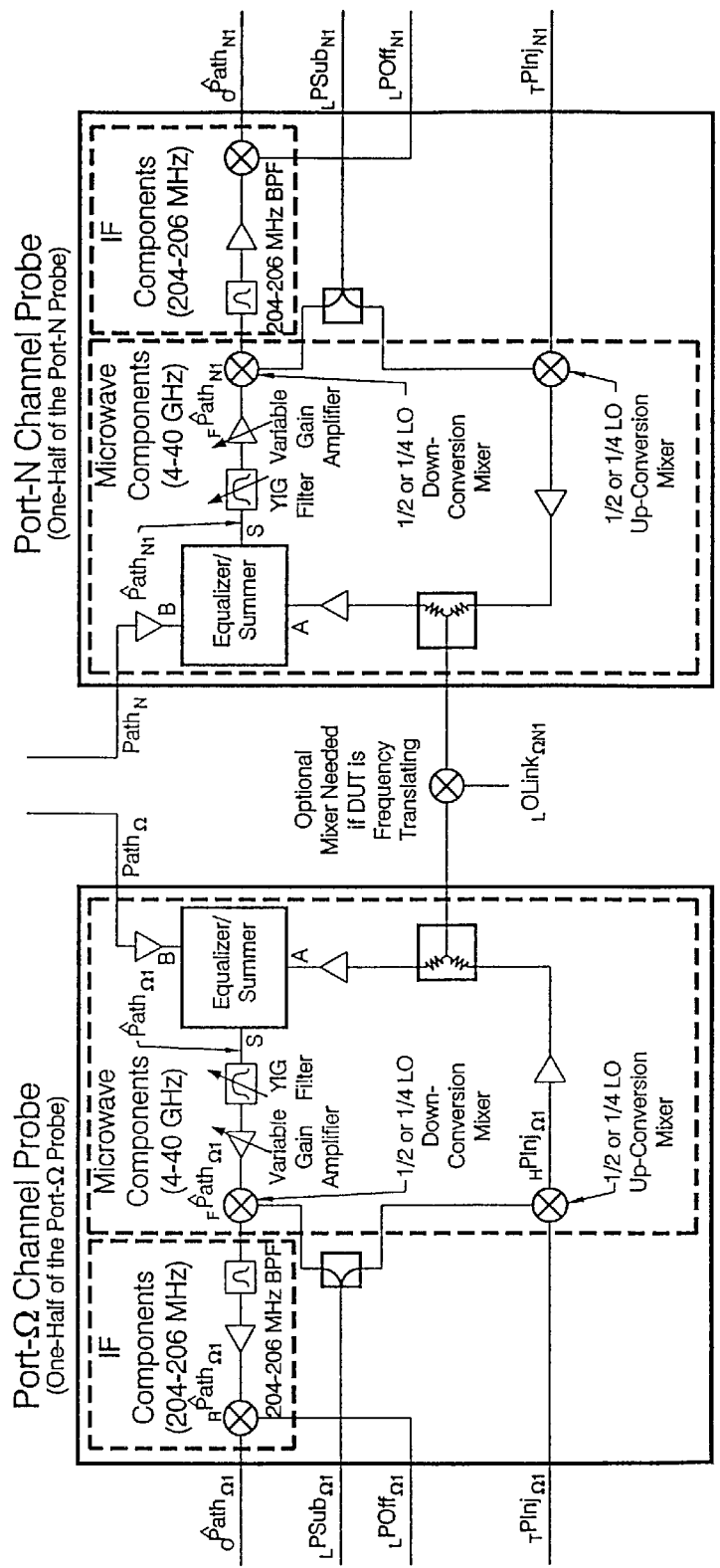
Figure 16. Circuit for using multiple levels at high frequency to optimize dynamic range and a method for linking multiple channels.

VECTOR SIGNAL ANALYSIS METHOD AND APPARATUS THEREFOR

RELATED INVENTION

The present invention claims priority under 35 U.S.C. §119(e) to: "The ARTTEST Vector Signal Analyzer," Provisional U.S. Patent Application Serial No. 60/240,811, filed Oct. 16, 2000, which is incorporated by reference herein.

The present invention is a continuation in part (CIP) of "Real-Time Error-Suppression Method and Apparatus Therefor," U.S. patent application Ser. No. 09/400,220, filed Sep. 21, 1999, which is incorporated by reference herein.

TECHNICAL FIELD OF THE INVENTION

The present invention relates to the field of signal measurement. More specifically, the present invention relates to the field of integral and simultaneous signal measurement and measurement device calibration.

BACKGROUND OF THE INVENTION

For accurate instrumentation, it is desirable to fully understand the characteristics of the devices used. With any given one of these devices, i.e., a "device-under-test" or DUT, the specific characteristics of that DUT are not fully understood. As a simplistic example, a given "47 k$\Omega$" resistor would rarely have a value of exactly 47,000$\Omega$. To properly understand the operation of a circuit containing such a resistor, acknowledge of the actual resistance (e.g., 46,985.42$\Omega$) would be helpful. It should be understood that a DUT may encompass a wide range of electrical components, equipment, and systems. A typical DUT may be a filter, an amplifier, a transmitter, a receiver, or any component, group of components, circuit, module, device, system, etc.

The drift of components, filters, amplifiers, and other signal-conditioning circuitry typically limits the accuracy of electronic measurements. A measurement system may advertise a large dynamic range and very-high resolution. However, the full dynamic range and resolution may not be realizable because of errors inherent in the system. Current measurement systems have not been demonstrated to have verifiable, full-scale uncertainties of better than 0.1 percent over all types of errors.

Real-world measurement instruments tend not to be perfect. This imperfection will affect the accuracy of the resulting measurements. This accuracy is dependent upon measurement errors. Such errors may be classed as static (systematic) errors and dynamic errors.

Static errors are repeatable, time-invariant system errors. That is, static errors do not vary over time. Static errors result from the nonideal aspects of a system. These errors are repeatable as long as no changes are made to the system. Static errors include directivity errors, source-mismatch errors, load-mismatch errors, reflection and transmission tracking errors, isolation or cross-talk errors, etc.

Static errors may be reduced through the use of precision components and circuits. However, no matter how precisely a circuit is designed, there will still be some level of static error present. Since static errors are repeatable, they can be suppressed using various static error suppression techniques, such as twelve-term error modeling, known to those skilled in the art. Twelve-term error modeling, typically employed with standard network analyzers, can account for directivity errors, source-mismatch errors, load-mismatch errors, tracking errors, and isolation errors.

Before error modeling may be employed, the error coefficients of the requisite equations must be calculated by making a set of measurements on a set of known loads meeting precise standards. A sufficient number of precise standards must be used in order to determine the various error coefficients in the error model. A common static-error calibration technique is the Short, Open, Load, and Through (SOLT) technique. The SOLT calibration technique yields better than 0.1 percent accuracy for static errors. However, dynamic errors limit the actual accuracy to less than this. An alternative static-error calibration technique, also well-known to those skilled in the art, is the Through, Reflection, and Load (TRL) technique. The TRL calibration technique yields significantly better static-error accuracy than the SOLT technique at the cost of calibration complexity. There are a number of other well-known static-error calibration techniques that may be used to advantage in specific instances.

However, removing a significant amount of static error achieves little if other types of errors are not also addressed. Dynamic errors are time-varying errors. That is, dynamic errors change over time, often in an unpredictable manner. Such errors may be attributable to a number of different sources. For example, component-drift, physical-device (e.g., cables, connectors, etc.) errors, phase-noise errors, random noise, etc.

Measurement systems exhibit several types of dynamic errors. Phase-noise errors and random errors, while inherently dynamic (i.e., time-variant) are special cases independently discussed hereinafter.

Component-drift errors may be either long-term or short-term. Long-term component-drift errors, however, are typically due to aging of the components, with resultant variations in component specifications.

One type of short-term component-drift error, source drift error, is usually attributable to thermal or mechanical variations within the system, and may include both amplitude and phase fluctuations of the output wave.

Another type of short-term component-drift error, receiver drift error, is associated with a data receiver. This may be due to drift in components such as amplifiers, filters, and analog-to-digital converters. Receiver-drift error may also appear as time-varying gain and phase drift in the received signals.

Thermal variations may also lead to physical expansion of passive components within the system. At high frequencies, such expansion may lead to appreciable phase errors. In applications where the DUT is located at a considerable distance from a transmitter and/or receiver, there may be a number of time-varying errors associated with the connections between the DUT and the transmitter and receiver. These may include amplitude and phase-drift errors in the amplifiers or errors associated with the modulation and demodulation circuitry. Systems in which such errors become significant include systems utilizing propagation media other than traditional cables (e.g., the atmosphere, space, the earth, railroad tracks, power transmission lines, the oceans, etc.).

Dynamic physical errors result from physical changes in the test setup. One example of a physical error is connector repeatability. As one connects and disconnects the DUT, there will be reflection and transmission errors associated with any nonrepeatability of the connectors. The severity of the connector repeatability error is related to the type of connector, the condition of the connector, and the care with which the user makes the connection.

Another type of dynamic physical errors are cable-flexure errors. Cable-flexure errors appear as one moves the cables to connect or disconnect a DUT or perform a calibration. Time-variant phase errors associated with the relaxation of the cable can occur for a period of time after the cable has been flexed.

Phase noise (jitter) is directly related to the frequency stability of a signal source. In a perfect sinusoidal oscillator, all the energy would lie at a single frequency. Since oscillators are not perfect, however, the energy will be spread slightly in frequency. This results in a pedestal effect. This effect, referred to as phase noise, is more severe at higher frequencies. Phase noise is a performance-limiting factor in applications where a weak signal must be detected in the presence of a stronger, interfering signal.

Random or white noise is common in measurement systems. Random noise includes thermal noise, shot noise, and electromagnetic interference. Random noise may appear as random data errors. Traditional and well-known techniques of random error suppression utilize some form of oversampling to determine the correct data and suppress the random errors.

Calibration frequency is also a problem in conventional signal measurement systems. Typically, high-accuracy measurement systems employing manual calibration are calibrated periodically. The interval between calibrations may be hourly, daily, weekly, monthly, quarterly, or even yearly. This technique produces a steadily decreasing accuracy that progresses over the inter-calibration interval. Additionally, drift errors occurring during the inter-calibration interval are uncompensated. Such drift errors tend to accumulate. Therefore, measurements taken shortly before calibration may be suspect. Exactly how suspect such measurements may be depends upon the length of the inter-calibration interval and the amount of drift involved.

Many state-of-the-art measurement systems employ automatic-calibration techniques. Some automatic-calibration systems calibrate at specified intervals. Such systems suffer the same decreasing accuracy as manual-calibration systems.

Other automatic-calibration systems calibrate at the beginning and end of each measurement cycle. The use of frequent nonsimultaneous calibration procedures does increase overall accuracy, but may also greatly increase the cost of measurements and prevents measurements while the frequent calibration procedures are taking place.

All calibration procedures discussed above are nonsimultaneous. That is, the calibration procedures do not occur simultaneously with measurement. Nonsimultaneous calibration procedures are incapable of correcting or compensating for dynamic errors, such as component drift, occurring during measurement.

Current technology demands increasingly small operational errors. High accuracy is therefore a growing need of instrumentation users. Measurement systems utilizing simultaneous calibration are useful for applications requiring high-accuracy measurements. That is, systems are needed that calibrate themselves and measure data simultaneously. Such systems are said to employ dynamic error suppression. That is, such systems are able to compensate for dynamic (time-variant) errors by continuously calibrating themselves while simultaneously performing the requisite measurements.

As current technology drives operational frequencies higher and higher, phase noise (i.e., signal jitter) increases in importance. A definite need exists, therefore, for systems employing phase-noise error suppression. That is, for systems employing some means of compensating for signal jitter. This is especially important in polyphase-constellation communications systems where phase noise may cause misinterpretation of the signal phase point (i.e., the data) at any given instant.

Measurement systems for state-of-the-art technology also desirably compensate for random errors.

BRIEF DESCRIPTION OF THE DRAWINGS

A more complete understanding of the present invention may be derived by referring to the detailed description and claims when considered in connection with the Figures, wherein like reference numbers refer to similar items throughout the Figures, and:

FIG. 5 shows a system-level block diagram of an ARTTEST vector signal analyzer in accordance with a preferred embodiment of the present invention;

FIG. 6 shows a block diagram for a sub-harmonic LO source module in accordance with a preferred embodiment of the present invention;

FIG. 7 shows a block diagram for a transmitter source module in accordance with a preferred embodiment of the present invention;

FIG. 8 shows a block diagram for a receiver and calibration source module in accordance with a preferred embodiment of the present invention;

FIG. 9 shows a block diagram for a port-N channel probe in accordance with a preferred embodiment of the present invention;

FIG. 10 shows a block diagram for port-N receivers and calibration sources in accordance with a preferred embodiment of the present invention;

FIG. 11 shows a signal flow graph for a port-N transmitter cable and receiver circuitry in accordance with a preferred embodiment of the present invention;

FIG. 12 shows a signal flow diagram used to model effects of the time-varying scattering matrix used to model transmitter or receiver circuitry in accordance with a preferred embodiment of the present invention;

FIG. 13 shows a block diagram of channel-N subharmonic, offset-frequency, LO source module in accordance with a preferred embodiment of the present invention;

FIG. 14 shows a block diagram of port-N channel receivers and calibration sources in accordance with a preferred embodiment of the present invention;

FIG. 15 shows a block diagram of an equalizer/summer module in accordance with a preferred embodiment of the present invention; and FIG. 16 shows a block diagram of a circuit for using multiple levels at high frequency to optimize dynamic range in accordance with a preferred embodiment of the present invention.

DETAILED DESCRIPTION OF THE PREFERRED EMBODIMENTS

1. Executive Summary

The Accurate, Real-Time, Total-Error-Suppression Technique (ARTTEST) Vector Signal Analyzer is a revolutionary advance in measurement technology. It can provide significant advantages over conventional network analyzers, spectrum analyzers-, dynamic signal analyzers, and modulation analyzers. We will show the power of this measurement approach applied to a network-analyzer application.

Figure 1:
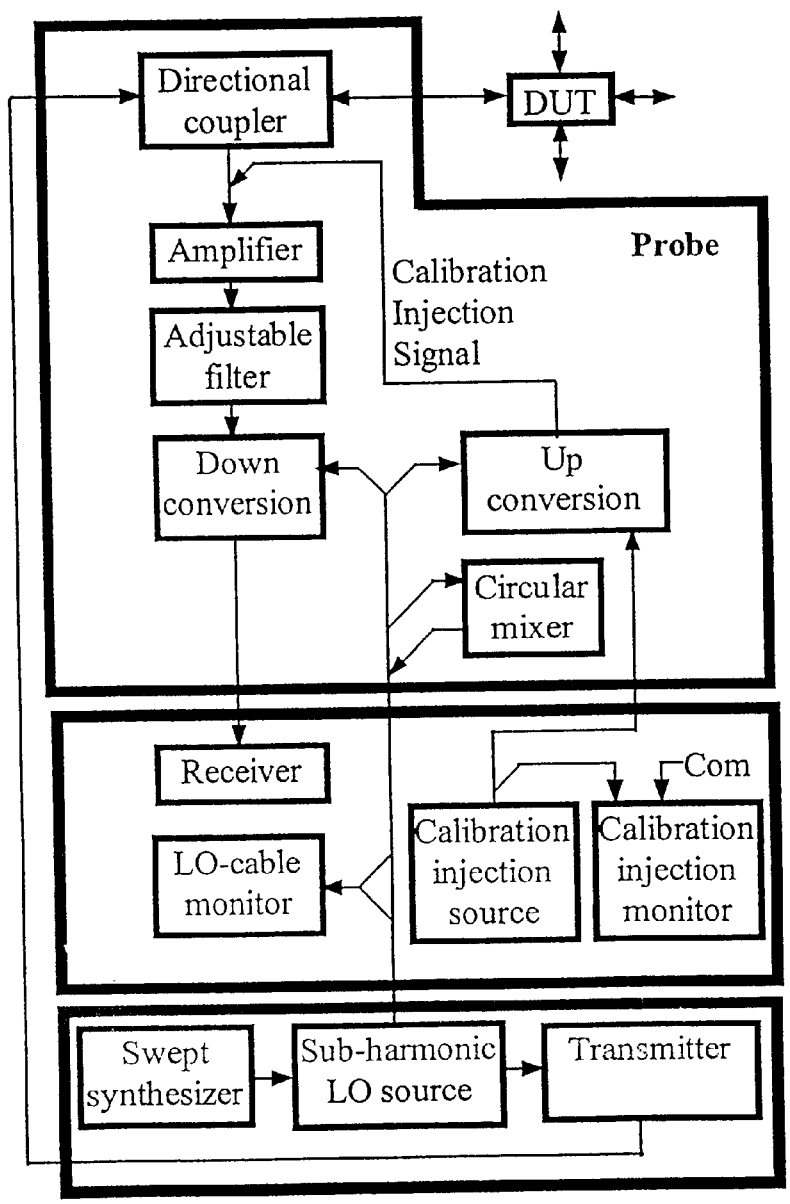
FIG. 1 shows an overall block diagram of an ARTTEST vector signal analyzer in accordance with a preferred embodiment of the present invention.
Figure 2:
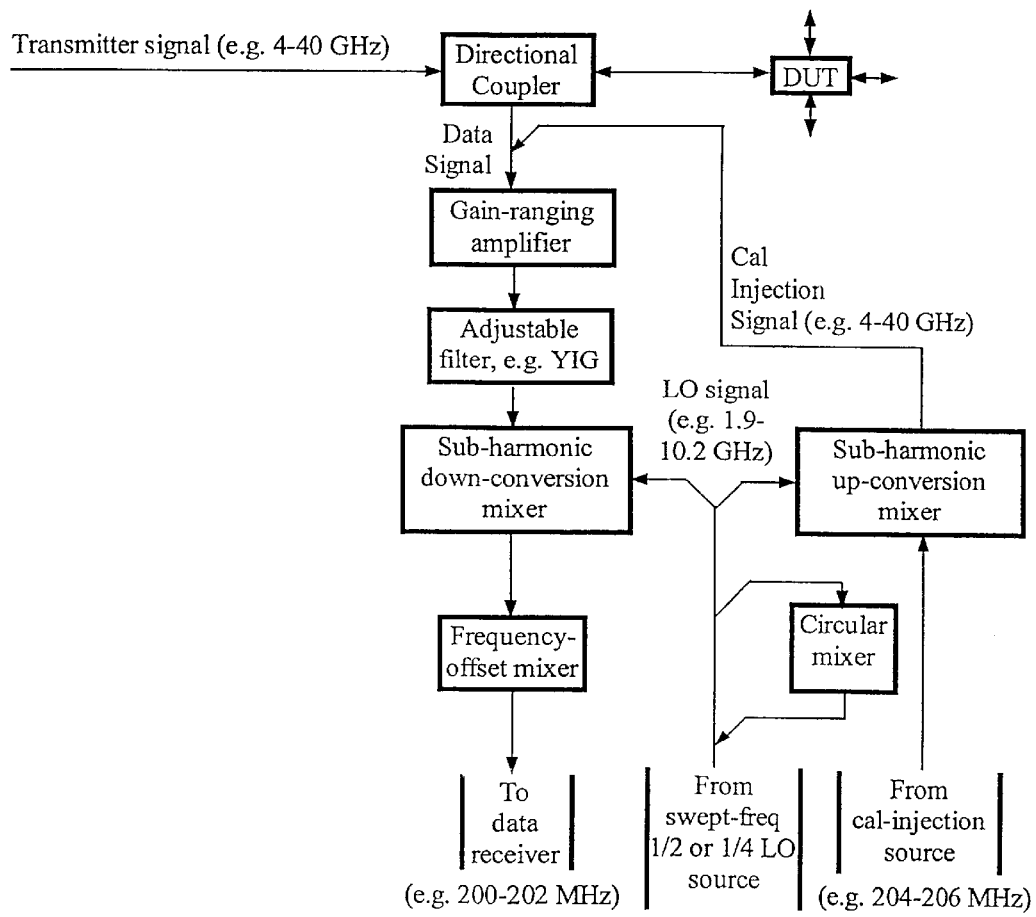
FIG. 2 shows a block diagram for a measurement probe in accordance with a preferred embodiment of the present invention.
Figure 3:
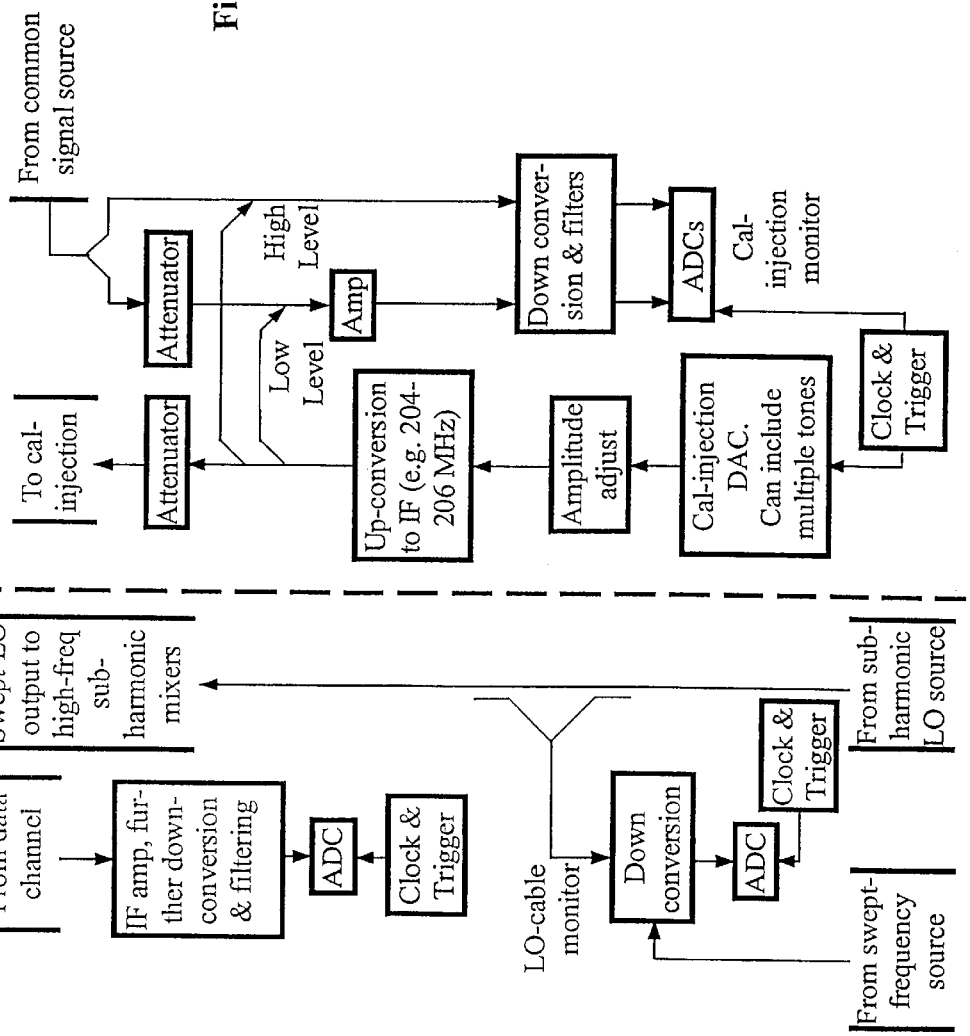
FIG. 3 shows block diagrams for a calibration-injection source/monitor and a receiver/monitor in accordance with a preferred embodiment of the present invention.
Figure 4:
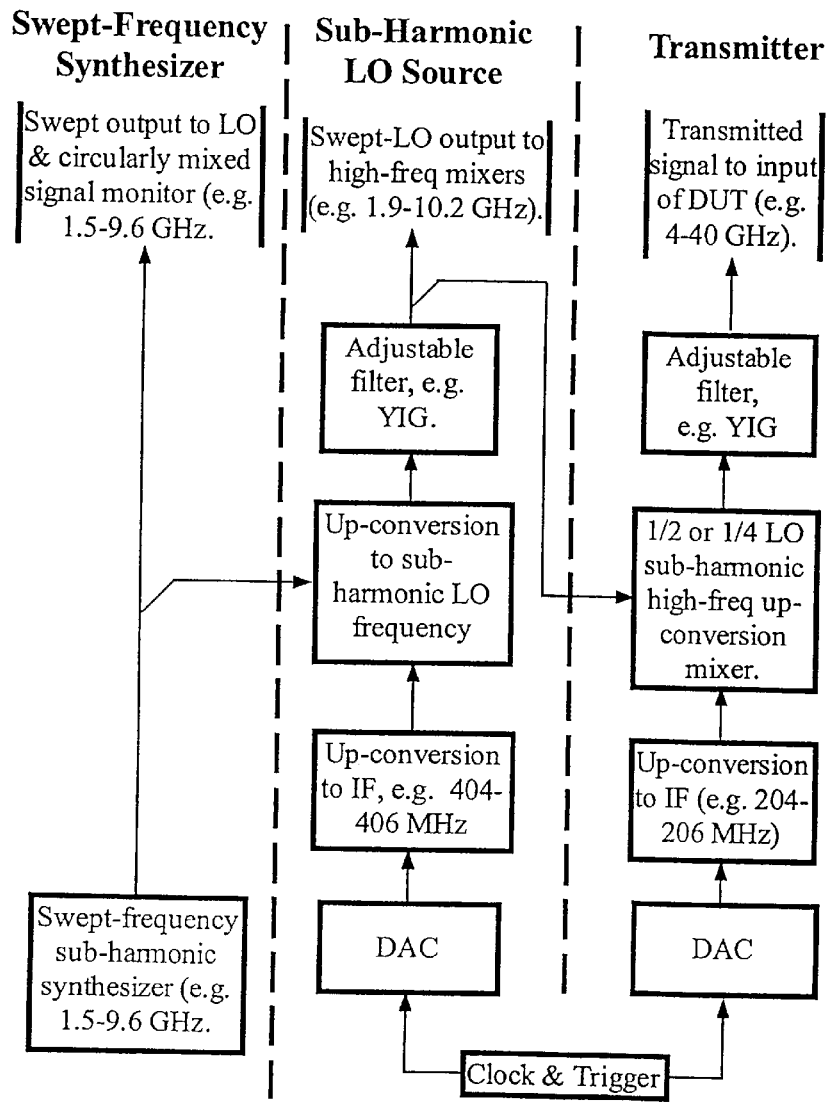
FIG. 4 shows block diagrams for a swept-frequency synthesizer, a sub-harmonic source, and a transmitter in accordance with a preferred embodiment of the present invention.

An overall view of the ARTTEST Vector Signal Analyzer is shown in FIG. 1. FIGS. 2–4 show more detail for the probe, receiver, calibration source and monitor, and the transmitter and sub-harmonic local oscillator (LO) sources.

FIG. 2 shows the high-frequency components, which are located in a probe near the Device Under Test (DUT). Many DUTs (for example mixers) will produce numerous other signals in addition to the desired measurement signal. In order to make reliable measurements of the desired signal, in the presence of these spurious signals, it is necessary to filter the image frequencies. This is especially true if harmonic mixers or samplers are employed for frequency down conversion. It is also desirable to eliminate other large-amplitude spurious signals in order to optimize the measurement dynamic range. A swept filter (e.g., a YIG filter) is commonly used in spectrum analyzers to remove these spurious signals. Heretofore, it has not been possible to use a time-varying filter for high-accuracy, vector-signal-analyzer measurements of both magnitude and phase. A time-varying filter -(e.g., a YIG filter) has a large uncertainty in its amplitude and phase response. Successive tuning sweeps of the filter may repeat to within only a few dB and tens of degrees. Methods have been developed to improve the tracking of these filters using phase-locked loops, for example, but they add considerable cost and still may only attain accuracies of several tenths of a dB in amplitude and several degrees in phase.

In the ARTTEST Vector Signal Analyzer, a calibration (cal) injection signal, which is slightly offset in frequency from the desired data frequency, is injected into the receiver channel simultaneously with the data signal. By using ratios of the data signal to the injected cal signal, all time-varying errors are removed. This includes the time-varying YIG filter response, amplifier response drift, and cable flexure errors. Removal of the time-varying (or dynamic) errors is combined with a conventional static error calibration, thereby providing a "total error suppression."

Previous approaches have tried to use simultaneously generated cal signals, for example injection of pilot signals or tones, along with the data. A major drawback of these previous approaches was caused by interference signals from the DUT at the calibration signal frequency. Various methods have been devised to reduce this interference. For example, fixed-frequency filters can reduce the interfering signals prior to injection of the cal signal, but this approach cannot be used for a wide-band, swept measurement. When a swept-frequency filter is used, the time-varying filter response adds considerable uncertainty to the measurement. Other approaches have attempted to use spectral notches in the transmitted waveforms, but these are not suitable for nonlinear DUTs, which may generate interference at arbitrary frequencies. In the ARTTEST method, we monitor the interference signals in two complementary channels, for example, the incident signal channel and the reflected or transmission signal (data) channel. By using appropriate ratios of these signals, we are able to use each channel to predict the interference in the corresponding channel and effectively remove the interference from the cal-injection signal.

Frequency-offset mixers are used to eliminate cross-talk problems between channels. Using the same Local Oscillator (LO) signal on the injected cal signal up-conversion and the down-conversion eliminates phase noise interference from the cal-injection signal onto the data signal.

The cost of high-frequency circuit components is minimized by using harmonic mixers (e.g., ½ or ¼ LO mixers). The usual loss in noise figure and dynamic range associated with harmonic mixers can be avoided by using a high-frequency gain-ranging amplifier at the front-end of the circuit. Note that the gain-ranging amplifier is dynamically calibrated by the ARTTEST normalization procedure.

In conventional network analyzers, any flexure of the data or LO cables will cause measurement errors at high frequencies. The data cable response is calibrated by the simultaneously injected signal. Changes in the LO cable response will cause errors in the phase when a cable is moved from a measurement on the short/open/load/thru standards, for example, to measurements on a DUT. In order to monitor changes in the LO cable response, we use a device that we call a circular mixer. This is a mixer that samples part of the LO signal, frequency offsets it, and returns it to receiver circuitry, where changes in the phase difference between the generated LO signal and the returned frequency-offset signal are monitored.

It is important in the ARTTEST Vector Signal Analyzer to maintain a high level of isolation between various parts of the circuits. For example, there should be high isolation on the LO signal line that feeds the sub-harmonic down-conversion and up-conversion mixers. This isolation can be obtained with attenuating pads on each line, which feeds each mixer. The amplitude and phase response of attenuators can be extremely stable, but they require extra LO power. Ferrite isolators can be used, but they are typically quite narrow band. It is also possible to obtain high isolation with fixed-gain amplifiers on each of these lines. Any drift in the response of these amplifiers will not be calibrated by the ARTTEST method, but since the amplifiers have a fixed gain, the drift will usually not be a serious limitation. The choice between pads, ferrite isolators, or amplifiers will depend on the requirements of the specific application. Another critical area for high isolation is between the data-signal directional coupler and the point where the calibration signal is injected into the receiving circuit. A lack of isolation at this point could allow the injected calibration signal to pass through the directional coupler, reflect off the DUT and reenter the ARTTEST probe, thereby leading to serious errors. Again the isolation in this part of the circuit can be increased by using attenuating pads, ferrite isolators, or fixed-gain amplifiers. Finally, each measurement channel must be carefully isolated so that interfering signals are not communicated through common-signal lines, clock lines and power supplies.

FIG. 3 shows a block diagram for the ARTTEST calibration-injection source, calibration-injection monitor, and the ARTTEST receiver and LO-cable monitor. The calibration-injection signals are produced by low-cost digital-to-analog converter (DAC) chips. These calibration signals are then converted to an IF frequency (e.g., 204–206 MHz). Fixed frequency filters eliminate harmonics from the frequency up-conversion to the IF. The calibration-injection-signal amplitude is adjusted to approximately match the data-signal amplitude. The final calibration-injection-signal amplitude and phase are then measured by a down-conversion circuit and analog-to-digital converter (ADC). An ARTTEST normalization signal (in this case called the common signal) is used to tie all the calibration injection signals together. In order to measure precisely the calibration-injection signals, it is desirable to use at least two separate calibration-injection-signal measurement channels. One of the channels is used for high-level signals. The other channel uses an amplifier for low-level signals. An attenuator is used on the low-level common-signal line.

All of the ADCs and the DACs are synchronized with a common clock and trigger signal. The common trigger signal is required in order to determine phase information for all the signals.

The ARTTEST receiver section is used to record the combined data and calibration signals. All of the time-varying response changes (e.g., amplifier and other signal-conditioning response drift) are removed using the ARTTEST calibration procedure. After the down-converted, low frequency signals are digitized, the data and cal-injection signals are separated in the frequency domain, using for example an FFT. Ratios of data to calibration-injection or normalization signals are then calculated. Appropriate ratios tie together all the receiver channels, calibration-injection signals, circularly mixed signals, and transmitted (incident power) signals.

FIG. 4 shows the ARTTEST swept-frequency synthesizer, sub-harmonic source, and transmitter. These modules represent some of the most important cost savings in the ARTTEST Vector Signal Analyzer. Since we use adjustable, swept-frequency (e.g., YIG) filters in this system, we can derive required offset-frequency signals using mixers. This allows us to obtain multiple sub-harmonic LO signals and transmitter signals, which reside at unique frequencies, from a single swept, high frequency synthesizer. This can lead to an enormous savings since high-frequency swept synthesizers are a major part of the cost of vector signal analyzers. Further savings in the usually high-cost synthesizers are made possible by the ability to use large frequency-step synthesizers, e.g., 1 MHz. A 1 Hz resolution bandwidth can still be attained by using a 1 Hz step size in the low frequency, low-cost, DAC chips. Finally, since we are using sub-harmonic mixers, the required frequency range of the synthesizers is greatly reduced.

An important part of the design of the transmitter and LO source module is minimization of phase noise. When the transmitted and received signals are within 200 MHz of each other, the LO that is used for up-conversion of the transmitter signal has approximately the same phase noise as the LO that is used for down-conversion of the received signal. This substantially eliminates phase-noise interference. When the transmitted and received signals have large offsets, phase noise is not likely to be an issue.

2. Introduction

A block diagram of the ARTTEST Vector Signal Analyzer is shown in FIG. 5. This system has been designed to suppress all possible sources of error, including static errors, dynamic errors, phase-noise, and random errors. Some possible configurations for the ARTTEST Vector signal Analyzer include:
  a) The system can be used for network analyzer measurements on linear DUTs, where the transmit and receive frequencies are the same.
  b) It can be employed for measurements on frequency-offsetting (non-linear) DUTs, such as mixers, which require different transmit a nd-receive frequencies.
  c). It can also be used as a dynamic signal analyzer and spectrum analyzer.
  d) The system can be configured with multiple channels for the characterization of DUTs with multiple (i.e., N) ports.

In order to illustrate the application of the ARTTEST Vector Signal Analyzer, we will provide a detailed discussion of the network analyzer with a linear DUT (Chapter 3).

The ARTTEST Vector Signal Analyzer has been designed to minimize the number of expensive, high-frequency synthesizers, i.e., only one high-frequency synthesizer is required for standard network analyzer measurements, for measurements requiring two or more input signals with frequencies that are within 200 MHz of each other, or for measurements of higher-order frequency harmonics. Two synthesizers are required to measure frequency-offsetting devices with offset frequencies that are greater than 200 MHz.

In addition to only requiring one high-frequency synthesizer for most standard measurements, the ARTTEST Vector Signal Analyzer has been designed in such a way that the high-frequency synthesizer only requires a relatively large frequency step size, e.g., 1 MHz, thereby further lowering the cost of the high-frequency synthesizer. As will be discussed, a 1 Hz, or finer, transmitter frequency resolution is achieved by employing high-resolution, baseband (4–6 MHz), Digital-to-Analog Converter (DAC) chips followed by frequency upconversion.

As shown in FIG. 5, connected to each port of the DUT is a Microwave Probe. Each probe contains: a pair of directional couplers or bridges, that sample the forward- and backward-traveling waves in the test port; YIG-tuned filters that remove unwanted noise and image responses; sub-harmonic down-conversion mixers; and circuitry for the suppression of the dynamic system errors. Each probe is connected via a set of cables to the Receiver and Calibration Source Module. This module contains the system receivers, and the low-frequency sources and circuitry required for dynamic error suppression.

In order to only use one high-frequency synthesizer and reduce its required frequency resolution, the ARTTEST Vector Signal Analyzer uses up-conversion of low-frequency signals to produce various sub-harmonic Local Oscillator (LO) signals. These sub-harmonic LO signals drive sub-harmonic mixers that are used to up-convert low-frequency signals (with fine frequency resolution) and produce the desired microwave transmitter and calibration injection signals. Furthermore, sub-harmonic down-conversion, using the same LO signals, suppresses the system phase noise, thereby allowing for the injection of the calibration signals. The transmitted is microwave signals and the sub-harmonic LO signals are generated in the Microwave Transmitter and Sub-harmonic LO Source Modules, respectively.

In one embodiment of the ARTTEST Vector Signal Analyzer, one frequency synthesizer produces a swept CW signal in the range $1.5 \leq f \leq 9.6$ GHz (denoted as Swp in FIG. 5), which is used with sub-harmonic mixers ($2^{nd}$ or $4^{th}$ LO harmonics) to make standard network analyzer measurements over the frequency range $4 \leq f \leq 40$ GHz. The main limitation on this measurement frequency range is the tuning range of the swept YIG filters. Lower frequency band coverage can be achieved using additional bands similar to the one shown here or a conventional network-analyzer design. Measurements can be performed on frequency-offsetting devices (e.g., mixers) using one high-frequency synthesizer provided the offset frequency is less than 200

MHz. Furthermore, large frequency offset measurements can be made if the measurement frequency is harmonically related to the transmitter frequency, e.g., frequency multipliers. Additional RF synthesizer outputs, that are shown in FIG. 5 (i.e., MSwpB, MSwpC, 200.0 MHz, 205.0 MHz, 400.0 MHz, and 4 MHz), are employed during the process of frequency up-conversion and frequency down-conversion, as discussed later.

The system computer is connected to the various modules via a data bus. The computer is used to control the switches, YIG filters, and synthesizers. It is also used to collect the digitized data from the receivers, i.e., the Analog-to-Digital Converters (ADCs) and associated Digital Signal Processors (DSPs). After the digital data have been collected by the ADCs, then DSPs are used to perform the Fast Fourier Transforms (FFTs) and extract the signals from the appropriate frequency bins. These signals are then sent via the data bus back to the computer. Signal normalization and error correction techniques are then applied in the computer to the measured data in order to calculate the actual Scattering Parameters (S-Parameters) for the DUT. Finally the computer is used to display the actual S-Parameters in the desired format. A system clock is used to synchronize the synthesizers, DACs, and the ADCs.

3. Detailed Description of the Application of the ARTTEST Vector Signal Analyzer to Standard Network Analyzer Measurements As previously discussed, the ARTTEST Vector Signal Analyzer can be used to make standard network analyzer measurements, measurements on frequency-converting DUTs, and dynamic signal analyzer measurements. We will discuss standard network analyzer measurements in detail as an example of the operational theory.

3.1. Sub-Harmonic LO Source Module

First we provide a detailed description of the Sub-harmonic LO Source Module. A detailed circuit for this module is provided in FIG. 6. Three distinct sub-harmonic LO signals ($_L$SubA, $_L$SubB, and $_L$SubC) are created in this module. These sub-harmonic LO signals are used for harmonic up-conversion of the transmitter and calibration injection signals, as-well-as for harmonic down-conversion of the combined data and injection signals.

Only one of the LO signals ($_L$SubA) is required for standard network analyzer measurements. The other two LO signals are necessary for frequency-offset measurements.

We will represent the various signals in the ARTTEST Vector Signal Analyzer in both the time and frequency domains, where we employ the exp(jω t) time convention. A DAC chip produces a CW signal $_S$Sub that is at a frequency $f_S{}^{Sub}$. In the preferred embodiment of the ARTTEST Vector Signal Analyzer, we have chosen to employ a frequency in the range 4–6 MHz for the signal produced by this DAC chip. This frequency can be adjusted over a range of 2 MHz, centered around 5 MHz, in order to provide fine frequency resolution (e.g., 1 Hz) in the sub-harmonic LO signals. The baseband signal, which is produced by the DAC chip, is then frequency up-converted to an Intermediate Frequency (IF) by mixing with a 200 MHz signal.

Three stages of frequency up-conversion are employed in order to allow for the creation of three distinct sub-harmonic LO frequencies while allowing for the filtering of the undesired sidebands. The IF signal produced by the first stage of frequency upconversion, i.e., $_U$Sub, has frequency components that reside at $f_U{}^{Sub}$=200 MHz+$f_S{}^{Sub}$. This signal is amplified and narrow-band filtered to remove the lower sideband. The resultant signal is then split into three equal-level signals, which are each mixed with different LO signals.

In this section we concentrate on the creation of the sub-harmonic signal in channel A. For this case, we employ a 200 MHz LO source, which yields the output signal $_T$SubA, which resides at the frequencies $$f_T{}^{SubA} = \pm 200 \text{ MHz} + 200 \text{ MHz} + f_S{}^{Sub}. \tag{1}$$

This IF signal is then mixed with the swept LO signal, $_L$SWP, which is produced by the high-frequency microwave synthesizer in the Frequency Synthesizer Module (FIG. 5). As previously discussed, a low resolution synthesizer with a relatively large frequency step size (e.g., 1 MHz) can be employed in the frequency up-conversion process since the baseband DAC chip is adjustable with 1 Hz (or finer) steps over a 2 MHz frequency range. The up-converted microwave signal, $_H$SubA, which resides at the frequencies $$f_H{}^{SubA} = f_L{}^{Swp} \pm (\pm 200 \text{ MHz} + 200 \text{ MHz} + f_S{}^{Sub}), \tag{2}$$

is again amplified before passing through a swept-frequency YIG filter with a passband that is less than 200 MHz in width. The YIG filter is tuned to pass the upper sideband signal while rejecting the other sideband signals. The filtered upper sideband signal, $_L$SubA, resides at the following frequency:

$$f_L{}^{SubA} = f_L{}^{Swp} + 400 \text{ MHz} + f_S{}^{Sub}. \tag{3}$$

We represent the time-domain signal that is created in Channel A of the Subharmonic LO Source Module as $$_LSubA(t) = |A_L{}^{SubA}| \cos(2\pi f_L{}^{SubA} t + \phi_L{}^{SubA}), \tag{4}$$

where $$\phi_L{}^{SubA} = \phi_L{}^{Swp} + 2\phi_{200} + \phi_S{}^{Sub} + \phi_{PSubA}. \tag{5}$$

This phase term is made up of the following individual phases, $\phi_L{}^{Swp}$, $\phi_{200}$, and $\phi_S{}^{Sub}$, which represent phases associated with the high-frequency, 200 MHz, and the DAC sources, respectively. The term $|A_L{}^{SubA}|$ denotes the signal amplitude at the output of the Subharmonic LO Source Module and $\phi_{PSubA}$ represents the phase shift associated with the electronics in Channel A. Finally, $f_L{}^{SubA}$ denotes the signal frequency (3). As shown in (4) and (5), any changes in the mixer LO phases directly appear at the outputs of the mixers. On the other hand, the mixer outputs are insensitive to small changes in the LO amplitudes, so LO amplitude effects are not included in (4) or in any future equations involving mixers. Since the amplitude and phase of a source may drift over time, the time variations associated with $|A_L{}^{SubA}|$ and $\phi_L{}^{SubA}$ must be suppressed in order to make accurate measurements. A technique for the suppression of these time-varying errors is presented later.

3.2. Transmitter Module

Next we provide a detailed description of the Transmitter Module. A detailed circuit for this module is provided in FIG. 7. This module creates three microwave transmitter signals (TxU, TxV and TxW) that reside at different frequencies. These three signals can be employed in the characterization of frequency-offsetting devices, such as mixers. In this chapter we only discuss the generation of TxU since only one transmitter signal is required for standard network analyzer measurements.

As was the case in the Subharmonic LO Source Module, a DAC chip produces a baseband CW signal $_S$TxU that is at a frequency $f_S^{TxU}$. This signal also resides at a frequency within the range 4–6 MHz, but it exists at a different frequency from $f_S^{Sub}$. The baseband signal $_S$TxU is then passed through a variable attenuator, which allows for amplitude adjustment, before being frequency up-converted to the sum and difference IF frequencies $f_U^{TxU}$=200 MHz±$f_S^{TxU}$. After signal amplification and narrow-band filtering (i.e., the sum signal is passed while the difference signal is rejected), frequency up-conversion to high microwave frequencies is accomplished by mixing the IF signal $_U$TxU with the sub-harmonic LO signal $_L$SubA ((3) and (5)). We employ either the second or fourth-order mixer harmonic in this process, i.e., $$f_H^{TxU}=Mf_L^{SubA}\pm(200\ \text{MHz}+f_S^{TxU}), \quad (6)$$

where M=2 or 4. We note that use of M=2 or 4 harmonics is just one example; higher-order harmonics can also be used. The YIG filter is used to pass the upper sideband signal of the desired harmonic, thereby yielding $$f_{TxU}=Mf_L^{SubA}+200\ \text{MHz}+f_S^{TxU}, \quad (7)$$

where $f_L^{SubA}$ is defined in (3). Note that the YIG filter rejects all of the unwanted RF and LO harmonics, thereby producing a low-distortion signal for transmission to the DUT. If we assume that $1.5 \leq f_{Swp} \leq 9.6$ GHz, then $4 \leq f_{TxU} \leq 20.2$ GHz and $7.8 \leq f_{TxU} \leq 40$ GHz for M=2 and M=4, respectively. The M=4 band is only used over the frequency range $20.6 \leq f_{TxU} \leq 40$. We have restricted the high end of this frequency range to correspond with the tunable range of a conventional YIG filter.

The time-domain transmitter signal that is created in Channel U of the Transmitter Source Module can be written as $$TxU(t)=|A_{TxU}|\cos(2\pi f_{TxU}t+M\phi_L^{SubA}+\phi_{200}+\phi_S^{TxU}+\phi_{PTxU}), \quad (8)$$

where $\phi_{200}$ and $\phi_S^{TxU}$ represent phases associated with the 200 MHz and the DAC sources, respectively. The term $|A_{TxU}|$ denotes the signal amplitude at the output of the Transmitter Source Module and $\phi_{PTxU}$ represents the phase shift associated with the electronics in Channel U of the Transmitter Source Module. The term $f_{TxU}$ denotes the transmitter frequency and $\phi_L^{SubA}$ represents the phase associated with the subharmonic LO source ((7) and (5), respectively).

3.3. The Port-N Circuitry for the Data Channels

Now that we have discussed the generation of the microwave signals, we next discuss the circuitry that is required to make use of these signals. In order to carry out efficient S-parameter measurements on an N-port DUT, the ART-TEST Vector Signal Analyzer must be configured with N test channels, where each test channel has the form shown in the block diagram in FIG. 8. As shown in FIG. 8, two separate Paths are required for each test channel—an incident path and a data path. A detailed circuit diagram for a generic path in the Port-N Microwave Probe is shown in FIG. 9. Likewise, a generic path in the Receiver and Calibration Source Module is shown in FIG. 10.

To better understand how time-varying component drift errors enter into the measurements, we employ a signal-flow analysis for the Port-N circuitry. The insight that is gained through the signal flow analysis is then employed to develop a dynamic error suppression (DES) technique. In the DES technique, signal-normalization techniques are used to remove the time-varying system errors. In this subsection we only investigate the data signal paths. Later we show that these results can be easily extended to obtain similar results for the incident signal paths.

3.3.1. Data Signal Paths

The signal-flow graph in FIG. 11 can be used to investigate the effects of the time-varying component characteristics on the data signal measurements. As shown in FIG. 8, the microwave transmitter signals, TxU, TxV, and TxW, which are generated in the Microwave Transmitter Source Module, are routed to the transmitter switches for each of the N ports. These transmitter switches determine which signal, if any, is incident on the DUT from a given port.

In standard network analyzer measurements, only one port is excited and the other ports are terminated in matched loads. Thus, to measure the scattering parameter $S_{nN}$, where n=1,2, . . . , or N, the transmitter switch for Port N should be set to select transmitter U ($Tx_{N2}$=TxU), and the transmitter switches on all the other ports should be set to the matched loads. This Port-N transmitter signal serves as the input to the signal flow graph in FIG. 11. The Port-N transmitter signal will be related to the time-domain signal in (8) by an attenuation constant and a phase shift. Here we will write $$TX_{N2}(t)=|A_{Tx_{N2}}|\cos(2\pi f_{TxU}t+M\phi_L^{SubA}+\phi_{200}+\phi_S^{TxU}+\phi_{PT x_{N2}}), \quad (9)$$

where the term $|A_{Tx_{N2}}|$ represents the amplitude at the output of the Receiver and Calibration Source Module and $\phi_{PT x_{N2}}$ represents the phase shift associated with both the electronics in Channel U of the Transmitter Source Module and the circuitry that connects the output of the Transmitter Source Module with the transmitter output of the Receiver and Calibration Source Module. Since the transmitter signal passes through various time-varying components (e.g., amplifiers and swept-frequency YIG filters) during its generation, the amplitude and phase terms, i.e., $|A_{Tx_{N2}}|$ and $\phi_{PT x_{N2}}$, will vary between measurements.

The Port-N transmitter signal, $Tx_{N2}$, next passes through the Port-N cables on its way to the Port-N Microwave Probe. Since this signal may be at a high frequency, cable flexure, associated with the process of connecting the DUT, or changes in the physical cable length due to temperature drift, can cause the characteristics (i.e., insertion loss and return loss) of this cable to change relative to those present during the time of the static calibration. These time-varying changes are accounted for in the analysis by assigning a time-varying scattering matrix (S-matrix), $[S^{Tx_N}]$, to this path (FIGS. 8 and 11). The signal that passes through the cable and is incident on the Port-N Microwave Probe is represented by $Tx_{N1}$. After entering the Port-N Microwave Probe (FIG. 8), a portion of the signal $Tx_{N1}$ passes through the forward and reverse directional couplers, thus yielding the signal $Tx_N$. As shown in FIGS. 5 and 11, this is the Port-N transmitter signal that is incident on the DUT. We also include reflection coefficients, $\Gamma_S^{Tx_N}$ and $\Gamma_L^{Tx_N}$, in the signal flow graph to model reflections at the inputs to the Port-N Receiver and Calibration source Module and the Microwave Probe, respectively.

A portion of the signal $Tx_N$ will reflect off the DUT, because of the impedance mismatch, and a portion of this signal may flow through the DUT and exit at the other ports. It is the measurement of these reflected and transmitted signals (i.e., $Dat_n$, for n=1,2, . . . ,N) that allows for the characterization of the DUT, i.e., measurement of the DUT's S-matrix. The forward and backward traveling waves on a port are sampled via the directional couplers in the probe (FIG. 8). These signals, $Inc_N$ and $Dat_N$, are then fed into one of the two probe channels (FIG. 9), where the signals are represented by the general notation $Path_N$.

Here we only discuss the reflected signal. However, signal flow graphs for the signals incident on the DUT or transmitted through the DUT can be obtained in an analogous manner. In this stage of the signal flow analysis, we will assume that the directional couplers (or directional bridges) in the Microwave Probes are ideal, i.e., they have infinite directivity. As is discussed later, the effects of their finite directivity are removed via static calibration. The S-parameter $\tilde{S}_{NN}^M$ in FIG. 11 represents the measured DUT reflection coefficient. Furthermore, it is assumed that the insertion loss along the data path through the Microwave Probe (i.e., the directional coupler and the hybrid combiner in FIGS. 8 and 9) is characterized by the parameter $PDat_N$.

After the reflected signal $Dat_N$ is sampled by the reverse directional coupler (FIG. 8), this signal is combined with a calibration injection signal (FIG. 9 and Section 3.3.3). After exiting the hybrid combiner in the Microwave Probe, the data signal flows through a variable gain amplifier and a YIG tuned filter. Since these components may cause time-varying drift errors between measurements, their effects are lumped together in the time-varying scattering matrix $[S^{Dat_N}]$ in the signal flow graph (FIG. 11). The reflection coefficients, $\Gamma_S^{Dat_N}$ and $\Gamma_L^{Dat_N}$, are also included in the signal flow graph to model reflections at the output of the directional coupler and the input to the subharmonic down-conversion mixer, respectively.

If we design the directional couplers to insure that the insertion loss through the microwave probe is large (e.g., $-20 \log_{10}|PDat_N| \geq 30$ dB for the data path as well as for all the other paths in the calibration probes), then the signal that is reflected back into the microwave probe by a mismatch associated with the gain-ranging amplifier and YIG filter will have negligible amplitude after re-reflecting off the DUT and passing back through the directional coupler and hybrid combiner. Thus, as shown in FIG. 11, we will neglect the signal-flow path associated with the return signal in the Microwave Probe, i.e., we set this term to zero. Once this feedback path has been removed, then the general signal-flow graph in FIG. 12 can be used to investigate the effects of the transmitter cable and the YIG filter/amplifier, separately. Using the results in Hewlett Packard, 1972, we find that the transmission coefficient for the signal-flow graph in FIG. 12 can be written as $$T^{Path_N} = \frac{b_2^{Path_N}}{b_S^{Path_N}} = \frac{S_{21}^{Path_N}}{1 - S_{11}^{Path_N}\Gamma_S^{Path_N} - S_{22}^{Path_N}\Gamma_L^{Path_N} + (S_{11}^{Path_N}S_{22}^{Path_N} - S_{21}^{Path_N}S_{12}^{Path_N})\Gamma_S^{Path_N}\Gamma_L^{Path_N}} \quad (10)$$

If we let $b_S^{Tx_N} = Tx_{N2}$ and $b_2^{Tx_N} = Tx_N$, then we can write the frequency-domain signal at the input to the DUT (FIG. 8) as $$Tx_N = Tx_{N2}T^{Tx_N}, \quad (11)$$

where $T^{Tx_N}$ denotes the time-varying transmission coefficient for the Port-N transmitter cable, i.e., let $Path_N = Tx_N$ in (10). The corresponding time-domain signal can be written as ((9) and (11))

$$Tx_N(t) = |A_{Tx_{N2}}T^{Tx_N}|\cos(2\pi f_{TxU}t + M\phi_L{}^{SubA} + \phi_{200} + \phi_S{}^{TxU} + \phi_{PTx_{N2}} + \phi_T{}^{Tx_N}) \quad (12)$$

After reflecting off of the DUT, a portion of the reflected signal is sampled by the reverse directional coupler in the Microwave Probe (FIG. 8) before being passed through a hybrid combiner (FIG. 9). As previously discussed, the insertion loss through the directional coupler can be modeled by $PDat_N$.

The sampled data signal then passes through the variable gain amplifier and a YIG-tuned filter (FIG. 9). The variable gain amplifier can be employed for gain ranging in order to improve the system's dynamic range. The YIG filter is tuned to the frequency $f_{TxU}$ so it will pass the signal $Dat_{N1}$ while rejecting out-of-band harmonics, noise, and image responses. If the time-varying response of these components is modeled by $[S^{Dat_N}]$ in FIG. 11, then the time-domain signal at the input to the down-conversion mixer (FIG. 9) can be written as ((10), (12), and FIG. 11)

$$_FDat_{N1}(t) = \quad (13)$$
$$|A_{Tx_{N2}}T^{Tx_N}\tilde{S}_{NN}^M PDat_N T^{Dat_N}|\cos(2\pi f_{TxU}t + M\phi_L{}^{SubA} + \phi_{200} +$$
$$\phi_S{}^{TxU} + \phi_{PTx_{N2}} + \phi_T{}^{Tx_N} + \phi_{\tilde{S}_{NN}^M} + \phi_{PDat_N} + \phi_T{}^{Dat_N}).$$

Before continuing our discussion on the data signal path, we must first investigate the subharmonic LO signal path and the injection signal path, i.e., see Sections 3.3.2 and 3.3.3, respectively.

3.3.2. Sub-Harmonic LO Signal Paths

As previously discussed, the Sub-harmonic LO Source Module (FIG. 6) produces three distinct sub-harmonic LO signals ($_LSubA$, $_LSubB$, and $_LSubC$). These sub-harmonic LO signals are used for harmonic up-conversion of the injected calibration signals, as-well-as harmonic down-conversion of the combined data and injection signals.

After exiting the Sub-harmonic LO Source Module, these subharmonic LO signals are routed to all of the channels in the Receiver and Calibration Source Module (see FIGS. 5 and 8). A generic Port-N Receiver and Calibration Source Module is shown in FIG. 10. The variable P in the signal names (e.g., $_LPSub_{N3}$) either represents the incident channel (P=I) or the data channel (P=D). This notation has been adopted in the Figures and throughout the text. In each module, an LO switch is used to select which of the three signals is to be used in each channel, i.e., $_LPSub_{N3}$ is either equal to $_LSubA$, $_LSubB$, or $_LSubC$. By selecting one of these three signals, which reside at three different frequencies in the ranges $1.9 \leq f_L{}^{SubA} \leq 10.0$ GHz and $1.9 \leq f_L{}^{SubB}, f_L{}^{SubC} \leq 10.2$ GHz, it is possible to make both standard network analyzer measurements, as well as measurements on non-linear, frequency-offsetting DUTs. However, at this time we will only consider standard network analyzer measurements where $_LPSub_{N3} = _LSubA$. This signal, when associated with data signal measurements, can be represented in the time domain as $$_LDSub_{N3}(t) = |A_L{}^{DSub_{N3}}|\cos(2\pi f_L{}^{SubA}t + \phi_L{}^{SubA} + \phi_L{}^{PDSub_{N3}}), \quad (14)$$

where we have employed the results in (4). In this expression, $A_L{}^{DSub_{N3}}$ represents the amplitude at this point and $\phi_L{}^{PDSub_{N3}}$ gives the phase shift associated with this path.

The selected signal (FIG. 10), $_LDSub_{N3}$, is passed through a pair of forward and reverse directional couplers. After passing through the directional couplers, the signal $_LDSub_{N2}$ is transmitted through a cable to the Port-N Microwave Probe (see FIG. 8). Since this signal may be at a high frequency, cable flexure and temperature drift can cause the characteristics (i.e., insertion loss and return loss) of this cable to change between measurements. These time-varying changes are accounted for in the analysis by assigning a time-varying scattering matrix (S-matrix), $[S^{DSub_N}]$, to this path. The signal that passes through the cable and is input into the Port-N Microwave Probe is represented by $_L\text{DSub}_{N1}$. The corresponding time-domain representation can be obtained by applying the signal flow graph in FIG. 12, where $\text{Path}_N={_L\text{DSub}_N}$, $b_S^{Path_N}={_L\text{DSub}_{N3}}$, and $b_L^{Pat_N}={_L\text{DSub}_{N1}}$. Employing (10) and (14), we find that $$_L DSUb_{N1}(t) = |A_L{^{DSub}_{N3}}T^{DSub_N}|\cos(2\pi f_L{^{SubA}}t + \phi_L{^{SubA}} + \phi_L{^{Sub}_{N3}} + \phi_T{^{DSub_n}}). \tag{15}$$

In the data channel of the Port-N Microwave Probe (FIG. 9), this signal passes through another directional coupler before being split into two signals. These two signals are used as the LO signals for a pair of sub-harmonic mixers. One sub-harmonic mixer is used to frequency up-convert the injection signal, while the other mixer is used to frequency down-convert the composite $\text{Path}_{N1}$ signal. As will be demonstrated later, the signals that are sampled by the directional couplers in the Port-N Receiver and Calibration Source Module, and the signal that is sampled by the directional coupler in the probe, are used to calibrate the time-varying errors in the sub-harmonic LO cable.

3.3.3. Injection Signal Paths

In order to calibrate the YIG filters and the variable gain amplifiers in the Microwave Probes, as well as the following receiver circuitry, we inject calibration signals, $_H\text{PInj}_{N1}$, into the receiver paths (FIG. 9). In this section we demonstrate how the injection signal is created for the data channel.

An injection signal source in the Port-N Receiver and Calibration-Source Module (FIG. 10) generates a small number of baseband tone signals $_S\text{DInj}_{N3}$, which reside within a 2 MHz bandwidth, $4 \text{ MHz} \leq f_S{^{DInj}_{N3i}} \leq 6 \text{ MHz}$. This signal then passes through a variable attenuator, which allows for adjustment of the signal amplitude over a wide dynamic range. For optimal phase-noise performance, this attenuator is adjusted to provide an injection signal, $_H\text{DInj}_{N1}$, amplitude in the Port-N probe (FIG. 9), which is roughly the same size as the desired data signal, $\text{Dat}_N$. The baseband signal, $_S\text{DInj}_{N3}$, is then up-converted to an IF signal, $_U\text{DInj}_{N3}$, by mixing with a 200 MHz LO source, i.e., the tones now reside at the frequencies $f_U{^{DInj}_{N3i}} = 200 \text{ MHz} \pm f_S{^{DInj}_{N3i}}$. The resultant signal is amplified before being passed through a band-pass filter that rejects the lower sideband while passing the upper sideband, thereby yielding, $$f_T{^{DInj}_{N3i}} = 200 \text{ MHz} + f_S{^{DInj}_{N3i}} \tag{16}$$

This composite signal at this stage will be represented in the time domain by $$_T DInj_{N3}(t) = \sum_{i=1}^{I} |A_T{_{DInj_{N3i}}}|\cos(2\pi f_T{_{DInj_{N3i}}}t + \phi_T{_{DInj_{N3i}}}), \tag{17}$$

where I indicates the number of tones that are being used for the injection signal.

The composite up-converted signal, $_T\text{DInj}_{N3}$, is transmitted through a directional coupler that provides a sample of the injection signal to the injection signal monitor circuitry. The injection signal monitor is designed to remove the time-varying sources of error in the injection signal circuitry. After passing through the directional coupler, the signal, $_T\text{DInj}_{N2}$, is transmitted through the cable to the Port-N Microwave Probe (FIGS. 8–10). Since this signal resides at a relatively low frequency, $f_T{^{DInj}_{N2i}} \sim 205$ MHz, errors due to cable flexure will be insignificant and can be ignored, i.e., $_T\text{DInj}_{N1} = {_T\text{DInj}_{N2}} \text{PDInj}_N$, where $\text{PDInj}_N$ denotes the static insertion loss and phase shift associated with this cable.

Up-conversion to a high microwave frequency is accomplished by mixing the IF signal $_T\text{DInj}_{N1}$ with the sub-harmonic LO signal $_L\text{DSub}_{N1}$ (15) to produce the injection signal $_H\text{DInj}_{N1}$ (FIG. 9). We employ the second and fourth-order mixer harmonics in this process, thereby yielding tones at the following frequencies $$f_H{^{DInj}_{N1i}} = Mf_L{^{SubA}} \pm (200 \text{ MHz} + f_S{^{DInj}_{N3i}}), \tag{18}$$

where M=2 or 4. The time-domain representation for the injected signal can be written as (see (15), (17) and (18))

$$_H DInj_{N1}(t) = |PDInj_N| \tag{19}$$

$$\sum_{i=1}^{I} |A_S{_{DInj_{N3i}}}|\cos[2\pi f_H{_{DInj_{N1i}}}t \pm \phi_{200} \pm \phi_S{_{DInj_{N3i}}} \pm \phi_{PDInj_N} +$$

$$M(\phi_L{^{SubA}} + \phi_L{^{PDSub_{N3}}} + \phi_T{^{DSub_N}})]$$

where $|PDInj_N|$ and $\phi_{PDInj_N}$ model the static insertion loss and phase shift associated with the data injection cable. After this signal is summed with the data signal (13) in the hybrid combiner, the combined signal passes through a variable gain amplifier and a YIG-tuned filter (FIG. 9). Following the procedure in section 3.3.1, we can write the composite signal as (i.e., combined data and injection signals)

$$_F \hat{D}at_{N1}(t) = \tag{20}$$

$$|T^{Dat_N}| \Bigg\{ \Big| A_{Tx_{N2}} T^{Tx_N} \tilde{S}_{NN}^M PDat_N \Big| \cos\Big(2\pi f_{TxU}t + M\phi_L{^{SubA}} + \phi_{200} +$$

$$\phi_{STxU} + \phi_{PTx_{N2}} + \phi_{TTx_N} + \phi_{\tilde{S}_{NN}^M} + \phi_{PDat_N} + \phi_{TDat_N}\Big) +$$

$$|PDInj_N| \sum_{i=1}^{I} |A_S{_{DInj_{N3i}}}|\cos[2\pi f_F{_{DInj_{N1i}}}t +$$

$$M(\phi_L{^{SubA}} + \phi_L{^{PDSub_{N3}}} + \phi_T{^{DSub_N}}) +$$

$$\phi_{200} + \phi_S{_{DInj_{N3i}}} + \phi_{PDInj_N} + \phi_T{_{Dat_N}}] \Bigg\}.$$

Here we have assumed that the YIG filter is tuned to the frequency $f_{TxU}$ and has a pass band of approximately 200 MHz. It therefore passes the upper-sideband of the injection signal (18)

$$f_F{^{DInj}_{N1i}} = Mf_L{^{SubA}} + 200 \text{ MHz} + f_S{^{DInj}_{N3i}} \tag{21}$$

while rejecting out-of-band harmonics, noise, and image responses. Note that the frequencies for the data signal and injection signals are relatively close together, e.g., see the expressions for $f_{TxU}$ and $f_F{^{DInj}_{N1i}}$ in equations (7) and (21). These equations show that the baseband injection signal source can be used to control the frequency offset between the up-converted data and injection signals. Also note that both signals experience the same time-varying amplitude and phase shifts as they pass through the common amplifier and YIG filter, i.e., $|T^{Dat_N}|$ and $\phi_T{^{Dat_N}}$.

In the preceding discussion, we have assumed that the injection-signal upconversion mixer operates with a ½ or ¼ LO frequency. A ½ or ¼ LO frequency is particularly convenient because mixers are available, which provide low conversion loss with these LO frequencies. It is also possible to use this scheme with much higher harmonics of the LO signal frequency. If a higher harmonic is used, the output amplitude of the injection-signal upconversion mixer will drop off dramatically at the higher harmonic numbers. Placing a prewhitening amplifier after the harmonic upconversion mixer can compensate for this amplitude loss. The gain of such an amplifier will increase at the higher frequencies to compensate for the loss of signal amplitude at the higher harmonics.

We also note on FIG. 9 that buffer amplifiers have been placed between the up-conversion mixer and the hybrid combiner and between the data input and this same hybrid combiner. These amplifiers provide isolation, which prevents data signals from getting into the injection-signal upconversion mixer and injection signals from getting into the DUT. In some situations, where maximum stability is needed, and where isolation is not a problem, these buffer amplifiers may be deleted. It is also possible to use other types of isolating devices in place of these amplifiers, such as ferrite isolators.

3.3.4. Data Receiver Path

The circuit required for standard network analyzer measurements on linear DUTs is simpler than that required for the analysis of non-linear, frequency-offsetting DUTs. Only standard network analyzer measurements will be discussed in this subsection. The composite microwave signal (20) is first frequency down-converted to IF using a sub-harmonic mixer (FIG. 9). A time-domain representation for the sub-harmonic LO is signal is given in (5). After amplification, a band-pass filter is used to pass the lower sideband while rejecting the upper sideband. The resulting composite IF signal can be represented as (see (7), (15), and (21))

$$_R\hat{D}at_{N1}(t) = \qquad (22)$$

$$|T^{Dat_N}|\left\{\left|A_{Tx_{N2}}T^{Tx_N}\tilde{S}_{NN}^M PDat_N\right|\cos\left[2\pi(200\text{ MHz} + f_{S^{Tx}U})t - \right.\right.$$

$$M(\phi_{LPDSub_{N3}} + \phi_{TDSub_N}) + \phi_{200} + \phi_{S^{Tx}U} +$$

$$\phi_{PT_{xN2}} + \phi_{T^{Tx}N} + \phi_{\tilde{S}_{NN}^M} + \phi_{PDat_N} + \phi_{TDat_N}\right] +$$

$$|PDInj_N|\sum_{i=1}^{I}|A_{SDInj_{N3i}}|\cos[2\pi(200\text{ MHz} + f_{SDInj_{Nli}})t +$$

$$\left.\phi_{200} + \phi_{SDInj_{N3i}} + \phi_{PDInj_N} + \phi_{TDat_N}]\right\}.$$

Since both the data and injection signal flow through the same receiver circuitry, any additional amplitude and phase changes associated with the components in the receiver path are lumped together in the terms $|T^{Dat_N}|$ and $\phi_T^{Dat_N}$, respectively. Note that in addition to down-converting the frequency to IF, the mixing process has also removed the phase associated with the high frequency source, i.e., $M\phi_{L^{SubA}}$. This demonstrates that phase-noise errors and source-drift errors can be suppressed by using the same high-frequency signals for both frequency up-conversion of the transmitter and injection signals, as well as for the frequency down-conversion to IF.

In order to avoid signal crosstalk between the various channels, the IF signal, $_RDat_{N1}$, is frequency offset by mixing it with a low-frequency LO signal $_LDOff_{N1}$ ($f_{L^{DOff}N1} = f_{S^{DOff}N3}\sim 4$ MHz). This LO signal is generated by a DAC chip in the Port-N Receiver and Calibration Source Module (FIG. 10). A frequency of 4 MHz (which is larger than the bandwidth of the narrow-band filter that precedes it) was chosen to avoid image frequencies. The offset data signal that exits the probe resides at the frequencies $$f_O{}^{Dat_{N1}} = 200\text{ MHz} + f_S{}^{Tx}U \pm f_S{}^{DOff}_{N3}. \qquad (23)$$

If each channel employs a different offset frequency, $f_S{}^{POff}_{N3}$, then signal crosstalk between the channels is avoided.

As shown in FIG. 8, the composite signal $_ODat_{N1}$ is transmitted via a cable from the Port-N Microwave Probe (FIG. 9) to the Receiver and Calibration Source Module (FIG. 10). Since the signal frequency is relatively low (23), the time-varying errors associated with this cable are insignificant and can be ignored in the analysis.

After reaching the Receiver and Calibration Source Module (FIG. 10), the signal $_ODat_{N2}$ passes through a gain-ranging amplifier. It should be noted that the uncertainty associated with the gain-ranging amplifier, as well as all of the receiver circuitry (i.e., the terms $|T^{Dat_N}|$ and $\phi_{T^{Dat_N}}$), is removed by the signal normalization procedure that is discussed later. The amplified signal is then band-pass filtered, before being mixed with 200 MHz LO signal. After amplification and low-pass filtering, the time-domain, baseband signal can be represented as $$_A\hat{D}at_{N3}(t) = \qquad (24)$$

$$|T^{Dat_N}|\left\{\left|A_{Tx_{N2}}T^{Tx_N}\tilde{S}_{NN}^M PDat_N\right|\cos\left[2\pi(f_{S^{Tx}U} - f_{SDOff_{N3}})t - \right.\right.$$

$$M(\phi_{LPDSub_{N3}} + \phi_{TDSub_N}) + \phi_{S^{Tx}U} + \phi_{PT_{xN2}} +$$

$$\phi_{T^{Tx}N} + \phi_{\tilde{S}_{NN}^M} + \phi_{PDat_N} + \phi_{TDat_N} - \phi_{LDOff_{N1}}\right] +$$

$$|PDInj_N|\sum_{i=1}^{I}|A_{SDInj_{N3i}}|\cos[2\pi(f_{SDInj_{Nli}} - f_{SDOff_{N3}})t +$$

$$\left.\phi_{SDInj_{N3i}} + \phi_{PDInj_N} + \phi_{TDat_N} - \phi_{LDOff_{N1}}]\right\}.$$

Note that any time-varying drift errors or phase-noise errors associated with the 200 MHz synthesizer are removed since the phase term $\phi_{200}$ dropped out of the equation.

The composite signal $_A\hat{D}at_{N3}$ resides within the frequency range 0 Hz and 2 MHz. This analog signal is sampled in the time domain by an Analog to Digital Converter (ADC). The resulting digitized signal, $_D\hat{D}at_{N3}$, is then processed using a Fast Fourier Transform (FFT) in a Digital Signal Processing (DSP) chip and the desired frequency-domain results are sent over the data bus to the computer (FIG. 5). Once the signal has been transformed to the frequency domain, then the data signal and injection signal tones can be extracted from the appropriate frequency bins. The ratio of these signals is then used to suppress many of the time-varying system errors.

The frequency-domain data signal, which is extracted from the frequency bin $$f_D{}^{Dat_{N3}} = f_S{}^{Tx}U - Fx_S{}^{DOff}_{N3}, \qquad (25)$$

can be written as $$_DDat_{N3} = {_D\hat{D}at_{N3}}(f_D{}^{Dat_{N3}}) = \tilde{S}_{NN}^M|A_{Tx_{N2}}|T^{Dat_N}T^{Tx_N}PDat_N\exp \qquad (26)$$

$$\{j[-M(\phi_{LPDSub_{N3}} + \phi_{TDSub_N}) + \phi_{S^{Tx}U} + \phi_{PT_{xN2}} - \phi_{LDOff_{N1}}]\},$$

where $\tilde{S}_{NN}{}^M = |\tilde{S}_{NN}{}^M|\exp(j\phi_{\tilde{S}NN}{}^M)$, etc. Likewise, the i=1, ..., I injection tone signals can be extracted from frequency bins $$f_D{}^{DInj}_{N3i} = f_S{}^{DInj}_{Nli} - f_S{}^{DOff}_{N3} \qquad (27)$$

and represented in the frequency domain as $$_DDInj_{N3i} = {_D\hat{D}at_{N3}}(f_D{}^{DInj}_{N3i}) = A_S{}^{DInj}_{N3i}T^{Dat_N}PDInj_N$$
$$\exp\{-j\phi_{LDOff_{N1}}\}. \qquad (28)$$

3.3.5. Injection Signal Monitor Circuitry

In this section we carry out the analysis for the injection signal monitor circuitry associated with the Port-N data signal channel. As discussed in Section 3.3.4, the directional coupler on the injection signal line (FIG. 10) provides a sample, $_C DInj_{N3}$, of the up-converted, IF injection signal $_T DInj_{N3}$. The frequency of the sampled signal $_C DInj_{N3}$ is given in (16). This sampled signal is first split into two equal amplitude signals, and each of these signals is combined with a 205 MHz signal that has. also been split into two signals. The 205 MHz signals are injected in order to calibrate the following receiver circuitry. One of the two 205 MHz signals is attenuated (by about 30 dB) in order to provide a low-level injection signal. By using high-level and low-level signals in the two injection monitor receiver channels, we can improve the dynamic range for the measurement of the injection signal $_C DInj_{N3}$. After combining the high-level and low-level 205 MHz signals together with $_C DInj_{N3}$ in two separate receiver channels, the composite signals are passed through gain-ranging amplifiers and filters. Time-domain representations for these composite signals are given below $$_I \hat{D}InjH_{N3}(t) = |A_{205}|\cos[2\pi(205 \text{ MHz})\, t + \phi_{205}] + \qquad (29)$$

$$\sum_{i=1}^{I} |A_{SDInj_{N3i}}|\cos[2\pi(200 \text{ MHz} + f_{SDInj_{N3i}})\, t + \phi_{200} + \phi_{SDInj_{N3i}}]$$

$$_I \hat{D}InjL_{N3}(t) = |A_{205}T^{30dB}|\cos[2\pi(205 \text{ MHz})\, t + \phi_{205} + \phi_{30dB}] + \qquad (30)$$

$$\sum_{i=1}^{I} |A_{SDInj_{N3i}}|\cos[2\pi(200 \text{ MHz} + f_{SDInj_{N3i}})\, t + \phi_{200} + \phi_{SDInj_{N3i}}].$$

In the above equations, $|A_{205}|$ and $\phi_{205}$ represent the amplitude and phase of the 205 MHz signal. Likewise, the terms $|T^{30\,dB}|$ and $\phi_{30\,dB}$ represent the insertion and loss phase shift associated with the attenuator in the low-level monitor leg.

Next the signals in (29) and (30) are frequency down converted to baseband by mixing with a 200 MHz LO. The signals are once again amplified and filtered before being mixed with a 4 MHz LO. After low-pass filtering, the following time-domain signals are created:

$$_A \hat{D}InjH_{N3}(t) = |T^{DInjH}| \qquad (31)$$

$$\Bigg\{ |A_{205}|\cos[2\pi(1 \text{ MHz})\, t + \phi_{TDInjH} + \phi_{205} - \phi_{200} - \phi_4] +$$

$$\sum_{i=1}^{I} |A_{SDInj_{N3i}}|\cos[2\pi(f_{SDInj_{N3i}} - 4 \text{ MHz})\, t +$$

$$\phi_{TDInjH} + \phi_{SDInj_{N3i}} - \phi_4]\Bigg\}$$

$$_A \hat{D}InjL_{N3}(t) = |T^{DInjL}| \Bigg\{ |A_{205}T^{30dB}|\cos[2\pi(1 \text{ MHz})\, t + \phi_{TDInjL} + \qquad (32)$$

$$\phi_{205} + \phi_{30dB} + \phi_{200} - \phi_4] +$$

$$\sum_{i=1}^{I} |A_{SDInj_{N3i}}|\cos[2\pi(f_{SDInj_{N3i}} -$$

$$4 \text{ MHz})\, t + \phi_{TDInjL} + \phi_{SDInj_{N3i}} - \phi_4]\Bigg\},$$

where $|T^{DInjH}|$, $|T^{DInjL}|$, $\phi_{TDInjH}$, and $\phi_{TDInjL}$ represent the insertion losses and phase shifts for the high and low injection monitor channels.

Measurement of $_A \hat{D}InjL_{N3}$ and $_A \hat{D}InjH_{N3}$ will provide information about the calibration signals that are being injected into the port-N calibration probe. After the ADC samples these analog signals, a FFT is used to transform the signals to the frequency domain. After being transformed into the frequency domain, the desired injection tones are extracted from the proper frequency bins, i.e., $$f_{DDnj_{N3i}} = f_{SDInj_{N3i}} - 4 \text{ MHz}. \qquad (33)$$

The corresponding frequency-domain signals for the high and low channels can be written as $$_D DInjH_{N3i} = _D \hat{D}InjH_{N3}(f_D{}^{DInj}{}_{N3}) = A_S{}^{DInj}{}_{n3i} T^{DInjH} \exp[-j\phi_4] \qquad (34)$$

$$_D DInjL_{N3i} = _D \hat{D}InjL_{N3}(f_D{}^{DInj}{}_{N3i}) = A_S{}^{DInj}{}_{N3i} T^{DInjL} \exp[-j\phi_4], \qquad (35)$$

Likewise, the common 205 MHz signals, which have been frequency down converted to 1 MHz, can be written as $$_D DComH_{N3} = _D \hat{D}InjH_{N3}(1 \text{ MHz}) = A_{205} T^{DInjH} \exp[-j(\phi_{200} + \phi_4)] \qquad (36)$$

$$_D DComL_{N3} = _D \hat{D}InjL_{N3}(1 \text{ MHz}) = A_{205} T^{DInjL} T^{30\,dB}$$
$$\exp[-j(\phi_{200} + \phi_4)] \qquad (37)$$

The injection signals in (34) and (35), and the common signals in (36) and (37) are employed for signal normalization, as shown in the next subsection.

3.3.6. Normalization by the Injection Signals

In this subsection, we demonstrate how the injection signals can be employed for normalization. As previously discussed, both high- and low-level injection monitor signals are provided to preserve a high dynamic range. The two separate receivers are required because the 205 MHz signal has a fixed amplitude, but the level of the injection signal is varied so that its amplitude is approximately the same size as the measured data signal. Thus, the high- (34) and low-level (35) monitor signals are employed in the normalization of high- and low-level data signals, respectively. Here we will assume a high-level data signal. The normalization procedure for a low-level data signal is analogous.

The injection normalization procedure is a three-step process. First, each of the I monitor signals (34) are normalized by the common signal (36), i.e., $$\frac{_D DInjH_{N3i}}{_D DComH_{N3}} = \frac{A_{SDInj_{N3i}}}{A_{205}} \exp[j\phi_{200}] \qquad (38)$$

Note that this normalization has removed the time-varying characteristics of the high-level monitor receiver circuitry (i.e., $T^{DInjH}$) as well as the phase of the 4 MHz synthesizer, i.e., $\phi_4$.

Next, the injection signals (28) are normalized by (38), i.e., $$\frac{_D DInj_{N3i\,D} DComH_{N3}}{_D DInjH_{N3i}} = \frac{T^{Dat_N} PDInj_N A_{205}}{\exp[j(\phi_{LDoff_{NI}} + \phi_{200})]}. \qquad (39)$$

This procedure removes the time-varying amplitudes and phases of the injection signals, i.e., $A_S{}^{DInj}{}_{N3i}$.

By applying an interpolation scheme (e.g., linear, quadratic, splines) to the various tones represented by (39), we can obtain a normalization signal that is defined at the same frequency (25) as the desired data signal. This normalization injection signal will have the form $$_D DNInj_{N3} = \tag{40}$$

$$Interp\left(\frac{_D DNInj_{N3i} \, _D DComH_{N3}}{_D DInjH_{N3i}}\right) = \frac{T^{Dat_N} PDInj_N A_{205}}{\exp[j(\phi_{L DOff_{N1}} + \phi_{200})]},$$

where Interp( ) denotes that we are interpolating the I injection signals. This interpolated normalization signal is now used to normalize the data signal (26), i.e., $$\frac{_D Dat_{N3}}{_D DNInj_{N3}} = \tag{41}$$

$$\frac{|A_{Tx_{N2}}|T^{Tx_N} \tilde{S}^M_{NN} PDat_N}{A_{205} PDInj_N} \frac{\exp\{j[\phi_{s\,TxU} + \phi_{PTx_{N2}} + \phi_{200}]\}}{\exp\{j[M(\phi_{L PDSub_{N3}} + \phi_{T DSub_N})]\}}.$$

Note that this normalization removes the time dependant errors associated with $T^{Dat_N}$ and $\phi_L^{DOff}{}_{N1}$.

3.3.7. Calibration Circuitry for the Sub-harmonic LO Cable

As discussed in Section 3.3.2, the high-frequency, sub-harmonic LO signals may be affected by time-varying errors (i.e., [$S^{DSub_N}$] in FIG. 8) caused by changes in the return loss and insertion loss of the cable that connects the Port-N Microwave Probe to the Receiver and Calibration Source Module. The effects of such errors are included in the phase term $\phi_T{}^{Sub}{}_N$ in (5). In this subsection, we carry out an analysis on the Port-N data channel circuitry that is used to suppress these time-varying effects, thereby allowing for accurate transmission measurements.

Reference to FIG. 10 shows that a forward directional coupler is used to sample the sub-harmonic Lo signal $_L DSub_{N3}$. The sampled signal, $_C DSub_{N3}$, resides at the frequency (see (3))

$$f_C{}^{DSub}{}_{N3} = f_L{}^{SubA}. \tag{42}$$

This signal is then attenuated to an amplitude that is approximately equal to the amplitude of the signal that it is summed with, i.e., $_O DCir_{N3}$.

After passing through the attenuator, the signal $_C DSub_{N3}$ is frequency offset by mixing with a low-frequency (~4 MHz) LO signal, $_L DSmp_{N3}$, thereby yielding $$f_O{}^{DSub}{}_{N3} = f_L{}^{SubA} \pm f_L{}^{Smp}{}_{N3}. \tag{43}$$

The time-domain representation for this frequency offset signal can be written as (14)

$$_O DSub_{N3}(t) = \tag{44}$$

$$|A_{L DSub_{N3}} T^{O DSub_{N3}}| \cos[2\pi(f_{L SubA} \pm f_{L DSmp_{N3}})t + \phi_{L SubA} +$$

$$\phi_{L DSmp_{N3}} + \phi_{L PDSub_{N3}} + \phi_{TO DSub_{N3}}],$$

where $|T^{O DSub}{}_{N3}|$ and $\phi_T{}^{O DSub}{}_{N3}$ model the insertion loss and phase shift associated with this path.

The offset signal in (44) is summed together with a second signal $_O DCir_{N3}$ that is derived from the sub-harmonic LO signal $_L DSub_{N1}$ in the Port-N Probe (FIG. 9). After entering the Port-N Probe (FIG. 9), the signal $_L DSub_{N1}$, which resides at the frequency in (42), is sampled by the directional coupler. This sampled signal is mixed with a low-frequency (4 MHz) LO signal $_L DCir_{N1}$, thereby producing frequency-offset signals $_O DCir_{N1}$ that reside at the frequencies $$f_O{}^{DCir}{}_{N1} = f_L{}^{SubA} \pm f_L{}^{PCir}{}_{N1}. \tag{45}$$

These frequency offset signals then pass back through the directional coupler, out of the Port-N Probe, back through the sub-harmonic LO cable, and into the Port-N Channel Receiver and Calibration Source Module. Note that the sub-harmonic LO cable must be reciprocal for this technique to be employed, e.g., there cannot be amplifiers placed along the sub-harmonic LO cable path. Once the circularly-mixed signal reaches the Port-N receiver, it is sampled by the reverse directional coupler to produce the signal $_O DCir_{N3}$, which resides at the frequencies listed in (45). This sampled signal is then summed with the previously discussed signal, $_O DSub_{N3}$ (44), before being passed through an amplifier. The resultant time-domain signal can be written as $$_R \hat{D}Sub_{N3}(t) = \tag{46}$$

$$|A_{L DSub_{N3}} T^{R DSub_{N3}}| \{|T^{O DSub_{N3}}| \cos[2\pi(f_{L SubA} \pm f_{S DSmp_{N3}})t + \phi_{L SubA} +$$

$$\phi_{L DSmp_{N3}} + \phi_{L PDSub_{N3}} + \phi_{TO DSub_{N3}} + \phi_{TR DSub_{N3}}] +$$

$$|T^{DSub_N}|^2 |T^{O DSub_{N1}}| \cos[2\pi(f_{L SubA} \pm f_{S DCir_{N3}})t + \phi_{L SubA} +$$

$$\phi_{L DCir_{N1}} + \phi_{L PDSub_{N3}} + 2\phi_{T DSub_N} + \phi_{TO DSub_{N1}} +$$

$$\phi_{TR DSub_{N3}}]\}$$

In this representation, the terms $|T^{R DSub}{}_{N3}|$ and $\phi_T{}_R DSub_{N3}$ represent the amplitude and phase shifts associated with the amplifier in the receiver path.

The composite signal is then frequency down-converted to IF by mixing with the LO signal $_L DSwp_{N3}$, which exists at the frequency $f_{Swp}$. The down-converted signal is then amplified and filtered to produce the signal $$_I \hat{D}Sub_{N3}(t) = |A_{L DSub_{N3}} T^{R DSub_{N3}}| \tag{47}$$

$$\{|T^{O DSub_{N3}}| \cos[2\pi(400 \text{ MHz} + f_{S Sub} - f_{S DSmp_{N3}})t + 2\phi_{200} +$$

$$\phi_{S Sub} + \phi_{PSubA} + \phi_{L DSmp_{N3}} + \phi_{L PDSub_{N3}} + \theta_{TO DSub_{N3}}] +$$

$$|T^{DSub_N}|^2 |T^{O DSub_{N1}}| \cos[2\pi(400 \text{ MHz} + f_{S Sub} - f_{S DCir_{N3}})t +$$

$$2\phi_{200} + \phi_{S Sub} + \phi_{PSubA} + \phi_{L DCir_{N1}} + \phi_{L PDSub_{N3}} +$$

$$2\phi_{T DSub_N} + \phi_{TO DSub_{N1}} + \phi_{TR DSub_{N3}}]\}$$

where we have employed (3) and (5), and the phase associated with the high-frequency synthesizer (i.e., $\phi_L{}^{Swp}$) has been removed. This will reduce the system phase noise. In the above expression, the additional amplitude and phase shifts associated with this portion of the path are incorporated into the terms $|T^{R DSub}{}_{N3}|$ and $\phi_T{}^{R DSub}{}_{N3}$.

The final stage of frequency down-conversion is achieved by mixing with a 400 MHz LO signal. If the 400 MHz signal is created by using a frequency doubling of the 200 MHz signal, then the phase term $2\phi_{200}$ is also removed from (47).

After amplification and low-pass filtering, the base-band signal can be written as $$_A\hat{D}Sub_{N3}(t) = |A_{LDSub_{N3}} T^{RDSub_{N3}}| \qquad (48)$$
$$\{|T^{ODSub_{N3}}|\cos[2\pi(f_{SSub} - f_{SDSmp_{N3}})t + \phi_{SSub} + \phi_{PSubA} +$$
$$\phi_{LDSmp_{N3}} + \phi_{LPDSub_{N3}} + \phi_{TODSub_{N3}} + \phi_{TRDSub_{N3}}] +$$
$$|T^{DSub_N}|^2 |T^{ODSub_{N1}}|\cos[2\pi(f_{SSub} - f_{SDCir_{N3}})t +$$
$$\phi_{SSub} + \phi_{PSubA} + \phi_{LDCir_{N1}} + \phi_{LPDSub_{N3}} +$$
$$2\phi_{TDSub_N} + \phi_{TODSub_{N1}} + \phi_{TRDSub_{N3}}]\}.$$

Once again, we have incorporated the additional amplitude and phase shifts for this portion of the receiver path into the terms $|T^{R^{DSub}_{N3}}|$ and $\phi_{T^{RDSub}_{N3}}$.

Since the two signals in (48) reside at different frequencies, they can be detected using the same receiver. After the composite signal in (48) is sampled by an ADC, an FFT is employed to convert the signal to the frequency domain. This allows the offset sub-harmonic signal, $$_DDSub_{N3} = _D\hat{D}Sub_{N3}(f_{SSub} - f_{SDSmp_{N3}}) = \qquad (49)$$
$$|A_{LDSub_{N3}}|T^{RDSub_{N3}} T^{ODSub_{N3}} \exp[j(\phi_{SSub} + \phi_{PSubA} + \phi_{LDSmp_{N3}} + \phi_{LDSub_{N3}})],$$

and the circularly mixed signal, $$_DDCir_{N3} = _D\hat{D}Sub_{N3}(f_{SSub} - f_{SDSmp_{N3}}) = \qquad (50)$$
$$|A_{LDSub_{N3}}|T^{RDSub_{N3}} T^{ODSub_{N1}} (T^{DSub_N})^2 \exp[j(\phi_{SSub} + \phi_{PSubA} + \phi_{LDCir_{N1}} + \phi_{LDSub_{N3}})],$$

to be extracted from the appropriate frequency bins. Now, if we normalize (50) by (49), we obtain $$\frac{_DDCir_{N3}}{_DDSub_{N3}} = (T^{DSub_N})^2 \frac{T^{ODSub_{N1}}}{T^{ODSub_{N3}}} \frac{\exp[j\phi_{LDCir_{N1}}]}{\exp[j\phi_{LDSmp_{N3}}]}, \qquad (51)$$

where the following time-varying terms have been removed via the normalization: $|A_L^{DSub}_{N3}|$, $T^{R^{Sub}_{N3}}$, $\phi_L^{DSub}_{N3}$, $\phi_S^{Sub}$, and $\phi_{PSubA}$. The time-varying characteristics of the sub-harmonic LO cable can now be extracted from (51) using the following equation:

$$T^{DSub_N} = \sqrt{\frac{_DDCir_{N3}}{_DDSub_{N3}} \frac{T^{ODSub_{N3}}}{T^{ODSub_{N1}}} \frac{\exp[j\phi_{LDSmp_{N3}}]}{\exp[j\phi_{LDCir_{N1}}]}}. \qquad (52)$$

In this equation, $_DDCir_{N3}$ represents the measured circularly mixed signal that passes through the Port-N data sub-harmonic LO cable in both the forward and reverse directions, and $_DDStib_{N3}$ represents the sampled sub-harmonic LO signal. Furthermore, $T^{O^{Sub}_{N3}}$ and $T^{O^{Sub}_{N1}}$ represent the static transmission parameters associated with the circular mixer circuitry (FIG. 9) and the offset mixer circuitry in the sub-harmonic LO monitor (FIG. 10), respectively. Finally, the terms $\phi_L^{DCir}_{N1}$ and $\phi_L^{DSmp}_{N3}$ denote the known phases of the circular mixer LO and the offset mixer LO. These phase are known because the LO signals are produced by relatively low frequency, clocked DDS chips.

3.4. Normalization of the Data Signal by the Incident Signal

Now that we have obtained representations for the normalized data signal (41) and the transmission coefficient for the sub-harmonic LO cable, we extend these results to the incident signal so that the various scattering parameters can be calculated. First we investigate the case for reflection measurements, and then we demonstrate how transmission measurements can be carried out.

3.4.1. Reflection Measurement

Now that we have completed the analysis for the circuitry in the data signal paths for standard network measurements, we extend those results to the incident signal paths. For reflection measurements, we employ the Port-N incident channel along with the Port-N data channel. In order to find the normalized incident signal, we follow a similar procedure as was used to obtain (41), thus obtaining $$\frac{_DInc_{N3}}{_DINinj_{N3}} = \frac{|A_{Tx_{N2}}|T^{Tx_N} PInc_N}{A_{205} PIInj_N} \frac{\exp\{j[\phi_{STxU} + \phi_{PTx_{N2}} + \phi_{200}]\}}{\exp\{j[M(\phi_{LPISub_{N3}} + \phi_{TISub_N})]\}}. \qquad (53)$$

In the above equation, $$_DINinj_{N3} = Interp\left(\frac{_DIInj_{N3i\,D}IComH_{N3}}{_DIInjH_{N3i}}\right) = \frac{T^{Inc_N} PIInj_N A_{205}}{\exp[j(\phi_{LIOff_{N1}} + \phi_{200})]} \qquad (54)$$

represents the interpolated normalization signal for the incident signal channel, e.g., (40). The time-varying transmission coefficient associated with the incident sub-harmonic LO cable can then be measured using (52)

$$T^{ISub_N} = \sqrt{\frac{_DICir_{N3}}{_DISub_{N3}} \frac{T^{OISub_{N3}}}{T^{OISub_{N1}}} \frac{\exp[j\phi_{LISmp_{N3}}]}{\exp[j\phi_{LICir_{N1}}]}}. \qquad (55)$$

Finally, in order to suppress the other time-varying system errors, we normalize (41) by (53), yielding $$\left(\frac{_DDat_{N3}}{_DDNInj_{N3}}\right)_D \frac{INInj_{N3}}{_DInc_{N3}} = \qquad (56)$$
$$\tilde{S}_{NN}^M \frac{PDat_N PIInj_N}{PInc_N PDInj_N} \exp\frac{\{jM(\phi_{LPISub_{N3}} + \phi_{TISub_N})\}}{\exp\{jM(\phi_{LPDSub_{N3}} + \phi_{TDSub_N})\}},$$

where this normalization has suppressed the following time-varying error terms: $|A_{Tx_{N2}}|$, $T^{Tx_N}$, $A_{205}$, $\phi_{S^{TxU}}$, $\phi_{PTx_{N2}}$, and $\phi_{200}$.

Rearrangement of (56) yields an equation that can be employed to accurately compute the reflection coefficient associated with Port-N of the DUT, i.e., $$\tilde{S}_{NN}^{M} \frac{PDat_N PIInj_N}{PInc_N PDInj_N} \exp \frac{\{jM\phi_{LPISub_{N3}}\}}{\exp\{jM\phi_{LPDSub_{N3}}\}} = \qquad (57)$$

$$\frac{{}_DDat_{N3}}{{}_DDNInj_{N3}} \frac{{}_DINInj_{N3}}{{}_DInc_{N3}} \frac{\exp\{jM\phi_{TDSub_N}\}}{\exp\{jM\phi_{TISub_N}\}}.$$

In the above equation, the terms on the right-hand-side are the measured values. For example, $_DDat_{N3}$ and $_DInc_{N3}$ denote the measured data and incident signals. The terms $_DDNInj_{N3}$ and $_DINInj_{N3}$ are the interpolated normalization signals for the data (40) and incident (54) signal channels, respectively. Finally, $\phi_{T^{DSub}_N}$ and $\phi_{T^{DSub}_N}$ represent the time-varying phase shifts associated with the sub-harmonic LO cables for the Port-N data and incident channels. These phase terms are measured using (52) and (55).

With the exception of the desired scattering parameter $\tilde{S}_{NN}^{M}$, the terms on the left-hand-side of (57) are all static and can therefore be removed via a static calibration procedure such as the Short-Open-Load-Thru (SOLT) technique (HP App. Note #221A and Ballo, 1998). For example, the terms $PDat_N$ and $PInc_N$ account for the insertion loss through the data and incident paths within the probe (13). Furthermore, the terms $PDInj_N$ and $PIInj_N$ denote the static transmission coefficients for the low-frequency data and incident injection cables, respectively. Finally, $\phi_{T^{DSub}_N}$ and $\phi_{T^{ISub}_N}$ represent the static phase shifts associated with the sub-harmonic LO signal paths between the Sub-harmonic LO Source Module and the Port-N data and incident sub-harmonic LO connections in the Receiver and Calibration Source Module.

3.4.2. Transmission Measurements

In this subsection, we now investigate dynamic signal normalization for standard-network-analyzer transmission measurements. Here we will assume that we would like to measure the transmission coefficient $\tilde{S}_{N\Omega}^{M}$, where $\Omega$ denotes the incident port and N signifies the data port. In order to analyze this transmission, we can simply modify the results in subsection 3.4.2 so that the incident signal is associated with Port-$\Omega$ instead of Port-N. For this case, we find that (57) can be rewritten as $$\tilde{S}_{N\Omega}^{M} \frac{PDat_N PIInj_\Omega}{PInc_\Omega PDInj_N} \frac{\exp\{jM\phi_{LPISub_{\Omega3}}\}}{\exp\{jM\phi_{LPDSub_{N3}}\}} = \qquad (58)$$

$$\frac{{}_DDat_{N3}}{{}_DDNInj_{N3}} \frac{{}_DINInj_{\Omega3}}{{}_DInc_{\Omega3}} \frac{\exp\{jM\phi_{TDSub_N}\}}{\exp\{jM\phi_{TISub_\Omega}\}}.$$

The time-varying transmission coefficient associated with the incident sub-harmonic LO cable can then be measured using (55)

$$T^{ISub_\Omega} = \sqrt{\frac{{}_DICir_{\Omega3}}{{}_DISub_{\Omega3}} \frac{T_O^{ISub_{\Omega3}}}{T_O^{ISub_{\Omega1}}} \frac{\exp[j\phi_{LISmp_{\Omega3}}]}{\exp[j\phi_{LICir_{\Omega1}}]}}. \qquad (59)$$

As was the case with reflection measurements, the ART-TEST dynamic signal normalization allows for the suppression of all time-varying system errors for transmission measurements.

4. Interference Cancellation

Interference signals could cause serious problems when using injected signals to calibrate receiver channels. If the desired measurement signal (i.e., data or incident) is contaminated by an interference signal at one of the corresponding injection frequencies, then this unwanted interference will degrade the accuracy of the injection signal, and the resulting S-parameter measurements. Fortunately, the ART-TEST Technique has a provision for the removal of such interference.

We will use transmission measurements to demonstrate the ARTTEST interference cancellation technique. For simplicity, we will assume that there is a clean CW signal (i.e., a single tone) incident on the DUT from port-$\Omega$ (12), $$Tx_\Omega(t) = |A_{Tx\Omega2}T^{Tx\Omega}|\cos(2\pi f_{TxU}t + M\phi_{LSubA} + \phi_{200} + \phi_S^{TxU} + \phi_{PTx\Omega2} + \phi_{T^{Tx\Omega}}). \qquad (60)$$

We then assume that the signal at the output of the DUT (i.e., port-N) contains interference (e.g., intermods) in addition to the desired data signal, which resides at the transmitter frequency. To simplify the analysis, we will assume that only three intermods are produced by the DUT, however, this technique can also be extended to the case when multiple interfering signals are present. Furthermore, we will assume that only one tone signal is being used for both the data and incident injection signals, i.e., I=1 in (16) and (17). We therefore drop the subscript i in future equations associated with the injection signals. If we assume that one of the intermods lies at the data injection frequency $f_{F^{DInj}_{N1}}$ (21), then this signal will cause contamination or interference with the data injection signal. Likewise, if another intermod resides at the incident injection frequency $f_{F^{IInj}_{N1}}$, then this signal will cause contamination or interference with the incident injection signal. The third interference signal will be assumed to lie at a different frequency, $f_{F^{Ref}_{N1}}$, that is in the vicinity of the data frequency (7), the data injection frequency (18), and the incident injection frequency. Under these assumptions, the time-domain signal at the output of the DUT can be written as $$Dat_N(t) = |A_{Tx\Omega2}T^{Tx\Omega}\tilde{S}_{N\Omega}^{M}|\cos(2\pi f_{TxU}t + M\phi_{LSubA} + \qquad (61)$$

$$\phi_{200} + \phi_{STxU} + \phi_{PTx\Omega2} + \phi_{T^{Tx\Omega}} + \phi_{S_{M\Omega}}^{M}) +$$

$$|\eta_{DInj_N}|\cos(2\pi f_{FDInj_{NI}}t + \phi_{\eta DInj_N}) + |\eta_{IInj_N}|\cos$$

$$(2\pi f_{FIInj_{NI}}t + \phi_{\eta IInj_N}) + |\eta_{Ref_N}|\cos(2\pi f_{FRef_{NI}}t + \phi_{\eta Ref_N}).$$

In the above expression, the terms $|\eta_{DInj_N}|$ and $|\eta_{IInj_N}|$ represent the amplitudes of the interference signals that corrupt the data-injection and incident-injection signals, respectively. Likewise, the terms $\phi_{\eta DInj_N}$ and $\phi_{\eta IInj_N}$ represent the phases for these signals. The amplitude and phase of the third interference signal is labeled as $|\eta_{Ref_N}|$ and $\phi_{\eta Ref_N}$.

The data directional coupler in the port-N probe samples a portion of the transmitted signal (61. Following the procedure used to derive (20), the time-domain composite at the output of the YIG filter can be rewritten as $$_F\hat{D}at_{NI}(t) = |T^{Dat_N}|\{|A_{Tx\Omega2}T^{Tx\Omega}\tilde{S}_{N\Omega}^{M}PDat_N|\cos(2\pi f_{TxU}t + \qquad (62)$$

$$M\phi_{LSubA} + \phi_{200} + \phi_{STxU} + \phi_{PTx\Omega2} + \phi_{T^{Tx\Omega}} + \phi_{S_{M\Omega}}^{M} +$$

$$\phi_{PDat_N} + \phi_{TDat_N}) + |PDInj_N A_{SDinj_{N3}}|\cos[2\pi f_{FDInj_{NI}}t +$$

$$M(\phi_{LSubA} + \phi_{LPDSub_{N3}} + \phi_{TDSub_N}) + \phi_{200} + \phi_{SDinj_{N3}} +$$

$$\phi_{PDInj_N} + \phi_{TDat_N}] + |PDat_N|[|\eta_{DInj_N}|\cos(2\pi f_{FDInj_N}t +$$

$$\phi_{\eta DInj_N} + \phi_{PDat_N} + \phi_{TDat_N}) + |\eta_{IInj_N}|\cos(2\pi f_{FIInj_{NI}}t +$$

$$\phi_{\eta IInj_N} + \phi_{PDat_N} + \phi_{TDat_N}) + |\eta_{Ref_N}|\cos(2\pi f_{FRef_{NI}}t +$$

$$\phi_{\eta Ref_N} + \phi_{PDat_N} + \phi_{TDat_N})]\}$$

This composite signal is then frequency down converted to baseband in the data receiver. Following the procedure to derive the following expression for the time-domain composite data signal at the input to the ADC, $$_A\hat{D}at_{N3}(t) = |T^{Dat_N}|\{|A_{Tx_{\Omega 2}}T^{Tx_{\Omega}}\tilde{S}_{N\Omega}^M PDat_N|\cos[2\pi(f_{S_{TxU}} - \quad (63)$$
$$f_{S_{DOff_{N3}}})t - M(\phi_{LPDSub_{N3}} + \phi_{TDSub_N}) + \phi_{S_{TxU}} +$$
$$\phi_{PT_{x\Omega 2}} + \phi_{TT_{x\Omega}} + \phi_{S_{M\Omega}^M} + \phi_{PDat_N} + \phi_{TDat_N} -$$
$$\phi_{L_{IOff_{NI}}}] + |PDInj_N A_{S_{Dinj_{N3}}}|\cos[2\pi(f_{S_{DInj_{NI}}} -$$
$$f_{S_{DOFF_{N3}}})t + \phi_{S_{DInj_{N3}}} + \phi_{PDInj_N} + \phi_{TDat_N} -$$
$$\phi_{L_{DOff_{NI}}}]\} + |PDat_N|[|\eta_{DInj_N}|\cos(2\pi(f_{S_{DInj_{NI}}} -$$
$$f_{S_{DOFF_{N3}}})t + \phi_{\eta_{DInj_N}} + \phi_{PDat_N} + \phi_{TDat_N} + \phi_{DR_{x_N}}) +$$
$$|\eta_{IInj_N}|\cos(2\pi(f_{S_{IInj_{NI}}} - f_{S_{DOff_{N3}}})t + \phi_{\eta_{IInj_N}} +$$
$$\phi_{PDat_N} + \phi_{TDat_N} + \phi_{DR_{x_N}}) + |\eta_{Ref_N}|\cos[2\pi(f_{F_{Ref_{NI}}} -$$
$$Mf_{L_{SubA}} - f_{S_{DOFF_{N3}}} - 200 \text{ MHz})t + \phi_{\eta_{Ref_N}} + \phi_{PDat_N} +$$
$$\phi_{TDat_N} + \phi_{DR_{x_N}}]]\}.$$

Note that the interference signals experience amplitude and phase changes as they pass through the port-N data receiver circuitry. The amplitude effects-are-lumped into $|T^{Dat_N}|$ while the phase changes (e.g., due to the electrical length of the receiver path and the phases for the LO sources) are modeled by $\phi_{DR_{x_N}}$.

As previously discussed, this composite data signal is digitized and then processed using a FFT. The frequency-domain signals that can be extracted from the different frequency bins can be written as (see (26) and (28))

$$_DDat_{N3} = {_D\hat{D}at_{N3}(f_{S_{TxU}} - f_{S_{DOff_{N3}}})} \quad (64)$$
$$= \tilde{S}_{N\Omega}^M|A_{Tx_{\Omega 2}}|T^{Dat_N}T^{Tx_{\Omega}}PDat_N$$
$$\exp\{j[-M(\phi_{LPDSub_{N3}} + \phi_{TDSub_N}) +$$
$$\phi_{S_{TxU}} + \phi_{PT_{x\Omega 2}} - \phi_{L_{DOff_{NI}}}]\},$$

$$_D\hat{D}Inj_{N3} = {_D\hat{D}at_{N3}(f_{S_{DInj_{NI}}} - f_{S_{DOff_{N3}}})} \quad (65)$$
$$= T^{Dat_N}\{A_{S_{DInj_{N3}}}PDInj_N$$
$$\exp\{-j\phi_{L_{DOff_{NI}}}\} + PDat_N\eta_{DInj_N}$$
$$\exp\{j[\phi_{TDat_N} + \phi_{DR_{x_N}}]\}\}$$

$$_DDInj_{N3} = {_D\hat{D}at_{N3}(f_{S_{IInj_{NI}}} - f_{S_{DOff_{N3}}})} \quad (66)$$
$$= T^{Dat_N}PDat_N\eta_{IInj_N}\exp\{j[\phi_{TDat_N} + \phi_{DR_{x_N}}]\}$$

$$_DDRef_{N3} = {_D\hat{D}at_{N3}(f_{F_{Ref_{NI}}} - Mf_{L_{SubA}} - f_{S_{DOff_{N3}}} - 200 \text{ MHz})} \quad (67)$$
$$= T^{Dat_N}PDat_N\eta_{Ref_N}\exp\{j[\phi_{TDat_N} + \phi_{DR_{x_N}}]\}.$$

Note that in (65), the tilde denotes that the desired data-injection signal is corrupted by the interference signal.

Because of the finite directivity exhibited by directional couplers, signals will also be present on the port-N incident channel. As we will demonstrate, the signals that are measured in the incident channel can be used to remove the interference on the data channel. If we follow the same procedure for the analysis of the incident channel as we did for the data channel, then we find that the time-domain signal at the input to the port-N incident ADC can be expressed as $$_A\hat{I}nc_{N3}(t) = |T^{Inc_N}|\{|A_{Tx_{\Omega 2}}T^{Tx_{\Omega}}\tilde{S}_{N\Omega}^M PInc_N|\cos[2\pi(f_{S_{TxU}} - \quad (68)$$
$$f_{S_{IOff_{N3}}})t - M(\phi_{LPISub_{N3}} + \phi_{TISub_N}) + \phi_{S_{TxU}} +$$

-continued
$$\phi_{PT_{x\Omega 2}} + \phi_{TT_{x\Omega}} + \phi_{S_{N\Omega}^M} + \phi_{PInc_N} + \phi_{TInc_N} -$$
$$\phi_{L_{IOff_{NI}}}] + |PIInj_N A_{S_{IInj_{N3}}}|\cos[2\pi(f_{S_{IInj_{NI}}} -$$
$$f_{S_{IOff_{N3}}})t + \phi_{S_{IInj_{N3}}} + \phi_{PIInj_N} + \phi_{TInc_N} -$$
$$\phi_{L_{IOff_{NI}}}]\} + |PInc_N|[|\eta_{DInj_N}|\cos(2\pi(f_{S_{DInj_{NI}}} -$$
$$f_{S_{IOff_{N3}}})t + \phi_{\eta_{DInj_N}} + \phi_{PInc_N} + \phi_{TInc_N} + \phi_{IR_{x_N}}) +$$
$$|\eta_{IInj_N}|\cos(2\pi(f_{S_{IInj_{NI}}} - f_{S_{IOff_{N3}}})t + \phi_{\eta_{IInj_N}} +$$
$$\phi_{PInc_N} + \phi_{TInc_N} + \phi_{IR_{x_N}}) +$$
$$|\eta_{Ref_N}|\cos[2\pi(f_{F_{Ref_{NI}}} - Mf_{L_{SubA}} - f_{S_{IOff_{N3}}} -$$
$$200 \text{ MHz})t + \phi_{\eta_{Ref_N}} + \phi_{PInc_N} + \phi_{TInc_N} + \phi_{IR_{x_N}}]]\}.$$

The corresponding frequency-domain signals associated with this channel can be expressed as $$_DInc_{N3} = {_D\hat{I}nc_{N3}(f_{S_{TxU}} - f_{S_{IOff_{N3}}})} \quad (69)$$
$$= \tilde{S}_{N\Omega}^M|A_{Tx_{\Omega 2}}|T^{Inc_N}T^{Tx_{\Omega}}PInc_N$$
$$\exp\{j[-M(\phi_{LPISub_{N3}} + \phi_{TISub_N}) + \phi_{S_{TxU}} +$$
$$\phi_{PT_{x\Omega 2}} - \phi_{L_{IOff_{NI}}}]\},$$

$$_DIInj_{N3} = {_D\hat{I}nc_{N3}(f_{S_{IInj_{NI}}} - f_{S_{IOff_{N3}}})} \quad (70)$$
$$= T^{Inc_N}\{A_{S_{IInj_{N3}}}PIInj_N\exp\{-j\phi_{L_{IOff_{NI}}}\} +$$
$$PInc_N\eta_{IInj_N}\exp\{j[\phi_{TInc_N} + \phi_{IR_{x_N}}]\}\}$$

$$_DIDInj_{N3} = {_D\hat{I}nc_{N3}(f_{S_{DInj_{NI}}} - f_{S_{IOff_{N3}}})} \quad (71)$$
$$= T^{Inc_N}PInc_N\eta_{DInj_N}\exp\{j[\phi_{TInc_N} + \phi_{IR_{x_N}}]\}$$

$$_DIRef_{N3} = {_D\hat{I}nc_{N3}(f_{F_{Ref_{NI}}} - Mf_{L_{SubA}} - f_{S_{IOff_{N3}}} - 200 \text{ MHz})} \quad (72)$$
$$= T^{Inc_N}PInc_N\eta_{Ref_N}\exp\{j[\phi_{TInc_N} + \phi_{IR_{x_N}}]\}.$$

Note that this time the incident injection signal is contaminated, i.e., (70).

We next demonstrate how a combination of the signals in (64)–(67) and (69)–(72) can be used to remove the interference on the data and incident injection signals. First we investigate the removal of interference on the data injection signal (65). If we take the ratio of the following three signals, $$_DIDInj_{N3}\frac{_DDRef_{N3}}{_DIRef_{N3}} = T^{Dat_N}PDat_N\eta_{DInj_N}\exp\{j[\phi_{TDat_N} + \phi_{DR_{x_N}}]\}, \quad (73)$$

then we obtain an expression that is equivalent to the interference term in (65). Therefore, the interference in the data injection signal can be removed by carrying out the following calculations, $$_DDInj_{N3} = {_D\hat{D}at_{N3}(f_{S_{DInj_{NI}}} - f_{S_{DOff_{N3}}})} - {_DIDInj_{N3}}\frac{_DDRef_{N3}}{_DIRef_{N3}} \quad (74)$$
$$= T^{Dat_N}A_{S_{DInj_{N3}}}PDInj_N\exp\{-j\phi_{L_{DOff_{NI}}}\},$$

which is the same expression as (28).

Similar techniques can be employed to remove the interference in the incident injection signal, i.e., (70). This time we use the following calculations, $$_D I\!Inj_{N3} = {_D\tilde{I}nc_{N3}}(f_{S\,IInj_{N1}} - f_{S\,IOff_{N3}}) - {_D DI\!Inj_{N3}}\frac{_D I\!Ref_{N3}}{_D DRef_{N3}} \quad (75)$$

$$= T^{Inc_N} A_{S\,IInj_{N3}} PI\!Inj_N \exp\{-j\phi_{L\,IOff_{N1}}\}.$$

This analysis has assumed that there is a reference interference signal that is large enough to accurately measure, i.e., has an adequate signal-to-noise ratio. If this isn't the case, then we can use the incident signal to check to see if there is an interfering signal in the data injection signal. If there is, then the frequency of the data injection signal can be moved to a bin where there is no interference. Likewise, the data channel can be used to check for interference in the incident injection signal and adjust the frequency of the incident injection signal if necessary.

5. Detailed Description of the Application of the ARTTEST Vector Signal Analyzer to Offset-Frequency Measurements In Chapter 3, we investigated the case of standard network analyzer measurements where the transmitted and received frequencies are the same. This application only required the use of a single transmitter output and a signal sub-harmonic signal output. In this chapter, we show how the ARTTEST Vector Signal Analyzer can be applied to the more difficult problem of characterization of frequency translating DUTs. The ARTTEST Vector Signal Analyzer is ideally suited for such applications since multiple transmitter signals can be generated cost effectively, and signals at different frequencies can be measured on each port of the DUT. Since frequency-offsetting techniques are employed to create the multiple transmitter and sub-harmonic LO signals (see Sections 5.2 and 5.1, respectively) that are required for such measurements, the ARTTEST Vector Signal Analyzer still only requires one high-frequency synthesizer.

In this chapter, we look at three different types of frequency-offset measurements. In section 5.3, we look at measurements with small frequency offsets from the transmitter, i.e., <2 MHz. The analysis can also be extended to handle measurements with larger frequency offsets from the transmitter, i.e., <200 MHz.

5.1. Sub-Harmonic LO Source Module

First we discuss how multiple sub-harmonic LO signals are created in the Sub-harmonic LO Source Module. A detailed circuit for this module is provided in FIG. 6. In Section 3.1, we demonstrated how a single sub-harmonic LO signal $_L SubA$ could be created using frequency upconversion. Now we demonstrate how two additional sub-harmonic LO signals ($_L SubB$ and $_L SubC$) can be created at different frequencies. These sub-harmonic LO signals are used for harmonic up-conversion of additional transmitter and calibration injection signals, as-well-as for harmonic down-conversion of the combined data and injection signals on the various DUT ports.

Reference to FIG. 6 shows that the circuitry for the B and C channels for the Sub-harmonic LO Source Module are very similar to the A channel, which was previously analyzed in Section 3.1. The only difference is that a 200 MHz source is employed for the second stage of frequency upconversion in channel A, whereas, adjustable LOs ($_L MSwpB$ and $_L MSwpC$) are used for the B and C channels, respectively. If we employ a similar analysis as was employed to obtain (3), we find that the output frequencies of the B and C channels can be represented by $$f_L{}^{SubB} = f_{Swp} + f_{MSwpB} + 200 \text{ MHz} + f_S{}^{Sub} \quad (76)$$

$$f_L{}^{SubC} = f_{Swp} + f_{MSpC} + 200 \text{ MHz} + f_S{}^{Sub}. \quad (77)$$

The adjustable LO sources, MSwpB and MSwpC, are used to frequency offset (up to 200 MHz) the sub-harmonic LO signals, $_L SubB$ and $_L SubC$, from the signal $_L SubA$. These sub-harmonic LO signals are employed when making measurements on DUTs with moderate frequency offsets (up to 200 MHz).

The time-domain sub-harmonic LO signals can also be represented in forms similar to (4), $$_L SubB(t) = |A_L{}^{SubB}|\cos(2\pi f_L{}^{SubB}t + \phi_L{}^{SubB}) \quad (78)$$

$$_L SubC(t) = |A_L{}^{SubC}|\cos(2\pi f_L{}^{SubC}t + \phi_L{}^{SubC}), \quad (79)$$

where $$\phi_L{}^{SubB} = \phi_L{}^{Swp} + \phi_{200} + \phi_L{}^{MSwpB} + \phi_S{}^{Sub} + \phi_{PSubB} \quad (80)$$

$$\phi_L{}^{SubC} = \phi_L{}^{Swp} + \phi_{200} + \phi_L{}^{MSwpC} + \phi_S{}^{Sub} + \phi_{PSubC}. \quad (81)$$

5.2. Transmitter Module

Next we demonstrate how additional transmitter signals can be created in the Transmitter Module (FIG. 7). In this example embodiment of the ARTTEST Vector Signal Analyzer, the Transmitter Module creates three microwave transmitter signals (TxU, TxV and TxW) that reside at different frequencies. These three signals can be employed in the characterization of frequency-offsetting devices, such as mixers.

The generation of the microwave transmitter signal TxU is discussed in Section 3.2 (7). In an analogous manner, two parallel channels are used to produce second and third transmitter signals, TxV and TxW, with frequencies, $$f_{TxV} = M \left\{ \begin{array}{c} \overline{f_L{}^{SubV}} \\ f_L{}^{SubA} \\ f_L{}^{SubC} \end{array} \right\} + 200 \text{ MHz} + f_S{}^{TxV}, \quad (82)$$

$$f_{TxW} = M \left\{ \begin{array}{c} \overline{f_L{}^{SubW}} \\ f_L{}^{SubA} \\ f_L{}^{SubB} \end{array} \right\} + 200 \text{ MHz} + f_S{}^{TxW}. \quad (83)$$

In the above equations, the bracketed terms indicate that one of two LO signals can be chosen for the mixer, i.e., $$\left\{ \begin{array}{c} \overline{\text{Selected mixer } LO \text{ frequency}} \\ \text{Frequency for switch position 1} \\ \text{Frequency for switch position 2} \end{array} \right\}. \quad (84)$$

The time-domain representations for these signals can be written as (8)

$$TxV(t) = |A_{TxV}|\cos(2\pi f_{TxV}t + M\phi_L{}^{SubV} + \phi_{200} + \phi_S{}^{TxV} + \phi_{PTxV}) \quad (85)$$

$$TxW(t) = |A_{TxW}|\cos(2\pi f_{TxW}t + M\phi_L{}^{SubW} + \phi_{200} + \phi_S{}^{TxW} + \phi_{PTxW}). \quad (86)$$

The three microwave transmitter signals TxU, TxV, and TxW are output from the Microwave Transmitter Module where they are connected to the input of the Receiver and Calibration Source Module (FIG. 5).

It should be noted that additional sub-harmonic LO signals (e.g., $_L$SubD and $_L$SubE) and transmitter signals (e.g., TxY and TxZ) can be generated by adding more channels to the Microwave Transmitter Module and Subharmonic LO Source Module (FIGS. 6 and 7).

5.3. Measurements With Small Frequency Offsets

In order to demonstrate this case, we discuss an application where two separate transmitters are used to simultaneously excite a DUT, and the desired data signal resides at a small frequency offset (<2 MHz) from one of the two transmit frequencies. Such measurements are encountered when investigating two-tone intermodulation distortion in nonlinear DUTs, such as amplifiers and mixers. The two tones that are required for amplifier intermodulation-distortion measurements can be obtained by summing two transmitter signals, e.g., TxU and TxV, externally to the Receiver and Calibration Source Module (FIG. 8). The combined signal is then fed into the TxU input to this module. Note that it is also possible to design the system so that the two signals are summed within the Receiver and Calibration Source Module. If we assume that the amplifier input is connected to port 1 of the ARTTEST Network Analyzer and the output is connected to port 2, then the transmitter switches in the Receiver and Calibration Source Module (FIG. 8) are set to select $Tx_{12}$=TxU and $Tx_{22}$ is set to select the 50Ω load.

In the Microwave Transmitter Module (FIG. 7), we will assume that the sub-harmonic LO switch on the V channel is set to select $_L$SubV=$_L$SubA, thus yielding transmitter signals that reside at the following two frequencies (see (7) and (82)):

$$f_{TxU} = Mf_L{}^{SubA} + 200 \text{ MHz} + f_S{}^{TxU} \qquad (87)$$

$$f_{TxV} = Mf_L{}^{SubA} + 200 \text{ MHz} + f_S{}^{TxV}. \qquad (88)$$

In this case, the baseband DAC chips are used to create the frequency difference (<2 MHz) between the two tones. After summation of the two transmitter outputs, the composite, port-1, two-tone transmitter signal is fed to the input of the amplifier under test. The time-domain representation for this signal can be written as (12)

$$Tx_1(t) = |T^{Tx_1}|\{|A_{TxU_{12}}|\cos(2\pi f_{TxU}t + M\phi_{LSubA} + \phi_{200} + \qquad (89)$$
$$\phi_{STxU} + \phi_{PTxU_{12}} + \phi_{TTx_1}) + |A_{TxV_{12}}|\cos(2\pi f_{TxV}t +$$
$$M\phi_{LSubA} + \phi_{200} + \phi_{STxV} + \phi_{PTxV_{12}} + \phi_{TTx_1})\}$$

The forward directional coupler in the port-1 probe will provide a sample of this signal. Using the same techniques that were developed in Chapter 3, we find that the measured incident signals for the two tones can be represented in the frequency domain as (53), $$\frac{_DInc_{13}^{ToneU}}{_DINInj_{13}} = \frac{|A_{TxU_{12}}||T^{Tx_1}PInc_1|}{A_{205}PIInj_1}\exp\frac{\{j[\phi_{STxU} + \phi_{PTxU_{12}} + \phi_{200}]\}}{\exp\{j[M(\phi_{LPISub_{13}} + \phi_{TISub_1})]\}} \qquad (90)$$

$$\frac{_DInc_{13}^{ToneV}}{_DINInj_{13}} = \frac{|A_{TxV_{12}}||T^{Tx_1}PInc_1|}{A_{205}PIInj_1}\exp\frac{\{j[\phi_{STxV} + \phi_{PTxV_{12}} + \phi_{200}]\}}{\exp\{j[M(\phi_{LPISub_{13}} + \phi_{TISub_1})]\}}, \qquad (91)$$

where the normalized, interpolated, injection signal can be represented as (54)

$$_DINInj_{13} = Interp\left(\frac{_DIInj_{13;D}IComH_{13}}{_DIInjH_{13i}}\right) = \frac{T^{Inc_1}PIInj_1 A_{205}}{\exp[j(\phi_{LIOff_{II}} + \phi_{200})]}. \qquad (92)$$

The time-varying transmission coefficient associated with the incident sub-harmonic LO cable can then be measured using (55)

$$T^{ISub_1} = \sqrt{\frac{_DICir_{13}}{_DISub_{13}}\frac{T_o{}^{ISub_{13}}}{T_o{}^{ISub_{11}}}\frac{\exp[j\phi_{LISmp_{13}}]}{\exp[j\phi_{LICir_{11}}]}}. \qquad (93)$$

Next we focus on the signal output from the amplifier, i.e., the data signal. Here we will assume that we are trying to measure the close-in intermodulation distortion in an amplifier. The main intermodulation products, that occurs in the immediate vicinity of the linear terms, will reside at the frequencies $$3f_{TxU} - 2f_{TxV} = Mf_L{}^{SubA} + 200 \text{ MHz} + 3f_S{}^{TxU} - 2f_S{}^{TxV} \qquad (94)$$

and $$3f_{TxV} - 2f_{TxU} = Mf_L{}^{SubA} + 200 \text{ MHz} + 3f_S{}^{TxV} - 2f_S{}^{TxU}. \qquad (95)$$

Here we will assume that these frequency components, that are close to the linear terms, can be expressed in the time domain as $$Dat_2(t) = |T^{Tx_1}| \qquad (96)$$
$$\{|A_{TxU_{12}}\tilde{S}_{21}^{MU}|\cos(2\pi f_{TxU}t + M\phi_{LSubA} + \phi_{200} + \phi_{STxU} + \phi_{PTxU_{12}} +$$
$$\phi_{TTx_1} + \phi_{\tilde{S}_{21}^{MU}}) + |A_{TxV_{12}}\tilde{S}_{21}^{MV}|\cos(2\pi f_{TxV}t + M\phi_{LSubA} +$$
$$\phi_{200} + \phi_{STxV} + \phi_{PTxV_{12}} + \phi_{TTx_1} + \phi_{\tilde{S}_{21}^{MV}})\} + |T^{Tx_1}|^5$$
$$\{|C_{IMD32}||A_{TxU_{12}}|^3|A_{TxV_{12}}|^2\cos[2\pi(3f_{TxU} - 2f_{TxV})t + M\phi_{LSubA} +$$
$$\phi_{200} + 5\phi_{TTx_1} + \phi_{IMD32} + 3(\phi_{STxU} + \phi_{PTxU_{12}}) -$$
$$2(\phi_{STxV} + \phi_{PTxV_{12}})] + |C_{IMD32}||A_{TxU_{12}}|^2|A_{TxV_{12}}|^3$$
$$\cos[2\pi(3f_{TxV} - 2f_{TxU})t + M\phi_{LSubA} + \phi_{200} + 5\phi_{TTx_1} +$$
$$\phi_{IMD23} + 3(\phi_{STxV} + \phi_{PTxV_{12}}) - 2(\phi_{STxU} + \phi_{PTxU_{12}})]\}.$$

In the above equation we have used a power series representation for the intermodulation products. If one can accurately measure the amplitude constants, $|C_{IMD32}|$ and $|C_{IMD23}|$, as well as the phase constants, $\phi_{IMD32}$ and $\phi_{IMD23}$, then it will be possible to predict the level of the intermods for different input signal levels. Furthermore, the scattering parameters $\tilde{S}_{21}{}^{MU}$ and $\tilde{S}_{21}{}^{MV}$ provide information about the amplifier's gain at the frequencies of tone U and tone V, respectively.

Following the analysis in Chapter 3, it can be shown that the time-domain data signal at the location of the Port-2 ADC can be expressed as (24)

$$_A\hat{D}at_{23}(t) = \qquad (97)$$
$$|T^{Dat_2}PDat_2 T^{Tx_1}|\{|A_{TxU_{12}}\tilde{S}_{21}^{MU}|\cos[2\pi(f_{STxU} - f_{SDOff_{23}})t -$$
$$M(\phi_{LPDSub_{23}} + \phi_{TDSub_2}) + \phi_{STxU} + \phi_{PTxU_{12}} +$$
$$\phi_{TTx_1} + \phi_{\tilde{S}_{21}^{MU}} + \phi_{PDat_2} + \phi_{TDat_2} - \phi_{LDOff_{21}}] +$$

-continued $$|A_{TxV_{12}} \tilde{S}_{21}^{MV}| \cos[2\pi(f_{STxV} - f_{SDOff23})t -$$
$$M(\phi_{LPDSub_{23}} + \phi_{TDSub_2}) + \phi_{STxV} + \phi_{PTxV_{12}} + \phi_{TTx_1} +$$
$$\phi_{\tilde{S}_{21}^{MV}} + \phi_{PDat_2} + \phi_{PDat_2} + \phi_{TDat_2} - \phi_{LDOff_{21}}] +$$
$$|T^{Dat_2} PDInj_2| \sum_{i=1}^{I} |A_{SDInj_{23i}}| \cos[2\pi(f_{SDInj_{23i}} - f_{SDOff_{23}})t +$$
$$\phi_{SDInj_{23i}} + \phi_{PDInj_2} + \phi_{TDat_2} - \phi_{LDOff_{21}}] +$$
$$|T^{Dat_2} PDat_2||T^{Tx_1}|^5 ||C_{IMD32}||A_{TxU_{12}}|^3 |A_{TxV_{12}}|^2$$
$$\cos[2\pi(3f_{STxU} - 2f_{STxV} - f_{SDOff_{21}})t -$$
$$M(\phi_{LPDSub_{23}} + \phi_{TDSub_2}) + 5\phi_{TTx_1} + \phi_{IMD32} +$$
$$\phi_{PDat_2} + \phi_{LDOff_{21}} + 3(\phi_{STxU} + \phi_{PTxU_{12}}) -$$
$$2(\phi_{STxV} + \phi_{PTxV_{12}})] + |C_{IMD23}||A_{TxU_{12}}|^2 |A_{TxV_{12}}|^3$$
$$\cos[2\pi(3f_{STxV} - 2f_{STxU} - f_{SDOff_{21}})t - M(\phi_{LPDSub_{23}} +$$
$$\phi_{TDSub_2}) + 5\phi_{TTx_1} + \phi_{IMD23} + \phi_{PDat_2} + \phi_{TDat_2} -$$
$$\phi_{LDOff_{21}} + 3(\phi_{STxV} + \phi_{PTxV_{12}}) - 2(\phi_{STxU} + \phi_{PTxU_{12}})]\}.$$

If a high-speed ADC is employed (sample rate >4 Msamples/sec), then it is possible to simultaneously display all the intermodulation products within a 2 MHz bandwidth. Thus the ARTTEST Network Analyzer functions like a dynamic signal analyzer.

After digitizing the time-domain data and converting to the frequency domain by using a FFT, the various frequency-domain signals are extracted from the appropriate frequency bins. The gain of the amplifier (i.e., $\tilde{S}_{21}^{MU}$ and $\tilde{S}_{21}^{MV}$) can be measured using the linear terms in (97), e.g., for tone U $$_DDat_{23}^{ToneU} = \tag{98}$$
$$_D\hat{D}at_{23}(f_{STxU} - f_{SDOff_{23}}) = \tilde{S}_{21}^{MU} |A_{TxU_{12}}||T^{Dat_2}T^{Tx_1}| PDat_2 \exp$$
$$\left\{ j \left[ -M\left(\phi_{LPDSub_{23}} + \phi_{TDSub_2}\right) + \phi_{STxU} + \phi_{PTxU_{12}} - \phi_{LDOff_{21}} \right] \right\}$$

Likewise, the injection signal can be represented as (40)

$$_DDNInj_{23} = Interp\left(\frac{_DDInj_{23i}DComH_{23}}{_DDInjH_{23i}}\right) = \frac{T^{Dat_2}PDInj_2 A_{205}}{\exp[j(\phi_{LDOff_{21}} + \phi_{200})]}, \tag{99}$$

Normalization of this data signal (98) by the data injection signal (99) then yields $$\frac{_DDat_{23}^{ToneU}}{_DDNInj_{23}} = \tag{100}$$
$$\frac{|A_{TxU_{22}}||T^{Tx_2}\tilde{S}_{21}^{MU} PDat_2|}{A_{205}PDInj_2} \exp\frac{\{j[\phi_{STxU} + \phi_{PTxU_{12}} + \phi_{200}]\}}{\exp\{jM(\phi_{LPDSub_{23}} + \phi_{TDSub_2})\}},$$

where the time-varying, transmission coefficient for the sub-harmonic cable can be measured using an equation that is similar to (52). Finally, the desired scattering parameter can be measured by normalizing (100) by (91), $$\tilde{S}_{21}^{MU} \frac{PDat_2 PIInj_1}{PInc_1 PDInj_2} \exp\frac{\{jM\phi_{LPISub_{13}}\}}{\exp\{jM\phi_{LPDSub_{23}}\}} = \tag{101}$$

$$\frac{_DDat_{23}}{_DDNInj_{23}} \frac{_DINInj_{13}}{_DInc_{13}} \frac{\exp\{jM\phi_{TDSub_2}\}}{\exp\{jM\phi_{TISub_1}\}}.$$

A similar expression can be obtained for $\tilde{S}_{21}^{MV}$.

Next we investigate the measurement of coefficient $C_{IMD32}$ for one of the intermodulation products. First, the intermodulation signal is written in the frequency domain as $$_DIMD32_{23} = \tag{102}$$
$$_D\hat{D}at_{23}(3f_{STxU} - 2f_{STxV} - f_{SDOff_{21}}) = C_{IMD32}T^{Dat_2} PDat_2(T^{Tx_1})^5$$
$$|A_{TxU_{12}}|^3 |A_{TxV_{12}}|^2 \exp\{j[-M(\phi_{LPDSub_{23}} + \phi_{TDSub_2}) -$$
$$\phi_{LDOff_{21}} + 3(\phi_{STxU} + \phi_{PTxU_{12}}) - 2(\phi_{STxV} + \phi_{PTxV_{12}})]\}.$$

Next, this signal is normalized by the data injection signal (99), thereby yielding $$\frac{_DIMD32_{23}}{_DDINj_{23}} = \frac{C_{IMD32} PDat_2(T^{Tx_1})^5 |A_{TxU_{12}}|^3 |A_{TxV_{12}}|^2}{A_{205} PDInj_2} \tag{103}$$
$$\frac{\exp\{[\phi_{200} + (\phi_{STxU} + \phi_{PTxU_{12}}) - 2(\phi_{STxV} + \phi_{PTxV_{12}})]\}}{\exp\{j[M(\phi_{LPDSub_{23}} + \phi_{TDSub_2})]\}}.$$

Finally, the intermodulation constant can be obtained by normalizing (103) by both equation (7) cubed and the complex conjugate (*) of (91) squared, i.e., $$\frac{_DIMD32_{23}}{_DDINj_{23}} \left(\frac{_DINInj_{13}}{_DInc_{13}^{ToneU}}\right)^3 \left[\left(\frac{_DINInj_{13}}{_DInc_{13}^{ToneU}}\right)^*\right]^2 = C_{IMD32}|A_{205}|^4 \tag{104}$$
$$\frac{PDat_2 PIInj_1}{PDInj_2 PInc_1} \left|\frac{PIInj_1}{PInc_1}\right|^2 \exp\frac{\{jM(\phi_{LPISub_{13}} + \phi_{TISub_1})\}}{\exp\{jM(\phi_{LPDSub_{23}} + \phi_{TDSub_2})\}},$$

which can be rearranged to yield $$C_{IMD32}|A_{205}|^4 \frac{PDat_2 PIInj_1}{PDInj_2 PInc_1} \left|\frac{PIInj_1}{PInc_1}\right|^2 \frac{\exp(jM\phi_{LPISub_{13}})}{\exp(jM\phi_{LPDSub_{23}})} = \tag{105}$$
$$\frac{_DIMD32_{23}}{_DDINj_{23}} \left(\frac{_DINInj_{13}}{_DInc_{13}^{ToneU}}\right)^3 \left[\left(\frac{_DINInj_{13}}{_DInc_{13}^{ToneU}}\right)^*\right]^2 \frac{\exp(jM\phi_{TDSub_2})}{\exp(jM\phi_{TISub_1})}.$$

Note that with the exception of the intermodulation constant, all of the terms on the left-hand-side of this equation are static, and can be removed via static calibration. All the terms on the right-hand-side of this equation are time-varying terms that can be measured. This demonstrates that the ARTTEST dynamic suppression technique can also be employed to remove time-varying sources of error in offset frequency measurements.

Using similar techniques, we can also obtain a similar expression for the other intermodulation constant, i.e., $$C_{IMD23}|A_{205}|^4 \frac{PDat_2 PIInj_1}{PDInj_2 PInc_1} \left|\frac{PIInj_1}{PInc_1}\right|^2 \frac{\exp(jM\phi_{LPISub_{13}})}{\exp(jM\phi_{LPDSub_{23}})} = \tag{106}$$
$$\frac{_DIMD23_{23}}{_DDINj_{23}} \left(\frac{_DINInj_{13}}{_DINc_{13}^{ToneV}}\right)^3 \left[\left(\frac{_DINInj_{13}}{_DINc_{13}^{ToneU}}\right)^*\right]^2 \frac{\exp(jM\phi_{TDSub_2})}{\exp(jM\phi_{TISub_2})}.$$

Since a FFT is employed to extract the frequency-domain signals from their bins, all of the results in (101), (105), and (106) can be measured simultaneously. Furthermore, if there is interference at the injection signal frequency, the technique that is demonstrated in Chapter 4 can be used to remove the interference.

6. Alternate Approaches

6.1. Frequency-offsetting the Local-oscillator Signal for Cross-talk Removal Offsetting the frequency of each receiver channel is important for elimination of cross-talk interference between channels. Of course, the cross talk will still appear in the channel, but at a different frequency than the data, so it will not causeinterference. In FIG. 9, this is accomplished with a frequency-offset mixer, which follows the down-conversion mixer. This will eliminate the potential for cross talk after this stage, but cross talk can still occur in the circuitry connecting the down-conversion mixer and the frequency-offset mixer. It is also possible to place a frequency-offset mixer in front of the down-conversion mixer. This, however, requires that the offset frequency be substantially greater than the bandwidth of the swept filter in order to avoid mixing with imaging frequencies.

An alternate approach is to frequency offset the local oscillator (LO) line, which feeds the down-conversion mixer. This can lead to lower overall system cross talk. FIG. 6 shows the Subharmonic LO Sources that were used in the approach that we have already discussed. There is one DAC signal, which is split into three separate LO lines. In order to provide a unique frequency signal for each LO, separate DACs must be used for each LO drive line. FIG. 13 shows the circuitry that is used in this alternate approach. There will be one of these LO-source circuits, with its own unique frequency, for each receiver channel.

Referring again to the Port-N Channel Probe circuit (FIG. 9), if the LO frequency, which drives the down-conversion mixer, has been offset to a unique frequency, there is less circuitry that can potentially pick up crosstalk. Furthermore, it maybeeasier to shield the microwave signal circuitry, rather than the IF frequency circuits.

6.2. Use of Multiple Levels at Low Frequency to Optimize Dynamic Range

It is important to match the amplitude of the injection signal, which is used for normalization, and the amplitude of the corresponding data signal. If there is a substantial difference in the magnitudes of these signals, the dynamic range will be reduced when both signals pass through the receiver signal-conditioning circuitry. FIG. 10 shows the injection-signal source, along with a variable attenuator to adjust the injection-signal amplitude. High-level and low-level receiver channels monitor this variable-level, injection-signal ($_CPInj_{N3}$). A relatively large common signal (Com) is injected into the high-level receiver channel, followed by a relatively low gain. A relatively small common signal is injected into the low-level receiver channel, followed by a relatively high gain. The common signal provides a reference for all the measurement channels. By having two levels of the common signal, we can obtain an improved dynamic range.

An alternate approach, which can provide even greater dynamic range, is shown in FIG. 14. Here the variable-level, injection-signal ($_CPInj_{N3}$) is monitored by an equalizer/summer network. The details of this equalizer/summer network are shown in FIG. 15. A sample of the injection signal is input to port B of this equalizer/summer and is split into 4 or more paths. The common signal is input to port A of this equalizer/summer and is also split into 4 or more paths. It is then attenuated by various amounts (e.g., 0, 10, 20, 30 dB). The 4 inputs from A are then combined with the 4 inputs from B and the output is selected with a.multi-position switch. The switch is used to select whichever path provides the closest match between the common signal and the sample of the injection signal. The output of the switch goes to a single receiver channel, which then monitors any changes in the level of the injection signal. We note that the switch and all components of the receiver monitor are calibrated, since both the common signal and the injection signal pass through these components. A static calibration is applied to each ofthe legs within the equalizer/summer. The ability to select whichever leg provides the closest match between the injection signal amplitude and the common signal amplitude can lead tora significantly enhanced dynamic range.

6.3. Use of Multiple Levels at High Frequency to Optimize Dynamic Range and a Method for Linking Multiple Channels FIG. 16 illustrates an alternate embodiment for the ART-TEST Vector Signal Analyzer. In this figure are illustrated two separate channels that are associated with the probes on ports $\Omega$ and N. This pair of probes and the associated link circuitry in FIG. 16 is representative of what can be used with many probes. Each of these channels may be connected to either the incident ($Path_N=Inc_N$) or the data ($Path_N=Dat_N$) directional coupler in the given probe (FIG. 8). For example, in the special case of the transmission measurement $S_{N\Omega}$, $Path_\Omega=Inc_\Omega$ and $Path_N=Dat_N$. On the other hand, when carrying out the reflection measurement $S_{\Omega\Omega}$, $Path_\Omega=Inc_\Omega$ and $Path_N=Dat_\Omega$.

There are two major changes that have been implemented in this alternate embodiment. First, instead of summing and Aequalizing the signal levels for the injection and common signals in the low-frequency portion of the circuit, as is done in FIGS. 10 or 14, the summing and equalization takes place in the high-frequency probe circuitry (FIG. 16). Once again, FIG. 15 illustrates the circuitry for the equalizer/summer modules that are shown in FIG. 16. The purpose of the equalizer/summer in this case is to sum data and injection signals that have approximately the same amplitudes. The process of equalizing the amplitudes of the data and injection signals optimizes the dynamic range for the receiver channel, as was previously discussed in Section 6.2. Since the amplitude of the injection signal is varied in the probe, the injection signal is mainta-ined at a constant level at low frequencies in the Port-N Channel Receivers and Calibration Sources Module (FIG. 10), i.e., there is no variable attenuator on the injection signal line in FIG. 10 in this embodiment. Since the amplitude of the low frequency injection signal is held constant, there is no longer a need to have both high- and low-level injection signal monitors, as shown in FIG. 10 and discussed in Section 3.3.5. In this embodiment, the injected common signal can be set to have roughly the same amplitude as the sampled low-frequency injection signal, thereby only requiring one injection-signal monitor receiver per channel.

The second alteration in the current embodiment involves the means by which amplitude and phase references are established between the various channels. In the standard embodiment of the ARTTEST Vector Signal Analyzer, a circular mixer is used to send a calibration signal back down the local oscillator line (see FIG. 9 and Section 3.3.7). Once measured, the signal from the circular mixer can be used to determine the time-varying transmission coefficient (52) associated with the subharmonic local-oscillator cable. The measured transmission coefficients can then be used to establish relative phase references at each of the channels in the various probes. In the alternate embodiment, the circular mixers are removed from the probes (i.e., compare FIGS. 9 and 16) and the circuitry in the Channel Receivers and Calibration Sources Modules (FIG. 10) that is used to measure the signal, produced by the circular mixer is also removed. The required amplitude and phase references are achieved via "link" cables that are used to connect the injection paths for the various channels. For measurements on non-frequency translating DUTs, the mixer that is shown in the link cable in FIG. 16 is unnecessary. Either it can be removed, or the mixer can be fed with a large enough DC signal so that no frequency translation and minimum attenuation occurs. When a frequency translating DUT is being measured, the frequency of the local oscillator signal $_L OLink_{\Omega N1}$ can be chosen to provide the correct frequencies for the link signals in the two channels.

Here we discuss the simpler case for non-frequency translating DUTs. For the purpose of this demonstration, we will assume that the channels are configured for the transmission measurement $S_{N\Omega}$, i.e., $Path_\Omega = Inc_\Omega$ and $Path_N = Dat_N$. Since the injection signals for each channel have their own unique frequencies, a portion of the injection signal can be split off in each channel using a two-resistor splitter. This sampled injection signal is then passed through the link cable and re-injected into the injection signal path of the inter-connected channel. In this manner, the data signal in the port-N probe (i.e., $Dat_N$) in FIG. 16 will be equalized and summed with injection signals from both the port-Q and port-N probes. Note that the port-$\Omega$ injection signal $IInj_\Omega$ will be smaller than the port-N injection signal $DInj_N$ because of the conversion loss of the mixer (if present) in the link leg.

In this new embodiment, the following signals will be received in the port-Ndata receiver (see (26) and (28)):

$$_D Dat_{N3} = \tilde{S}_{N\Omega}^M |A_{Tx\Omega2}| T^{Dat_N} T^{Tx\Omega} PDat_N \exp \quad (107)$$
$$\{j[-M(\phi_{LPDSub_{N3}} + \phi_{TDSub_N} + \phi_{STxU} + \phi_{PTx\Omega2} - \phi_{LDoff_{N1}})]\},$$

$$_D DInj_{N3i} = A_{SDInj_{N3i}} T^{Dat_N} PDInj_N \exp\{-j\phi_{LDoff_{N1}}\}, \quad (108)$$

and a link signal that we will define as $_D DLink_{N\Omega3i}$. By extending the analysis in Section 3.3.4, it can be shown that $$_D DLink_{N\Omega3i} = A_{SIInj_{\Omega3i}} T^{Dat_N} T^{Link_{N\Omega}} PLink_{N\Omega} \exp \quad (109)$$
$$\{j[-M(\phi_{LPDSub_{N3}} + \phi_{TDSub_N} - \phi_{LPISub_{\Omega3}} - \phi_{TISub_\Omega}) - \phi_{LDoff_{N1}}]\},$$

where $T^{Link_{N\Omega}}$ represents the time-varying transmission coefficient for a signal passing through the link cable from the port-$\Omega$ incident probe to the port-N data probe. Similar expressions can be developed for the signals that are received in the port-$\Omega$ incident signal receiver:

$$_D INc_{\Omega3} = |A_{Tx\Omega2}| T^{Inc_\Omega} T^{Tx\Omega} PInc_\Omega \exp \quad (110)$$
$$\{j[-M(\phi_{LPISub_{\Omega3}} + \phi_{TISub_\Omega}) + \phi_{STxU} + \phi_{PTx\Omega2} - \phi_{LIoff_{\Omega1}}]\},$$

$$_D IInj_{\Omega3i} = A_{SIInj_{\Omega3i}} T^{Inc_\Omega} PIInj_\Omega \exp\{-j\phi_{LIoff_{\Omega1}}\}, \quad (111)$$

$$_D ILink_{\Omega N3i} = A_{SDInj_{N3i}} T^{Inc_\Omega} T^{Link_{\Omega N}} PLink_{\Omega N} \exp \quad (112)$$
$$\{j[-M(\phi_{LPISub_{\Omega3}} + \phi_{TISub_\Omega} - \phi_{LPDSub_{N3}} - \phi_{TDSub_N}) - \phi_{LIoff_{\Omega1}}]\},$$

where $T^{Link_{\Omega N}}$ represents the time-varying transmission coefficient for a signal passing through the link cable from the port-N data probe to the port-$\Omega$ incident probe.

Normalization procedures can be used with the above mentioned signals to achieve real-time dynamic error suppression, i.e., $$\frac{_D DLINK_{N\Omega3iD} ILink_{\Omega N3i}}{_D IInj_{\Omega3iD} DInj_{N3i}} = T^{Link_{N\Omega}} T^{Link_{\Omega N}} PLink_{N\Omega} \frac{PLink_{\Omega N}}{PIInj_\Omega PDInj_N}. \quad (113)$$

If we assume that the link leg is reciprocal, i.e., $T^{Link_{N\Omega}} = T^{Link_{\Omega N}}$, then the time varying-transmission coefficient on this line can be determined by $$T^{Link_{N\Omega}} \sqrt{\frac{PLink_{N\Omega} PLink_{\Omega N}}{PIInj_\Omega PDInj_N}} = \sqrt{\frac{_D DLink_{N\Omega3iD} ILink_{\Omega N3i}}{_D IInj_{\Omega3iD} DInj_{N3i}}} \quad (114)$$

where $PLink_{N\Omega}$, $PLink_{\Omega N}$, $PIInj_\Omega$, and $PDInj_N$ denote static calibration constants. The transmission coefficient can then be computed via $$\tilde{S}_{N\Omega}^M PDat_N \frac{PLink_{\Omega N}}{PInc_\Omega PDInj_N} = \frac{_D Dat_{N3D} ILink_{\Omega N3i}}{_D Inc_{\Omega3D} DInj_{N3i}} (T^{Link_{\Omega N}})^{-1}. \quad (115)$$

Thus, the time-varying errors associated with the transmitter, the receivers, the link cable, thehigh-frequency LOs, the gain ranging amplifiers, and swept filters can be removed via this ARTTEST dynamic error suppression technique.

The general concept that is illustrated by the simplified drawing in FIG. 16 can also be extended to multiple channels. In order to extend this concept to more than two-channels, one can split the injection signal into multiple link paths (the number depends on the number of required links) immediately following the injection up-conversion mixer. Each injection signal is then passed through an-amplifier, for isolation, the two-resistor link-leg circuitry, another isolation amplifier, and an equalizer/summer module. These link cables are then interconnected to the other channels. Likewise, the data signal is also split into multiple signals, and these signals are input into an equalizer/summer module. The output of the equalizer/summer module is then combined and fed into the data receiver.

If some of the multiple channels do not move relative to each other, so that there will be no cable flexure in the injection signal cable, then a single common injection signal can be employed for these multiple channels and the reciprocal link cable is not needed. This can be accomplished by splitting the injection signal immediately prior to its entering the equalizer/summer. These two injection signals are then fed into equalizer/summers, where they are injected into multiple receivers.

In summary, the ARTTEST Method provides a revolutionary advance in measurement technology. It can provide a significant improvement in the accuracy of measurements, elimination of errors due to interfering signals, and can lead to reduced costs.

Although the preferred embodiments of the invention have been illustrated and described in detail, it will be readily apparent to those skilled in the art that various modifications may be made therein without departing from the spirit of the invention or from the scope of the appended claims.

What is claimed is:

1. A signal measurement method incorporating real-time error suppression, said method comprising:

producing a low-frequency injection signal;

producing a data signal;

producing a common signal common to all channels;

generating a local-oscillator signal;

combining said low-frequency injection signal with said common signal;

monitoring said low-frequency injection signal and said common signal with a low-frequency receiver;

up-converting said low-frequency injection signal utilizing said local-oscillator signal to produce a high-frequency injection signal;

combining said high-frequency injection signal and said data signal to produce a conditioned signal; and down-converting said conditioned signal utilizing said local-oscillator signal to produce a low-frequency conditioned signal.

2. A method for phase-noise suppression, and generation of multiple swept, offset-frequency, and local-oscillator signals, said method comprising:

producing a fixed, low-frequency, offset local-oscillator signal;

producing a swept, medium-frequency signal;

mixing said fixed, low-frequency, offset local-oscillator signal with said swept, medium-frequency signal to produce an offset, medium-frequency, swept signal;

producing a swept, high-frequency, common signal;

mixing said offset, medium-frequency, swept signal with said swept, high-frequency, common signal to produce an offset, high-frequency, swept local-oscillator signal; and filtering said offset, high-frequency, swept local-oscillator signal with a swept filter to produced a local-oscillator signal.

3. A method for cross-talk suppression in a signal measurement system, said method comprising:

providing a data signal;

providing an injection signal;

combining said data signal and said injection signal to produce a combined signal;

filtering said combined signal to produce a filtered signal;

providing a frequency-offset local-oscillator signal; and mixing said filtered signal with said frequency-offest local-oscillator signal to produce an offset signal.

* * * * *

UNITED STATES PATENT AND TRADEMARK OFFICE
CERTIFICATE OF CORRECTION

PATENT NO. : 6,636,816 B1  
DATED : October 21, 2003  
INVENTOR(S) : Dvorak et al.

Page 1 of 6

It is certified that error appears in the above-identified patent and that said Letters Patent is hereby corrected as shown below:

Column 1,  
Line 28, replace "acknowledge" with -- a knowledge --.

Column 7,  
Line 68, replace "a nd-receive" with -- and receive --.

Column 9,  
Line 68, replace "$f_{U^{Sub}} = 200Mhz + f_{S^{Sub}}$" with -- $f_{U^{Sub}} = 200Mhz \pm f_{S^{Sub}}$ --.

Column 15,  
Lines 4-5 replace "$b_{I^{Pat_N}} = {}_L DSub_{N1}$" with -- $b_{I^{Path_N}} = {}_L DSub_{N1}$ --.  
Line 6, replace "${}_L DSub_{N1}(t) = |A_{L^{DSub_{N3}}} T^{DSub_N}| \cos(2\pi f_{I^{SubA}} + \phi_{L^{SubA}} + \phi_{I^{Sub_n}} + \phi_{T^{DSub_n}})$"  
with -- ${}_L DSub_{N1}(t) = |A_{L^{DSub_{N3}}} T^{DSub_N}| \cos(2\pi f_{I^{SubA}} t + \phi_{I^{SubA}} + \phi_{L^{PDSub_{N3}}} + \phi_{T^{DSub_N}})$ --.

Column 17,  
Line 21, a new Paragraph starts with -- The Composite --

Column 18,  
Line 51, replace "$f_{D^{Dat_{N3}}} = f_{S^{TxU}} - Fx_{S^{DOff_{N3}}}$" with -- $f_{D^{Dat_{N3}}} = f_{S^{TxU}} - f_{S^{DOff_{N3}}}$ --.  
Line 59, replace "$\tilde{S}_{NN}^M = |\tilde{S}_{NN}^M| \exp(j\phi_{\tilde{S}_{NN}^M})$" with -- $\tilde{S}_{NN}^M = |\tilde{S}_{NN}^M| \exp(j\phi_{\tilde{S}_{NN}^M})$ --.  
Line 68, replace "${}_D DInj_{N3i} = {}_D \hat{D}at_{N3}(f_{D^{DInj_{N3i}}}) = A_{S^{DInj_{N3i}}} T^{Dat_N} PDInj_n \exp\{-j\phi_{L^{DOff_{N1}}}\}$"  
with -- ${}_D DInj_{N3i} = {}_D \hat{D}at_{N3}(f_{D^{DInj_{N3i}}}) = A_{S^{DInj_{N3i}}} T^{Dat_N} PDInj_N \exp\{-j\phi_{L^{DOff_{N1}}}\}$ --.

Column 21,  
Line 27, replace "$\phi_{T^{Sub_N}}$" with -- $\phi_{T^{DSub_N}}$ --.

Column 22,  
Line 51, replace "${}_I \hat{D}Sub_{N3}(t) = |A_{L^{DSub_{N3}}} T^{R^{DSub_{N3}}}| \{|T^{O^{DSub_{N3}}}| \cos[2\pi(400Mhz+$ $f_{S^{Sub}} - f_{S^{DSmp_{N3}}})t + 2\phi_{200} + \phi_{S^{Sub}} + \phi_{PSubA} + \phi_{L^{DSmp_{N3}}} + \phi_{L^{PDSub_{N3}}} + \theta_{T^{ODSub_{N3}}}] + |T^{DSub_N}|^2 |T^{O^{DSub_{N1}}}|$  
$\cos[2\pi(400Mhz + f_{S^{Sub}} - f_{S^{DCr_{N3}}})t + 2\phi_{200} + \phi_{S^{Sub}} + \phi_{PSubA} + \phi_{L^{DCr_{N1}}} + \phi_{L^{PDSub_{N3}}} + 2\phi_{T^{DSub_N}}$  
$+ \phi_{T^{ODSub_{N1}}} + \phi_{T^{RDSub_{N3}}}]\}$" with -- ${}_I \hat{D}Sub_{N3}(t) = |A_{L^{DSub_{N3}}} T^{R^{DSub_{N3}}}| \{|T^{O^{DSub_{N3}}}| \cos[2\pi(400Mhz+$ $f_{S^{Sub}} - f_{S^{DSmp_{N3}}})t + 2\phi_{200} + \phi_{S^{Sub}} + \phi_{PSubA} + \phi_{L^{DSmp_{N3}}} + \phi_{L^{PDSub_{N3}}} + \phi_{T^{ODSub_{N3}}} + \phi_{T^{RDSub_{N3}}}] +$  
$|T^{DSub_N}|^2 |T^{O^{DSub_{N1}}}| \cos[2\pi(400Mhz + f_{S^{Sub}} - f_{S^{DCr_{N3}}})t + 2\phi_{200} + \phi_{S^{Sub}} + \phi_{PSubA} + \phi_{L^{DCr_{N1}}}$  
$+ \phi_{L^{PDSub_{N3}}} + 2\phi_{T^{DSub_N}} + \phi_{T^{ODSub_{N1}}} + \phi_{T^{RDSub_{N3}}}]\}$ --

UNITED STATES PATENT AND TRADEMARK OFFICE
CERTIFICATE OF CORRECTION

PATENT NO. : 6,636,816 B1
DATED : October 21, 2003
INVENTOR(S) : Dvorak et al.

It is certified that error appears in the above-identified patent and that said Letters Patent is hereby corrected as shown below:

Column 23,
Line 58, replace "$_D DStib_{N3}$" with -- $_D DSub_{N3}$ --.

Column 24,
Lines 60-62, replace "$\left(\frac{_D Dat_{N3}}{_D DNInj_{N3}}\right)_D \frac{INInj_{N3}}{DInc_{23}} = \widetilde{S}_{NN}^M \frac{PDat_n PIInj_N}{PInc_N PDInj_N} \exp \frac{\{jM(\phi_{L^{PISub_{N3}}} + \phi T^{ISub_N})\}}{\exp\{jM(\phi_{L^{PDSub_{N3}}} + \phi_{T^{DSub_N}})\}}$"

with -- $\frac{_D Dat_{N3}}{_D DNInj_{N3}} \frac{INInj_{N3}}{DInc_{23}} = \widetilde{S}_{NN}^M \frac{PDat_n PIInj_N}{PInc_N PDInj_N} \frac{\exp\{jM(\phi_{L^{PISub_{N3}}} + \phi T^{ISub_N})\}}{\exp\{jM(\phi_{L^{PDSub_{N3}}} + \phi_{T^{DSub_N}})\}}$ --.

Column 25,
Line 5, replace "$\widetilde{S}_{NN}^M \frac{PDat_N PIInj_N}{PInc_N PDInj_N} \exp \frac{\{jM\phi_{L^{PISub_{N3}}}\}}{\exp\{jM\phi_{L^{PDSub_{N3}}}\}} = \frac{_D Dat_{N3}}{_D DNInj_{N3}} \frac{_D INInj_{N3}}{_D Inc_{N3}} \frac{\exp\{jM\phi_{T^{DSub_N}}\}}{\exp\{jM\phi_{T^{ISub_N}}\}}$"

with -- $\widetilde{S}_{NN}^M \frac{PDat_N PIInj_N}{PInc_N PDInj_N} \frac{\exp\{jM\phi_{L^{PISub_{N3}}}\}}{\exp\{jM\phi_{L^{PDSub_{N3}}}\}} = \frac{_D Dat_{N3}}{_D DNInj_{N3}} \frac{_D INInj_{N3}}{_D Inc_{N3}} \frac{\exp\{jM\phi_{T^{DSub_N}}\}}{\exp\{jM\phi_{T^{ISub_N}}\}}$ --.

Line 16, replace "$\phi_{T^{DSub_n}}$ and $\phi_{T^{DSub_N}}$" with -- $\phi_{T^{DSub_n}}$ and $\phi_{T^{ISub_N}}$ --.

Line 21, replace "$\widetilde{S}_{NN}^{M^M}$" with -- $\widetilde{S}_{NN}^M$ --.

Line 37, replace "$\widetilde{S}_{N\Omega}^{M^M}$" with -- $\widetilde{S}_{N\Omega}^M$ --.

Column 26,
Line 36, replace "$Dat_N(t) = |A_{Tx_{\Omega 2}} T^{Tx_\Omega} \widetilde{S}_{N\Omega}^M| \cos(2\pi f_{TxU^T} + M\phi_{L^{SubA}} + \phi_{200} + \phi_{S^{TxU}} + \phi_{PTx_{\Omega 2}} + \phi_{T^{Tx_\Omega}} + \phi_{\widetilde{S}_{N\Omega}^M}) + |\eta_{DInj_N}| \cos(2\pi f_{F^{DInj_{N1}}} t + \phi_{\eta DInj_N}) + |\eta_{IInj_N}| \cos(2\pi f_{F^{IInj_{N1}}} t + \phi_{\eta IInj_N}) + |\eta_{Re f_N}| \cos(2\pi f_{F^{Re f_{N1}}} t + \phi_{\eta Re f_N})$"

with -- $Dat_N(t) = |A_{Tx_{\Omega 2}} T^{Tx_\Omega} \widetilde{S}_{N\Omega}^M| \cos(2\pi f_{TxU^T} + M\phi_{L^{SubA}} + \phi_{200} + \phi_{S^{TxU}} + \phi_{PTx_{\Omega 2}} + \phi_{T^{Tx_\Omega}} + \phi_{\widetilde{S}_{N\Omega}^M}) + |\eta_{DInj_N}| \cos(2\pi f_{F^{DInj_{N1}}} t + \phi_{\eta DInj_N}) + |\eta_{IInj_N}| \cos(2\pi f_{F^{IInj_{N1}}} t + \phi_{\eta IInj_N}) + |\eta_{Re f_N}| \cos(2\pi f_{F^{Re f_{N1}}} t + \phi_{\eta Re f_N})$ --.

Line 47, replace "$\eta^{DInkN}$" with -- $|\eta^{DInjN}|$ --.

Line 54, replace "$_F \hat{D}at_{N1}(t) = |T^{Dat_N}|\{|A^{Tx_\Omega} \widetilde{S}_{N\Omega}^M PDat_N| \cos(2\pi f_{TxU} t + M\phi_{L^{SubA}} + \phi_{200} + \phi_{S^{TxU}} + \phi_{PTx_{\Omega 2}} + \phi_{\widetilde{S}_{N\Omega}^M} + \phi_{PDat_N} + \phi_{T^{Dat_N}}) + |PDInj_N A_{S^{DInj_{N3}}}| \cos[2\pi f_{F^{DInj_{N1}}} t + M(\phi_{L^{SubA}} + \phi_{L^{PSub_{N3}}} + \phi_{L^{ISub_N}}) + \phi_{200} + \phi_{S^{DInj_{N1}}} t + \phi_{PDInj_N} + \phi_{T^{Dat_N}}] + |PDat_N|[|\eta_{DInj_N}| \cos(2\pi f_{F^{DInj_{N1}}} t + \phi \eta_{DInjN} + \phi_{PDat_N} + \phi_{T^{Dat_N}}) + |\eta_{IInj_N}| \cos(2\pi f_{F^{IInj_{N1}}} t + \phi_{\eta IInj_N} + \phi_{PDat_N} + \phi_{T^{Dat_N}}) + |\eta_{Re f_N}| \cos(2\pi f_{F^{Re f_{N1}}} t + \phi_{\eta Re f_N} + \phi_{PDat_N} + \phi_{T^{Dat_N}})]\}$"

UNITED STATES PATENT AND TRADEMARK OFFICE
CERTIFICATE OF CORRECTION

PATENT NO. : 6,636,816 B1
DATED : October 21, 2003
INVENTOR(S) : Dvorak et al.

It is certified that error appears in the above-identified patent and that said Letters Patent is hereby corrected as shown below:

Column 26 (cont'd,
Line 54 (cont'd), with -- $_F\hat{D}at_{N1}(t) = |T^{Dat_N}|\{|A^{Tx_\Omega}\tilde{S}^M_{N\Omega}PDat_N|$
$\cos(2\pi f_{Tx U}t + M\phi_{L^{SubA}} + \phi_{200} + \phi_{S^{Tx U}} + \phi_{PTx_{\Omega 2}} + \phi_{\tilde{S}^M_{M\Omega}} + \phi_{PDat_N} + \phi_{T^{Dat_N}}) + |PDInj_N A_{S^{DInj_{N1}}}|$
$\cos[2\pi f_{F^{DInj_{N1}}}t + M(\phi_{L^{SubA}} + \phi_{L^{PDSub_{N3}}} + \phi_{T^{DSub_N}}) + \phi_{200} + \phi_{S^{DInj_{N1}}}t + \phi_{PDInj_N} + \phi_{T^{Dat_N}}] + |PDat_N|[|\eta_{DInj_N}|$
$\cos(2\pi f_{F^{DInj_{N1}}}t + \phi\eta_{DInjN} + \phi_{PDat_N} + \phi_{T^{Dat_N}}) + |\eta_{IInj_N}|\cos(2\pi f_{F^{IInj_{N1}}}t + \phi_{\eta IInj_N} + \phi_{PDat_N} + \phi_{T^{Dat_N}})$
$+ |\eta_{Re f_N}|\cos(2\pi f_{F^{Re f_{N1}}}t + \phi_{\eta Re f_N} + \phi_{PDat_N} + \phi_{T^{Dat_N}})]\}$ --.

Column 27,
Lines 4-20, replace " $_A\hat{D}at_{N3}(t) = |T^{Dat_N}|\{|A_{Tx_{\Omega 2}}T^{Tx_\Omega}\tilde{S}^M_{N\Omega}PDat_N|\cos$
$2\pi(f_{S^{Tx U}} - f_{S^{Doff_{N3}}})t - M(\phi_{L^{PDSub_{N3}}} + \phi_{T^{DSub_N}}) + \phi_{S^{Tx U}} + \phi_{PTx_{\Omega 2}} + \phi_{T^{Tx_\Omega}} + \phi^M_{\tilde{S}_{M\Omega}} + \phi_{PDat_N} +$
$\phi_{T^{Dat_N}} - \phi_{L^{Doff_{N1}}}] + |PDInj_N A_{S^{DInj_{N3}}}|\cos[2\pi(f_{S^{DInj_{N1}}} - f_{S^{DOFF_{N3}}})t + \phi_{S^{DInj_{N3}}} + \phi_{PDInj_N} + \phi_{T^{Dat_N}} -$
$\phi_{L^{Doff_{N1}}}]\} + |PDat_N|[|\eta_{DInj_N}|\cos(2\pi(f_{S^{DInj_{N1}}} - f_{S^{DOFF_{N3}}})t + \phi_{\eta DInj_N} + \phi_{PDat_N} + \phi_{T^{Dat_N}} + \phi_{DRx_N}) +$
$|\eta_{IInj_N}|\cos(2\pi(f_{S^{IInj_{N1}}} - f_{S^{DOFF_{N3}}})t + \phi_{\eta IInj_N} + \phi_{PDat_N} + \phi_{T^{Dat_N}} + \phi_{DRx_N}) + |\eta_{Re f_N}|\cos[2\pi(f_{F^{Re f_{N1}}} -$
$Mf_{L^{SubA}} - f_{S^{DOFF_{N3}}} - 200Mhz)t + \phi_{\eta_{Re f_N}} + \phi_{PDat_N} + \phi_{T^{Dat_N}} + \phi_{DRx_N}]]\}$ "

with -- $_A\hat{D}at_{N3}(t) = |T^{Dat_N}|\{|A_{Tx_{\Omega 2}}T^{Tx_\Omega}\tilde{S}^M_{N\Omega}PDat_N|\cos 2\pi(f_{S^{Tx U}} - f_{S^{Doff_{N3}}})t - M(\phi_{L^{PDSub_{N3}}} + \phi_{T^{DSub_N}})$
$+ \phi_{S^{Tx U}} + \phi_{PTx_{\Omega 2}} + \phi_{T^{Tx_\Omega}} + \phi^M_{\tilde{S}_{N\Omega}} + \phi_{PDat_N} + \phi_{T^{Dat_N}} - \phi_{L^{Doff_{N1}}}] + |PDInj_N A_{S^{DInj_{N3}}}|\cos[2\pi(f_{S^{DInj_{N1}}}$
$- f_{S^{DOFF_{N3}}})t + \phi_{S^{DInj_{N3}}} + \phi_{PDInj_N} + \phi_{T^{Dat_N}} - \phi_{L^{Doff_{N1}}}]\} + |PDat_N|[|\eta_{DInj_N}|\cos(2\pi(f_{S^{DInj_{N1}}} -$
$f_{S^{DOFF_{N3}}})t + \phi_{\eta DInj_N} + \phi_{PDat_N} + \phi_{T^{Dat_N}} + \phi_{DRx_N}) + |\eta_{IInj_N}|\cos(2\pi(f_{S^{IInj_{N1}}} - f_{S^{DOFF_{N3}}})t + \phi_{\eta IInj_N}$
$+ \phi_{PDat_N} + \phi_{T^{Dat_N}} + \phi_{DRx_N}) + |\eta_{Re f_N}|\cos[2\pi(f_{F^{Re f_{N1}}} - Mf_{L^{SubA}} - f_{S^{DOFF_{N3}}} - 200Mhz)t$
$+ \phi_{\eta_{Re f_N}} + \phi_{PDat_N} + \phi_{T^{Dat_N}} + \phi_{DRx_N}]]\}$ --.

Column 27, lines 64-66 and Column 28, lines 1-16,
replace " $_DDInj_{N3} = {_D}\hat{D}at_{N3}(f_{S^{IInj_{N1}}} - f_{S^{DOff_{N3}}}) = T^{Dat_N}PDat_{N^{\eta IInj_N}}\exp\{j[\phi_{T^{Dat_N}} + \phi_{DRx_N}]\}$ "

with -- $_DDIInj_{N3} = {_D}\hat{D}at_{N3}(f_{S^{IInj_{N1}}} - f_{S^{DOff_{N3}}}) = T^{Dat_N}PDat_{N^{\eta IInj_N}}\exp\{j[\phi_{T^{Dat_N}} + \phi_{DRx_N}]\}$ --.

Column 31,
Lines 60-68, replace " $\dfrac{_DInc^{ToneU}_{13}}{_DINInj_{13}} = \dfrac{|A_{TxU_{12}}|T^{Tx_1}PInc_1}{A_{205}PIInj_1}\exp\dfrac{\{j[\phi_{S^{Tx U}} + \phi_{PTxU_{12}} + \phi_{200}]\}}{\exp\{j[M(\phi_{L^{PISub_{13}}} + \phi_{T^{ISub_1}})\}}$, $\dfrac{_DInc^{ToneV}_{13}}{_DINInj_{13}} = \dfrac{|A_{TxV_{12}}|T^{Tx_1}PInc_1}{A_{205}PIInj_1}\exp\dfrac{\{j[\phi_{S^{Tx V}} + \phi_{PTxV_{12}} + \phi_{200}]\}}{\exp\{j[M(\phi_{L^{PISub_{13}}} + \phi_{T^{ISub_1}})\}}$ "

with -- $\dfrac{_DInc^{ToneU}_{13}}{_DINInj_{13}} = \dfrac{|A_{TxU_{12}}|T^{Tx_1}PInc_1}{A_{205}PIInj_1}\dfrac{\exp\{j[\phi_{S^{Tx U}} + \phi_{PTxU_{12}} + \phi_{200}]\}}{\exp\{j[M(\phi_{L^{PISub_{13}}} + \phi_{T^{ISub_1}})\}}$, $\dfrac{_DInc^{ToneU}_{13}}{_DINInj_{13}} = \dfrac{|A_{TxU_{12}}|T^{Tx_1}PInc_1}{A_{205}PIInj_1}\dfrac{\exp\{j[\phi_{S^{Tx U}} + \phi_{PTxU_{12}} + \phi_{200}]\}}{\exp\{j[M(\phi_{L^{PISub_{13}}} + \phi_{T^{ISub_1}})\}}$ --.

UNITED STATES PATENT AND TRADEMARK OFFICE
CERTIFICATE OF CORRECTION

PATENT NO. : 6,636,816 B1
DATED : October 21, 2003
INVENTOR(S) : Dvorak et al.

It is certified that error appears in the above-identified patent and that said Letters Patent is hereby corrected as shown below:

<u>Column 32,</u>
Line 27, replace " $3f_{TxU} - 2f_{TxV} = Mf_{L^{SubA}} + 200 Mhz + 3f^{S^{TxU}} - 2f_{S^{TxV}}$ "

with $-- 3f_{TxU} - 2f_{TxV} = Mf_{L^{SubA}} + 200 Mhz + 3f_{S^{TxU}} - 2f_{S^{TxV}} --$.

Lines 32-45, replace " $Dat_2(t) = |T^{Tx_1}|\{|A_{TxU_{12}}\widetilde{S}_{21}^{MU}|\cos(2\pi f_{TxU}t + M\phi_{L^{SubA}} +$ $\phi_{200} + \phi_{S^{TxU}} + \phi_{PTxV_{12}} + \phi_{T^{Tx_1}} + \phi_{\widetilde{S}_{21}^{MU}})\} + |T^{Tx_1}|^5 \{|C_{IMD32}|A_{TxU_{12}}|^3|A_{TxV_{12}}|^2 \cos[2\pi(3f_{TxU} - 2f_{TxV})t +$ $M\phi_{L^{SubA}} + \phi_{200} + 5\phi_{T^{Tx_1}} + \phi_{IMD32} + 3(\phi_{S^{TxU}} + \phi_{PTxU_{12}}) - 2(\phi_{S^{TxV}} + \phi_{PtxV_{12}})] + |C_{IMD32}|A_{TxU_{12}}|^2|A_{TxV_{12}}|^3$ $\cos\{2\pi(3f_{TxV} - 2f_{TxU})t + M\phi_{L^{SubA}} + \phi_{200} + 5\phi_{T^{Tx_1}} + \phi_{IMD23} + 3(\phi_{S^{TxV}} + \phi_{PTxV_{12}}) - 2(\phi_{S^{TxU}} + \phi_{PTxU_{12}})]\}$ with $-- Dat_2(t) = |T^{Tx_1}|\{|A_{TxU_{12}}\widetilde{S}_{21}^{MU}|\cos(2\pi f_{TxU}t + M\phi_{L^{SubA}} +$ $\phi_{200} + \phi_{S^{TxU}} + \phi_{PTxV_{12}} + \phi_{T^{Tx_1}} + \phi_{\widetilde{S}_{21}^{MU}})\} + |T^{Tx_1}|^5 \{|C_{IMD32}|A_{TxU_{12}}|^3|A_{TxV_{12}}|^2 \cos[2\pi(3f_{TxU} - 2f_{TxV})t +$ $M\phi_{L^{SubA}} + \phi_{200} + 5\phi_{T^{Tx_1}} + \phi_{IMD32} + 3(\phi_{S^{TxU}} + \phi_{PTxU_{12}}) - 2(\phi_{S^{TxV}} + \phi_{PTxV_{12}})] + |C_{IMD23}|A_{TxU_{12}}|^2|A_{TxV_{12}}|^3$ $\cos\{2\pi(3f_{TxV} - 2f_{TxU})t + M\phi_{L^{SubA}} + \phi_{200} + 5\phi_{T^{Tx_1}} + \phi_{IMD23} + 3(\phi_{S^{TxV}} + \phi_{PTxV_{12}}) - 2(\phi_{S^{TxU}} + \phi_{PTxU_{12}})]\}$ --

Line 53, replace " $\widetilde{S}_{21}^{MU}$ and $\widetilde{S}_{21}^{MV}$ " with -- $\widetilde{S}_{21}^{MU}$ and $\widetilde{S}_{21}^{MV}$ --.

<u>Column 32, lines 61-68 and Columns 33, lines 1-22,</u>
replace " $_\Lambda\hat{D}at_{23}(t) = |T^{Dat_2}PDat_2T^{Tx_1}|\{|A_{TxU_{12}}\widetilde{S}_{21}^{MU}|\cos[2\pi(f_{S^{TxU}} - f_{S^{DOff23}})t - M(\phi_{L^{PDSub23}} + \phi_{T^{DSub2}}) + \phi_{S^{TxU}} +$ $\phi_{PTxU_{12}} + \phi_{T^{Tx_1}} + \phi_{\widetilde{S}_{21}^{MU}} + \phi_{PDat_2} + \phi_{T^{Dat_2}} - \phi_{L^{DOff21}}] + |A_{TxV_{12}}\widetilde{S}_{21}^{MV}|\cos[2\pi(f_{S^{TxV}} - f_{S^{DOff23}})t - M(\phi_{L^{PDSub33}} +$ $\phi_{T^{DSub2}}) + \phi_{S^{TxV}} + \phi_{PTxV_{12}} + \phi_{T^{Tx_1}} + \phi_{\widetilde{S}_{21}^{MV}} + \phi_{PDat_2} + \phi_{PDat_2} + \phi_{T^{Dat_2}} - \phi_{L^{DOff21}}]\} + |T^{Dat_2}PDInj_2|\sum_{i=1}|A_{S^{DInj23i}}|$ $\cos[2\pi(f_{S^{DInj23i}} - f_{S^{DOff23}})t + \phi_{S^{DInj23i}} + \varphi_{PDInj_2} + \phi_{T^{Dat_2}} - \phi_{L^{DOff21}}] + |T^{Dat_2}PDat_2|T^{Tx_1}|^5\{|C_{IMD32}|$ $|A_{TxU_{12}}|^3|A_{TxV_{12}}|^2 \cos[2\pi(3f_{S^{TxU}} - f_{S^{TxV}} - f_{S^{DOff21}})t - M(\phi_{L^{PDSub23}} + \phi_{T^{DSub2}}) + 5\phi_{T^{Tx_1}} + \phi_{IMD32} +$ $\phi_{PDat_2} + \phi_{L^{DOff21}} + 3(\phi_{S^{TxU}} + \phi_{PTxU_{12}}) - 2(\phi_{S^{TxV}} + \phi_{PTxV_{12}})] + |C_{IMD23}|A_{TxU_{12}}|^2|A_{TxV_{12}}| \cos[2\pi$ $(3f_{S^{TxV}} - 2f_{S^{TxU}} - f_{S^{DOff21}})t - M(\phi_{L^{PDSub23}} + \phi_{T^{DSub2}}) + 5\phi_{T^{Tx_1}} + \phi_{IMD23} + \phi_{PDat_2} + \phi_{T^{Dat_2}} -$ $\phi_{L^{DOff21}} + 3(\phi_{S^{TxV}} + \phi_{PTV_{12}}) - 2(\phi_{S^{TxU}} + \phi_{PTU_{12}})]\}$ "

with -- $_\Lambda\hat{D}at_{23}(t) = |T^{Dat_2}PDat_2T^{Tx_1}|\{|A_{TxU_{12}}\widetilde{S}_{21}^{MU}|\cos[2\pi(f_{S^{TxU}} - f_{S^{DOff23}})t - M(\phi_{L^{PDSub23}} + \phi_{T^{DSub2}}) + \phi_{S^{TxU}} +$ $\phi_{PTxU_{12}} + \phi_{T^{Tx_1}} + \phi_{\widetilde{S}_{21}^{MU}} + \phi_{PDat_2} + \phi_{T^{Dat_2}} - \phi_{L^{DOff21}}] + |A_{TxV_{12}}\widetilde{S}_{21}^{MV}|\cos[2\pi(f_{S^{TxV}} - f_{S^{DOff23}})t - M(\phi_{L^{PDSub33}} +$ $\phi_{T^{DSub2}}) + \phi_{S^{TxV}} + \phi_{PTxV_{12}} + \phi_{T^{Tx_1}} + \phi_{\widetilde{S}_{21}^{MV}} + \phi_{PDat_2} + \phi_{PDat_2} + \phi_{T^{Dat_2}} - \phi_{L^{DOff21}}]\} + |T^{Dat_2}PDInj_2|\sum_{i=1}|A_{S^{DInj23i}}|$ $\cos[2\pi(f_{S^{DInj23i}} - f_{S^{DOff23}})t + \phi_{S^{DInj23i}} + \varphi_{PDInj_2} + \phi_{T^{Dat_2}} - \phi_{L^{DOff21}}] + |T^{Dat_2}PDat_2|T^{Tx_1}|^5\{|C_{IMD32}|$ $|A_{TxU_{12}}|^3|A_{TxV_{12}}|^2 \cos[2\pi(3f_{S^{TxU}} - f_{S^{TxV}} - f_{S^{DOff21}})t - M(\phi_{L^{PDSub23}} + \phi_{T^{DSub2}}) + 5\phi_{T^{Tx_1}} + \phi_{IMD32} +$ $\phi_{PDat_2} + \phi_{T^{Dat_2}} + \phi_{L^{DOff21}} + 3(\phi_{S^{TxU}} + \phi_{PTxU_{12}}) - 2(\phi_{S^{TxV}} + \phi_{PTxV_{12}})] + |C_{IMD23}|A_{TxU_{12}}|^2|A_{TxV_{12}}| \cos[2\pi$ $(3f_{S^{TxV}} - 2f_{S^{TxU}} - f_{S^{DOff21}})t - M(\phi_{L^{PDSub23}} + \phi_{T^{DSub2}}) + 5\phi_{T^{Tx_1}} + \phi_{IMD23} + \phi_{PDat_2} + \phi_{T^{Dat_2}} -$ $\phi_{L^{DOff21}} + 3(\phi_{S^{TxV}} + \phi_{PTV_{12}}) - 2(\phi_{S^{TxU}} + \phi_{PTU_{12}})]\}$ --.

UNITED STATES PATENT AND TRADEMARK OFFICE
CERTIFICATE OF CORRECTION

PATENT NO. : 6,636,816 B1
DATED : October 21, 2003
INVENTOR(S) : Dvorak et al.

It is certified that error appears in the above-identified patent and that said Letters Patent is hereby corrected as shown below:

Column 33,
Lines 34-35, replace "$\widetilde{S}_{21}{}^{MU}$ and $\widetilde{S}_{21}{}^{MV}$" with -- $\widetilde{S}_{21}^{MU}$ and $\widetilde{S}_{21}^{MV}$ --.

Lines 52-57, replace "
$$\frac{{}_D Dat_{23}^{ToneU}}{{}_D DNInj_{23}} = \frac{|A_{TxU_{22}}||T^{Tx_2}\widetilde{S}_{21}^{MU} PDat_2|}{A_{205} PDInj_2} \exp\frac{\{j[\phi_{STxU} + \phi_{PTxU_{12}} + \phi_{200}]\}}{\exp\{j[M(\phi_{L^{PDSub_{23}}} + \phi_{T^{DSub_2}})]\}}$$
"

with --
$$\frac{{}_D Dat_{23}^{ToneU}}{{}_D DNInj_{23}} = \frac{|A_{TxU_{22}}||T^{Tx_2}\widetilde{S}_{21}^{MU} PDat_2|}{A_{205} PDInj_2} \frac{\exp\{j[\phi_{STxU} + \phi_{PTxU_{12}} + \phi_{200}]\}}{\exp\{j[M(\phi_{L^{PDSub_{23}}} + \phi_{T^{DSub_2}})]\}}$$
--.

Lines 64-68, replace "
$$\widetilde{S}_{21}^{MU} \frac{PDat_2 PIInj_1}{PInc_1 PDinj_2} \exp\frac{\{jM\phi_{L^{PISub_{13}}}\}}{\exp\{jM\phi_{L^{PDSub_{23}}}\}} = \frac{{}_D Dat_{23}}{{}_D NInj_{23}} \frac{{}_D INInj_{13}}{{}_D Inc_{13}} \frac{\exp\{jM\phi_{T^{DSub_2}}\}}{\exp\{jM\phi_{T^{ISub_1}}\}}$$
"

with --
$$\widetilde{S}_{21}^{MU} \frac{PDat_2 PIInj_1}{PInc_1 PDinj_2} \frac{\exp\{jM\phi_{L^{PISub_{13}}}\}}{\exp\{jM\phi_{L^{PDSub_{23}}}\}} = \frac{{}_D Dat_{23}}{{}_D NInj_{23}} \frac{{}_D INInj_{13}}{{}_D Inc_{13}} \frac{\exp\{jM\phi_{T^{DSub_2}}\}}{\exp\{jM\phi_{T^{ISub_1}}\}}$$
--.

Column 34,
Line 6, replace "$\widetilde{S}_{21}{}^{MV}$" with -- $\widetilde{S}_{21}^{MV}$ --.

Lines 21-26, replace "
$$\frac{{}_D IMD32_{23}}{{}_D INj_{23}} = \frac{C_{IMD32} PDat_2 (T^{Tx_1})^5 |A_{TxU_{12}}|^3 |A_{TxV_{12}}|^2}{A_{205} PDInj_2}$$

$$\frac{\exp\{[\phi_{200} + (\phi_{S^{TxU}} + \phi_{PTxU_{12}}) - 2(\phi_{S^{TxV}} + \phi_{PTxV_{12}})]\}}{\exp\{j[M(\phi_{L^{PDSub_{23}}} + \phi_{T^{DSub_2}})]\}}$$
" with --
$$\frac{{}_D IMD32_{23}}{{}_D INj_{23}} = \frac{C_{IMD32} PDat_2 (T^{Tx_1})^5 |A_{TxU_{12}}|^3 |A_{TxV_{12}}|^2}{A_{205} PDInj_2} \frac{\exp\{[\phi_{200} + 3(\phi_{S^{TxU}} + \phi_{PTxU_{12}}) - 2(\phi_{S^{TxV}} + \phi_{PTxV_{12}})]\}}{\exp\{j[M(\phi_{L^{PDSub_{23}}} + \phi_{T^{DSub_2}})]\}}$$
--.

Lines 32-36, replace "
$$\frac{{}_D IMD32_{23}}{{}_D DINj_{23}} \left(\frac{{}_D INInj_{13}}{{}_D Inc_{13}^{ToneU}}\right)^3 \left[\left(\frac{{}_D INInj_{13}}{{}_D Inc_{13}^{ToneU}}\right)^*\right]^2 = C_{IMD32} |A_{205}|^4 \frac{PDat_2 PIInj_1}{PDinj_2 PInc_1} \left|\frac{PIInj_1}{PInc_1}\right|^2$$

$$\exp\frac{\{jM(\phi_{L^{PISub_{13}}} + \phi_{T^{ISub_1}})\}}{\exp\{jM(\phi_{L^{PDSub_{23}}} + \phi_{T^{DSub_2}})\}}$$
" with --
$$\frac{{}_D IMD32_{23}}{{}_D DINj_{23}} \left(\frac{{}_D INInj_{13}}{{}_D Inc_{13}^{ToneU}}\right)^3 \left[\left(\frac{{}_D INInj_{13}}{{}_D Inc_{13}^{ToneU}}\right)^*\right]^2$$

$$= C_{IMD32} |A_{205}|^4 \frac{PDat_2 PIInj_1}{PDinj_2 PInc_1} \left|\frac{PIInj_1}{PInc_1}\right|^2 \frac{\exp\{jM(\phi_{L^{PISub_{13}}} + \phi_{T^{ISub_1}})\}}{\exp\{jM(\phi_{L^{PDSub_{23}}} + \phi_{T^{DSub_2}})\}}$$
--.

Column 35,
Line 12, replace "causeinterference" with -- cause interference --.
Line 37, replace "maybeeasier" with -- may be easier --.

Column 36,
Line 12, replace "of the" with -- of the --
Line 15, replace "tora" with -- to a --.
Line 47, replace "mainta-ined" with -- maintained --.

UNITED STATES PATENT AND TRADEMARK OFFICE
CERTIFICATE OF CORRECTION

PATENT NO. : 6,636,816 B1
DATED : October 21, 2003
INVENTOR(S) : Dvorak et al.

It is certified that error appears in the above-identified patent and that said Letters Patent is hereby corrected as shown below:

Column 37,
Lines 41-43, replace "$_D Dat_{N3} = \tilde{S}^M_{N\Omega}|A_{Tx_{\Omega 2}}|T^{Dat_N}T^{Tx_\Omega}PDat_N \exp\{j[-M(\phi_{I^{PDSub_{N3}}} + \phi_{T^{DSub_N}} + \phi_{S^{TxU}} + \phi_{PTx_{\Omega 2}} - \phi_{I^{DOff_{N1}}}]\}$" with $-- _D Dat_{N3} = \tilde{S}^M_{N\Omega}|A_{Tx_{\Omega 2}}|T^{Dat_N}T^{Tx_\Omega}PDat_N \exp\{j[-M(\phi_{I^{PDSub_{N3}}} + \phi_{T^{DSub_N}}) + \phi_{S^{TxU}} + \phi_{PTx_{\Omega 2}} - \phi_{I^{DOff_{N1}}}]\} --$.

Column 38,
Lines 13-15, replace "$\frac{_D DLINK_{N\Omega 3iD} ILink_{\Omega N3i}}{_D IInj_{\Omega 3iD} DInj_{N3i}} = T^{Link_{N\Omega}} T^{Link_{\Omega N}} P^{Link_{N\Omega}} \frac{PLink_{\Omega N}}{PIInj_\Omega PDInj_N}$" with $\frac{_D DLINK_{N\Omega 3iD} ILink_{\Omega N3i}}{_D IInj_{\Omega 3iD} DInj_{N3i}} = T^{Link_{N\Omega}} T^{Link_{\Omega N}} \frac{P^{Link_{N\Omega}} P^{Link_{\Omega N}}}{PIInj_\Omega PDInj_N} --$.

Lines 28-30, replace "$\tilde{S}^M_{N\Omega} PDat_N \frac{PLink_{\Omega N}}{PInc_\Omega PDInj_N} = \frac{_D Dat_{N3D} ILink_{\Omega N3i}}{_D Inc_{\Omega 3D} DInj_{N3i}} (T^{Link_{\Omega N}})^{-1}$" with $\tilde{S}^M_{N\Omega} \frac{PDat_N PLink_{\Omega N}}{PInc_\Omega PDInj_N} = \frac{_D Dat_{N3D} ILink_{\Omega N3i}}{_D Inc_{\Omega 3D} DInj_{N3i}} (T^{Link_{\Omega N}})^{-1} --$.

Line 33, replace "thehigh-frequency" with -- the high-frequency --.

Signed and Sealed this

Thirtieth Day of March, 2004

JON W. DUDAS
*Acting Director of the United States Patent and Trademark Office*